US012701877B2

(12) United States Patent
Zhang et al.

(10) Patent No.: US 12,701,877 B2
(45) Date of Patent: Aug. 4, 2026

(54) DISPLAY PANEL INCLUDING A SHIELDING LAYER LOCATED BETWEEN A BASE SUBSTRATE AND A FIRST ACTIVE LAYER AND DISPLAY DEVICE HAVING THE SAME

(71) Applicants:Chengdu BOE Optoelectronics Technology Co., Ltd., Sichuan (CN); BOE Technology Group Co., Ltd., Beijing (CN)

(72) Inventors: Tiaomei Zhang, Beijing (CN); Gukhwan Song, Beijing (CN); Yuanjie Xu, Beijing (CN); Juntao Chen, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 630 days.

(21) Appl. No.: 18/247,622

(22) PCT Filed: May 31, 2022

(86) PCT No.: PCT/CN2022/096331
§ 371 (c)(1),
(2) Date: Mar. 31, 2023

(87) PCT Pub. No.: WO2023/230871
PCT Pub. Date: Dec. 7, 2023

(65) Prior Publication Data
US 2024/0373686 A1 Nov. 7, 2024

(51) Int. Cl.
*H10K 59/12* (2023.01)
*H10K 59/121* (2023.01)
*H10K 59/131* (2023.01)

(52) U.S. Cl.
CPC ....... *H10K 59/131* (2023.02); *H10K 59/1213* (2023.02)

(58) Field of Classification Search
CPC ........................ H10K 59/131; H10K 59/1213
(Continued)

(56) References Cited

U.S. PATENT DOCUMENTS

| | | | |
|---|---|---|---|
| 2015/0187959 A1 | 7/2015 | Yoon | |
| 2020/0050036 A1 | 2/2020 | Ina | |

(Continued)

FOREIGN PATENT DOCUMENTS

| | | |
|---|---|---|
| CN | 104752436 A | 7/2015 |
| CN | 107591410 A | 1/2018 |

(Continued)

OTHER PUBLICATIONS

Written Opinion from PCT/CN2022/096331 dated Nov. 30, 2022.

*Primary Examiner* — Phuc T Dang
(74) *Attorney, Agent, or Firm* — Calfee, Halter & Griswold LLP

(57) ABSTRACT

A display panel and a display device, where the display panel includes a pixel driving circuit, the pixel driving circuit includes a transistor, the display panel further includes: a base substrate, a first active layer, and a shielding layer; the first active layer is located on a side of the base substrate, and at least part of structure of the first active layer is configured to form a channel region of the transistor; the shielding layer is located between the base substrate and the first active layer, and the shielding layer is a conductive layer; the shielding layer includes more than one shielding part independently arranged, and at least partially different shielding parts are configured to receive different signals.

19 Claims, 33 Drawing Sheets

(58) Field of Classification Search
USPC .......................................................... 257/72
See application file for complete search history.

(56) References Cited

U.S. PATENT DOCUMENTS

| | | |
|---|---|---|
| 2020/0286972 A1 | 9/2020 | Seo |
| 2022/0005906 A1 | 1/2022 | Jeong |

FOREIGN PATENT DOCUMENTS

| | | | | | |
|---|---|---|---|---|---|
| CN | 108550505 A | | 9/2018 | | |
| CN | 108550606 A | | 9/2018 | | |
| CN | 110767738 A | * | 2/2020 | ....... | H10K 59/80522 |
| CN | 110824756 A | | 2/2020 | | |
| CN | 111415995 A | | 7/2020 | | |
| CN | 211293912 U | | 8/2020 | | |
| CN | 111933081 A | | 11/2020 | | |
| CN | 111969129 A | | 11/2020 | | |
| CN | 112466209 A | | 3/2021 | | |
| CN | 112466298 A | | 3/2021 | | |
| CN | 112861636 A | | 5/2021 | | |
| CN | 113674693 A | | 11/2021 | | |
| CN | 113972226 A | | 1/2022 | | |
| CN | 114093898 A | | 2/2022 | | |
| CN | 11415690 A | | 3/2022 | | |
| CN | 114156284 A | | 3/2022 | | |
| CN | 114156290 A | | 3/2022 | | |
| DE | 102014118009 A1 | | 7/2015 | | |
| JP | 2020027301 A | | 2/2020 | | |
| KR | 20150075687 A | | 7/2015 | | |
| KR | 20160001584 A | | 1/2016 | | |
| TW | 201526209 A | | 7/2015 | | |
| WO | WO-2021239061 A1 | * | 12/2021 | .......... | H10D 86/441 |

* cited by examiner

VDD          Da          Vinit1

Re1

4Vinit2

G1

11

Y

EM

55          Vinit2

Re2

4Vinit1          Da

X

Vinit11          Vinit12          Vinit1

63

62

Y

61

Vinit2

X

DISPLAY PANEL INCLUDING A SHIELDING LAYER LOCATED BETWEEN A BASE SUBSTRATE AND A FIRST ACTIVE LAYER AND DISPLAY DEVICE HAVING THE SAME

CROSS REFERENCE

The present disclosure is a National Stage of International Application No. PCT/CN2022/096331, filed on May 31, 2022, and the entire contents of which are incorporated herein by reference.

TECHNICAL FIELD

The present disclosure relates to the field of display technology, and in particular, to a display panel and a display device.

BACKGROUND

In the related art, circuit structures such as a pixel driving circuit, a gate driving circuit, and a detection circuit need to be integrated in the display panel needs, so that the display panel needs a relatively large layout space for arranging the above circuit structures.

It should be noted that the information disclosed in the above background section is for enhancing the understanding of the background of the present disclosure, and then may include information that does not constitute the related art known to those of ordinary skill in the art.

SUMMARY

According to an aspect of the present disclosure, there is provided a display panel, where the display panel comprises a pixel driving circuit, the pixel driving circuit comprises a transistor, and the display panel further comprises a base substrate, a first active layer and a shielding layer; the first active layer is located on a side of the base substrate, and at least part of structure of the first active layer is configured to form a channel region of the transistor; the shielding layer is located between the base substrate and the first active layer, the shielding layer is a conductive layer, the shielding layer comprises more than one shielding part independently arranged, and at least partially different shielding parts are configured to receive different signals.

In at least one embodiment of the present disclosure, the pixel driving circuit comprises a driving transistor and a first transistor, a first electrode of the first transistor is connected to a first initial signal line, and a second electrode is connected to a gate of the driving transistor; and the first initial signal line is comprised in the more than one shielding part.

In at least one embodiment of the present disclosure, the first active layer comprises a first active part and a third active sub-part; the first active part is configured to form a channel region of the first transistor, the first active part comprises a first active sub-part and a second active sub-part, and the third active sub-part is connected between the first active sub-part and the second active sub-part; the first initial signal line comprises a first extension part, and an orthographic projection of the first extension part on the base substrate at least partially overlaps with an orthographic projection of the third active sub-part on the base substrate.

In at least one embodiment of the present disclosure, the display panel further comprises a first conductive layer located on a side of the first active layer away from the base substrate; the first conductive layer comprises a first reset signal line; an orthographic projection of the first reset signal line on the base substrate extends along a first direction and covers an orthographic projection of the first active part on the base substrate, and a part of structure of the first reset signal line is configured to form a gate of the first transistor; the first initial signal line comprises a second extension part, and an orthographic projection of the second extension part on the base substrate at least partially overlaps with an orthographic projection of the first reset signal line on the base substrate.

In at least one embodiment of the present disclosure, the display panel further comprises a fourth conductive layer located on a side of the first active layer away from the base substrate, the fourth conductive layer comprises a first initial connection line; where, an orthographic projection of the first initial signal line on the base substrate extends along a first direction, and an orthographic projection of the first initial connection line on the base substrate extends along a second direction, the first direction intersects with the second direction, and the first initial connection line is connected to the first initial signal line intersecting with the orthographic projection of the first initial connection line on the base substrate through a via hole.

In at least one embodiment of the present disclosure, the display panel further comprises a light emitting unit, the pixel driving circuit comprises a seventh transistor, a first electrode of the seventh transistor is connected to a second initial signal line, and a second electrode is connected to a first electrode of the light emitting unit; the second initial signal line is comprised in the more than one shielding part.

In at least one embodiment of the present disclosure, the pixel driving circuit further comprises a driving transistor and a sixth transistor, a first electrode of the sixth transistor is connected to a second electrode of the driving transistor, and a second electrode is connected to a first electrode of the light emitting unit; the first active layer comprises a sixth active part and a seventh active part, the sixth active part is configured to form a channel region of the sixth transistor, and the seventh active part is configured to form a channel region of the seventh transistor; the display panel further comprises a first conductive layer, the first conductive layer is located on a side of the first active layer away from the base substrate, and the first conductive layer comprises an enabling signal line and a second reset signal line; an orthographic projection of the enabling signal line on the base substrate extends along a first direction and covers an orthographic projection of the sixth active part on the base substrate, and a part of structure of the enabling signal line is configured to form a gate of the sixth transistor; an orthographic projection of the second reset signal line on the base substrate extends along the first direction and covers an orthographic projection of the seventh active part on the base substrate, and a part of structure of the second reset signal line is configured to form a gate of the seventh transistor; where, an orthographic projection of the second initial signal line on the base substrate is located between the orthographic projection of the enabling signal line on the base substrate and the orthographic projection of the second reset signal line on the base substrate.

In at least one embodiment of the present disclosure, the display panel further comprises a fourth conductive layer located on a side of the first active layer away from the base substrate; the fourth conductive layer comprises a second initial connection line; where, an orthographic projection of the second initial signal line on the base substrate extends along a first direction, and an orthographic projection of the second initial connection line on the base substrate extends along a second direction, the first direction intersects with the second direction, and the second initial connection line is connected to the second initial signal line intersecting with the orthographic projection of the second initial connection line on the base substrate through a via hole.

In at least one embodiment of the present disclosure, the pixel driving circuit comprises a driving transistor, the first active layer comprises a third active part, and the third active part is configured to form a channel region of the driving transistor; a first shielding part is comprised in the more than one shielding part, the first shielding part is connected to a stable voltage source, and an orthographic projection of the first shielding part on the base substrate covers an orthographic projection of the third active part on the base substrate.

In at least one embodiment of the present disclosure, the pixel driving circuit further comprises a capacitor, a first electrode of the capacitor is connected to a gate of the driving transistor, and a second electrode of the capacitor is connected to a power line; the display panel further comprises a first conductive layer located on a side of the first active layer away from the base substrate, the first conductive layer comprises a first conductive part, an orthographic projection of the first conductive part on the base substrate covers an orthographic projection of the third active part on the base substrate, and the first conductive part is configured to form the gate of the driving transistor and the first electrode of the capacitor; the power line forms the stable voltage source, and the first shielding part is configured to form the second electrode of the capacitor.

In at least one embodiment of the present disclosure, the display panel further comprises a fourth conductive layer located on a side of the first conductive layer away from the base substrate; the fourth conductive layer comprises the power line, and an orthographic projection of the power line on the base substrate extends along a second direction; the display panel comprises more than one pixel driving circuit distributed in an array in a first direction and the second direction, the first direction intersects with the second direction, and the more than one first shielding part distributed in the first direction is connected to each other, and the power line is connected to the first shielding part through a via hole.

In at least one embodiment of the present disclosure, the power line comprises a third extension part, a fourth extension part and a fifth extension part connected between the third extension part and the fourth extension part; a size of an orthographic projection of the fifth extension part on the base substrate in the first direction is larger than a size of an orthographic projection of the third extension part on the base substrate in the first direction, the size of the orthographic projection of the fifth extension part on the base substrate in the first direction is larger than a size of an orthographic projection of the fourth extension part on the base substrate in the first direction, and the first direction intersects with the second direction; the orthographic projection of the fifth extension part on the base substrate at least partially overlaps with an orthographic projection of the first conductive part on the base substrate, and at least part of structure of the fifth extension part is configured to form a second electrode of the capacitor.

In at least one embodiment of the present disclosure, the pixel driving circuit further comprises a second transistor, a first electrode of the second transistor is connected to a gate of the driving transistor, and a second electrode of the second transistor is a connected to a second electrode of the driving transistor; the first active layer further comprises a second active part and a sixth active sub-part, the second active part is configured to form a channel region of the second transistor, the second active part comprises a fourth active sub-part and a fifth active sub-part, and the sixth active sub-part is connected between the fourth active sub-part and the fifth active sub-part; the shielding layer further comprises a second shielding part connected to the first shielding part, the first shielding part comprises a first edge, the second shielding part comprises a second edge, the first edge is connected to the second edge, an angle between an orthographic projection of the first edge on the base substrate and an orthographic projection of the second edge on the base substrate is less than 180°, and an orthographic projection of the second shielding part on the base substrate at least partially overlaps with an orthographic projection of the sixth active sub-part on the base substrate.

In at least one embodiment of the present disclosure, the pixel driving circuit further comprises a first transistor and a second transistor, a first electrode of the first transistor is connected to a first initial signal line, and a second electrode is connected to a gate of the driving transistor, a first electrode of the second transistor is connected to the gate of the driving transistor, and a second electrode is connected to a second electrode of the driving transistor; the first active layer further comprises a first active part, a second active part and an eighth active part, the first active part is configured to form a channel region of the first transistor, the second active part is configured to form a channel region of the second transistor, and the eighth active part is connected between the first active part and the second active part; the shielding layer further comprises a third shielding part, the third shielding part is connected to the first shielding part, the first shielding part comprises a first edge, the third shielding part comprises a third edge, the first edge is connected to the third edge, an angle between an orthographic projection of the first edge on the base substrate and an orthographic projection of the third edge on the base substrate is less than 180°, and an orthographic projection of the third shielding part on the base substrate at least partially overlaps with an orthographic projection of the eighth active part on the base substrate.

In at least one embodiment of the present disclosure, the pixel driving circuit further comprises a first transistor and a second transistor, a first electrode of the first transistor is connected to a first initial signal line, and a second electrode is connected to a gate of the driving transistor, a first electrode of the second transistor is connected to the gate of the driving transistor, and a second electrode is connected to a second electrode of the driving transistor; the first active layer further comprises a first active part, a second active part, a sixth active sub-part and an eighth active part, the first active part is configured to form a channel region of the first transistor, the second active part is configured to form a channel region of the second transistor, the second active part comprises a fourth active sub-part and a fifth active sub-part, the sixth active sub-part is connected between the fourth active sub-part and the fifth active sub-part, and the eighth active part is connected between the first active part and the second active part; the display panel further comprises a first conductive layer, the first conductive layer is located on a side of the first active layer away from the base substrate, the first conductive layer comprises a first conductive part and a first gate line, an orthographic projection of the first conductive part on the base substrate covers an orthographic projection of the third active part on the base substrate, and an orthographic projection of the first gate line on the base substrate extends along a first direction and covers an orthographic projection of the second active part on the base substrate; the shielding layer further comprises a second shielding part, a third shielding part and a first connection part, the second shielding part is connected to the first shielding part, and an orthographic projection of the second shielding part on the base substrate at least partially overlaps with an orthographic projection of the sixth active sub-part on the base substrate; the third shielding part is connected to the first shielding part, and an orthographic projection of the third shielding part on the base substrate at least partially overlaps with an orthographic projection of the eighth active part on the base substrate; the first connection part is connected between the second shielding part and the third shielding part in adjacent pixel driving circuits in the first direction, and an orthographic projection of the first connection part on the base substrate on is located on a side of an orthographic projection of the first gate line on the base substrate away from an orthographic projection of the first conductive part on the base substrate.

In at least one embodiment of the present disclosure, the display panel further comprises a display region and a frame region around the display region, a part of the shielding part is located in the display region, and a part of the shielding part is located in the frame region.

In at least one embodiment of the present disclosure, the pixel driving circuit comprises more than one transistor, and a constant voltage shielding part corresponding to the transistor is comprised in the more than one shielding part, and an orthographic projection the constant voltage shielding part on the base substrate at least partially overlaps with an orthographic projection of a channel region of the transistor corresponding to the constant voltage shielding part on the base substrate; at least partially different constant voltage shielding parts are configured to receive different power supply voltages.

In at least one embodiment of the present disclosure, the pixel driving circuit comprises an N-type transistor and a P-type transistor; a positive voltage shielding part and a negative voltage shielding part are comprised in the more than one constant voltage shielding part, the positive voltage shielding part is configured to receive a positive power supply voltage, and the negative voltage shielding part is configured to receive a negative power supply voltage; an orthographic projection of the positive voltage shielding part on the base substrate at least partially overlaps with an orthographic projection of a channel region of the P-type transistor on the base substrate, and an orthographic projection of the negative voltage shielding part on the base substrate at least partially overlaps with an orthographic projection of a channel region of the N-type transistor on the base substrate.

In at least one embodiment of the present disclosure, the display panel further comprises a light emitting unit, the pixel driving circuit comprises a driving transistor, a fourth transistor, a fifth transistor, a sixth transistor and a seventh transistor; the driving transistor, the fourth transistor, the fifth transistor, the sixth transistor and the seventh transistor are P-type transistors; a first electrode of the fourth transistor is connected to a data line, and a second electrode is connected to a first electrode of the driving transistor; a first electrode of the fifth transistor is connected to a first power supply end, and a second electrode is connected to the first electrode of the driving transistor; a first electrode of the sixth transistor is connected to a second electrode of the driving transistor, and a second electrode is connected to a first electrode of the light emitting unit; a first electrode of the seventh transistor is connected to a second initial signal line, and a second electrode is connected to the first electrode of the light emitting unit; more than one positive voltage shielding part is comprised in the more than one constant voltage shielding part, and the more than one positive voltage shielding part comprises a first positive voltage shielding part, a second positive voltage shielding part, and a third positive voltage shielding part; an orthographic projection of the first positive voltage shielding part on the base substrate covers an orthographic projection of a channel region of the driving transistor on the base substrate; an orthographic projection of the second positive voltage shielding part on the base substrate covers an orthographic projection of a channel region of the fifth transistor on the base substrate and an orthographic projection of a channel region of the sixth transistor on the base substrate; an orthographic projection of the third positive voltage shielding part on the base substrate covers an orthographic projection of a channel region of the fourth transistor on the base substrate and an orthographic projection of a channel region of the seventh transistor on the base substrate; where, a positive voltage received by the first positive voltage shielding part is greater than a positive voltage received by the second positive voltage shielding part, and a positive voltage received by the third positive voltage shielding part is greater than a positive voltage received by the first positive voltage shielding part.

In at least one embodiment of the present disclosure, the display panel comprises a high density integration region and a low density integration region, and a density of transistors in the high density integration region is greater than a density of transistors in the low density integration region; the high density integration region comprises a first high density integration region and a second high density integration region, and the second high density integration region is located on a side of the first high density integration region away from the low density integration region; in constant voltage shielding parts corresponding to a same transistor in the pixel driving circuit, an absolute value of voltage received by a constant voltage shielding part located in the first high density integration region is larger than an absolute value of voltage received by a constant voltage shielding part located in the second high density integration region.

According to an aspect of the present disclosure, there is provided a display device including the above-mentioned display panel.

It is to be understood that both the foregoing general description and the following detailed description are exemplary and explanatory and are not restrictive of the present disclosure.

BRIEF DESCRIPTION OF THE DRAWINGS

The accompanying drawings, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skill in the art, other drawings can also be obtained from these drawings without creative efforts.

DETAILED DESCRIPTION

Figure 1:
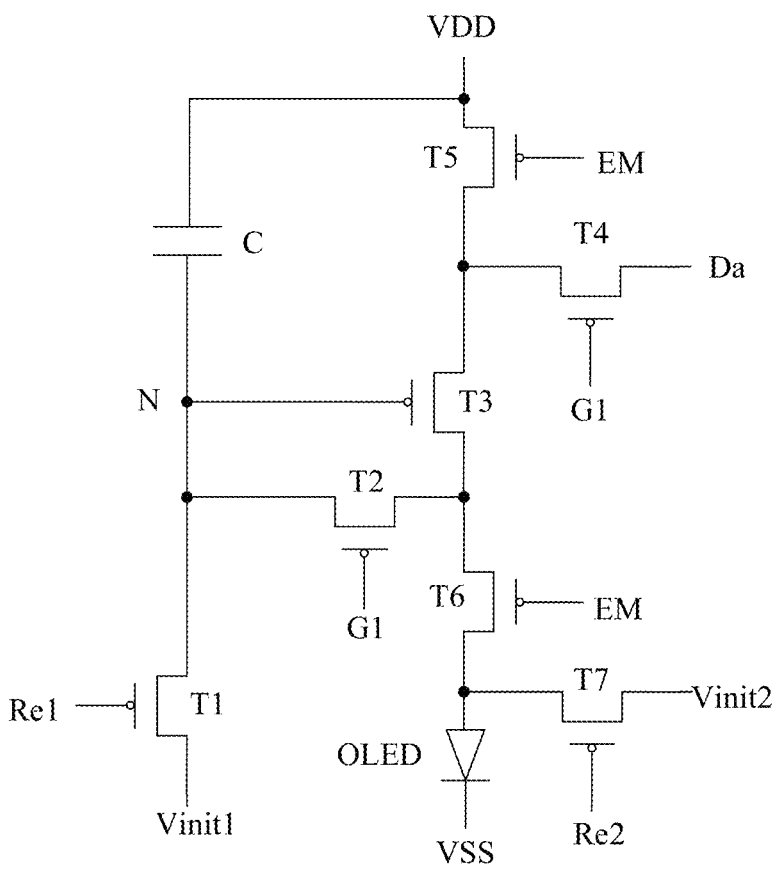
FIG. 1 is a schematic diagram of a circuit structure of a pixel driving circuit in a display panel according to some embodiments of the present disclosure.

Example embodiments will now be described more fully with reference to the accompanying drawings. Example embodiments, however, can be implemented in various forms and should not be construed as limited to the embodiments set forth herein; by contrast, these embodiments are provided so that the present disclosure will be thorough and complete, and will fully convey the concept of example embodiments to those skilled in the art. The same reference numerals in the drawings denote the same or similar structures, and thus their detailed descriptions will be omitted.

The terms "one", "one" and "said" are used to indicate the existence of one or more elements/components/etc. The terms "include" and "have" are used to express the meaning of open inclusion and refer to the existence of other elements/components/etc. in addition to the listed elements/components/etc.

As shown in FIG. 1, it is a schematic diagram of circuit structure of a pixel driving circuit in a display panel according to some embodiments of the present disclosure. The pixel driving circuit may include: a first transistor T1, a second transistor T2, a driving transistor T3, a fourth transistor T4, a fifth transistor T5, a sixth transistor T6, a seventh transistor T7, and a capacitor C. Among them, the first electrode of the first transistor T1 is connected to the first initial signal end Vinit1, the second electrode is connected to the node N, and the gate is connected to the first reset signal end Re1; the first electrode of the second transistor T2 is connected to the node N, the second electrode is connected to the second electrode of the driving transistor T3, and the gate is connected to the first gate driving signal end G1; the gate of the driving transistor T3 is connected to the node N; the first electrode of the fourth transistor T4 is connected to the data signal end Da, the second electrode is connected to the first electrode of the driving transistor T3, and the gate is connected to the first gate driving signal end G1; the first electrode of the fifth transistor T5 is connected to the first power supply end VDD, the second electrode is connected to the first electrode of the driving transistor T3, and the gate is connected to the enabling signal end EM; the first electrode of the sixth transistor T6 is connected to the second electrode of the driving transistor T3, and the gate is connected to the enabling signal end EM; the first electrode of the seventh transistor T7 is connected to the second initial signal end Vinit2, the second electrode is connected to the second electrode of the six transistors T6, and the gate is connected to the second reset signal end Re2. The capacitor C is connected between the gate of the driving transistor T3 and the first power supply end VDD. The pixel driving circuit can be connected to a light emitting unit OLED, and the pixel driving circuit is configured to drive the light emitting unit OLED to emit light. The light emitting unit OLED can be connected between the second electrode of the sixth transistor T6 and the second power supply end VSS. Among them, the first transistor T1, the second transistor T2, the driving transistor T3, the fourth transistor T4, the fifth transistor T5, the sixth transistor T6 and the seventh transistor T7 may all be P-type transistors.

Figure 2:
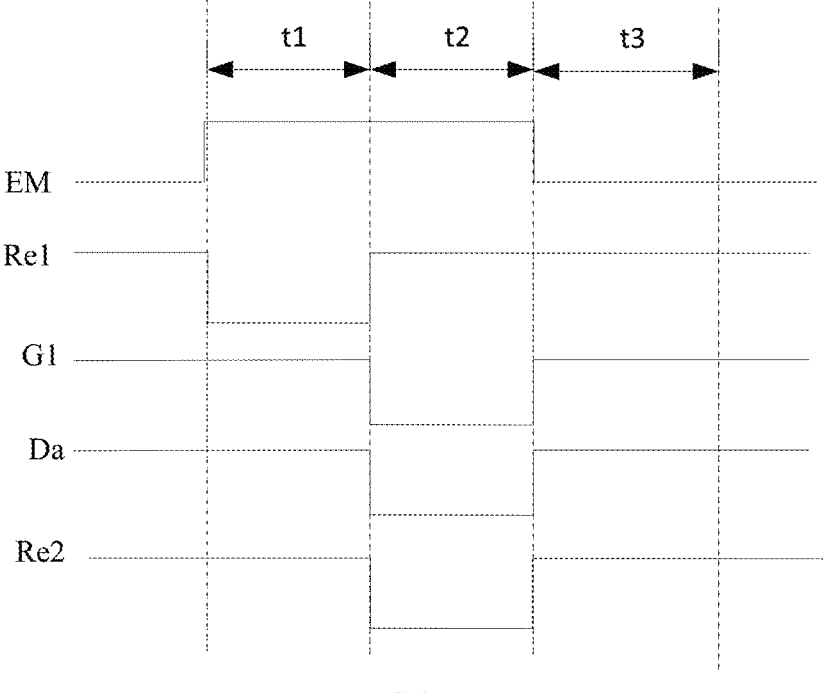
FIG. 2 is a timing diagram of signals on each node in a driving method for the pixel driving circuit shown in FIG. 1.

As shown in FIG. 2, it is a timing diagram of signals on each node in a driving method for the pixel driving circuit shown in FIG. 1. Among them, G1 represents the timing diagram of the signal on the first gate driving signal end G1, Re1 represents the timing diagram of the signal on the first reset signal end Re1, Re2 represents the timing diagram of the signal on the second reset signal end Re2, and EM represents the timing diagram of the signal on the enabling signal end EM, and Da represents the timing diagram of the signal on the data signal end Da. The driving method for the pixel driving circuit may include a reset phase t1, a compensation phase t2, and a light emitting phase t3. In the reset phase t1, the first reset signal end Re1 outputs a low-level signal, the first transistor T1 is turned on, and the first initial signal end Vinit1 inputs a first initial signal to the node N. In the compensation stage t2, the second reset signal end Re2 and the first gate driving signal end G1 output low-level signals, the fourth transistor T4, the second transistor T2, and the seventh transistor T7 are turned on, and the data signal end Da outputs a data signal to write the voltage Vdata+Vth to the node N, where Vdata is the voltage of the data signal and Vth is the threshold voltage of the driving transistor T3, and the second initial signal end Vini2 inputs the second initial signal to the second electrode of the sixth transistor T6. In the light emitting stage t3, the enabling signal end EM outputs a low-level signal, the sixth transistor T6 and the fifth transistor T5 are turned on, and the driving transistor T3 drives the light emitting unit to emit light under the action of the voltage Vdata+Vth of the node N. According to the driving transistor output current formula, $I=(\mu WCox/2L)(Vgs-Vth)2$, where $\mu$ is the carrier mobility, Cox is the gate capacitance per unit area, W is the width of the driving transistor channel, and L is the length of the driving transistor channel, Vgs is the gate-source voltage difference of the driving transistor, and Vth is the threshold voltage of the driving transistor. The output current of the driving transistor in the pixel driving circuit of the present disclosure is $I=(\mu WCox/2L)(Vdata+Vth-Vdd-Vth)2$. The pixel driving circuit can avoid the influence of the threshold value of the driving transistor on its output current. It should be understood that, in other embodiments, there may also other driving methods for the pixel driving circuit, for example, both the first transistor T1 and the seventh transistor T7 may be turned on in the reset phase.

Figure 3:
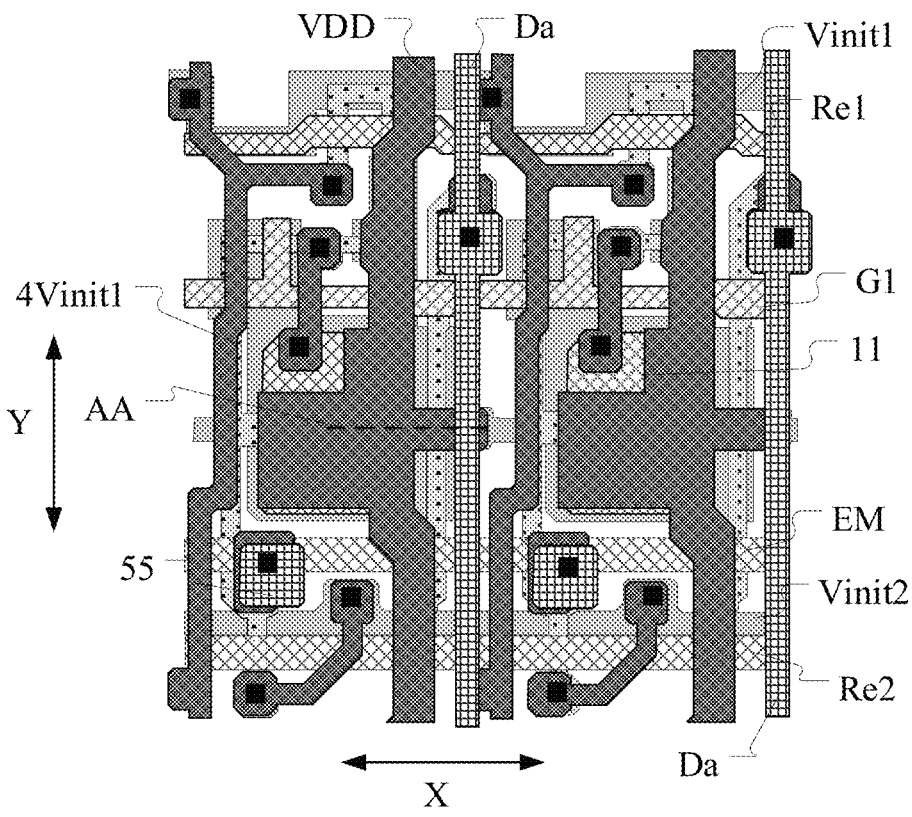
FIG. 3 is a structural layout of a display panel according to some embodiments of the present disclosure.
Figure 4:
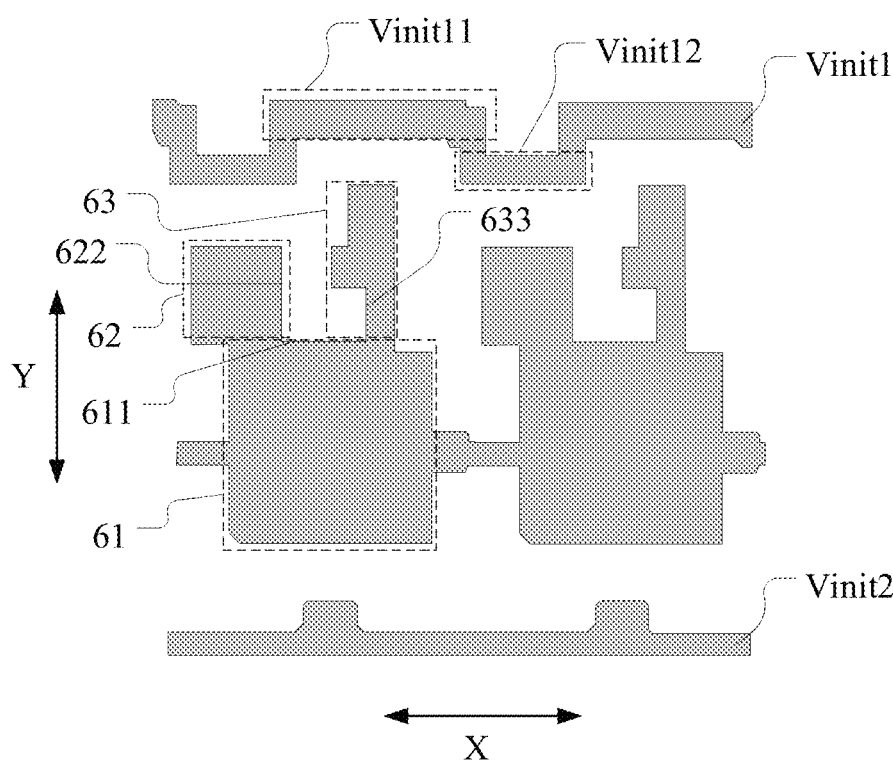
FIG. 4 is the structural layout of the shielding layer in FIG. 3.
Figure 5:
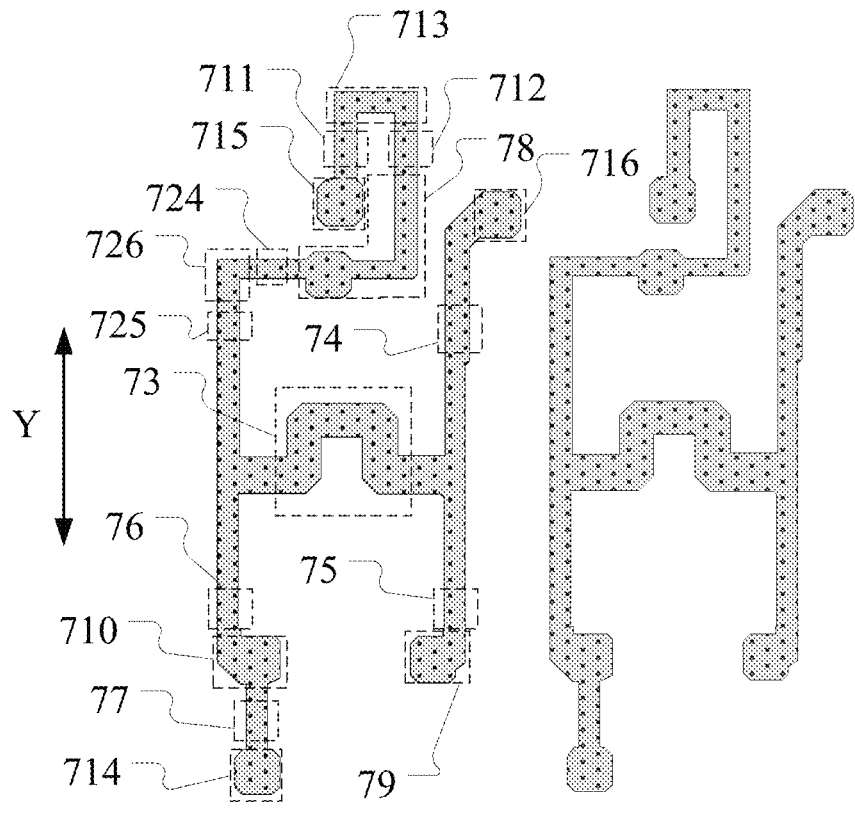
FIG. 5 is a structural layout of the first active layer in FIG. 3.
Figure 5:
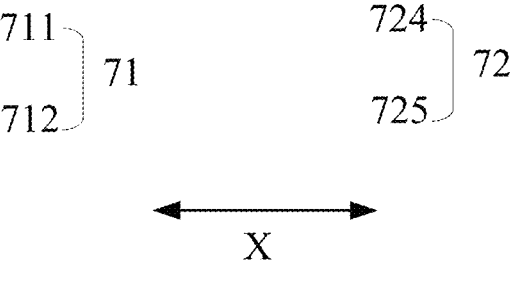
Figure 6:
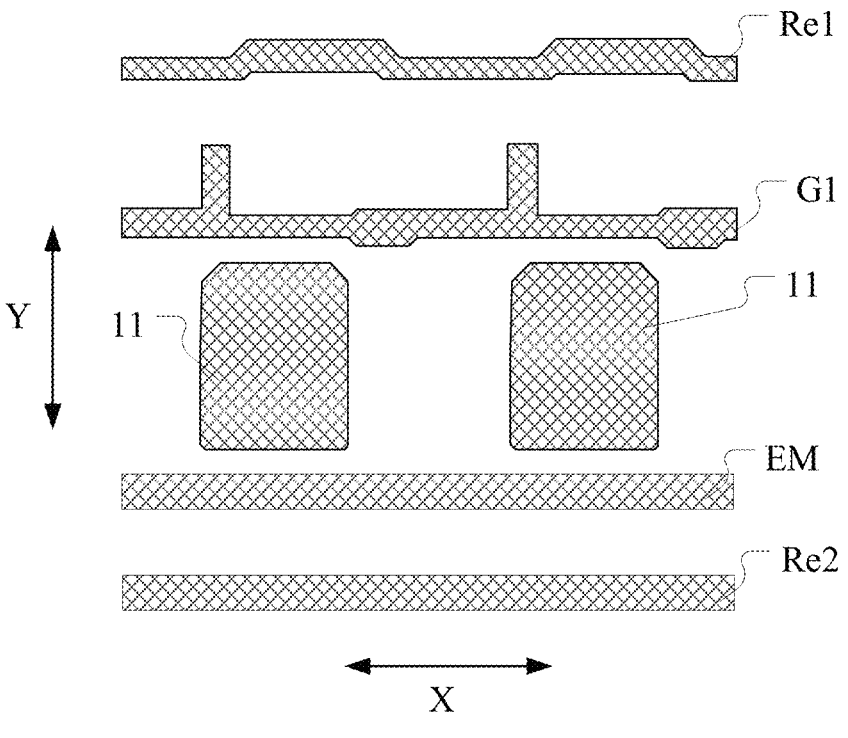
FIG. 6 is a structural layout of the first conductive layer in FIG. 3.
Figure 7:
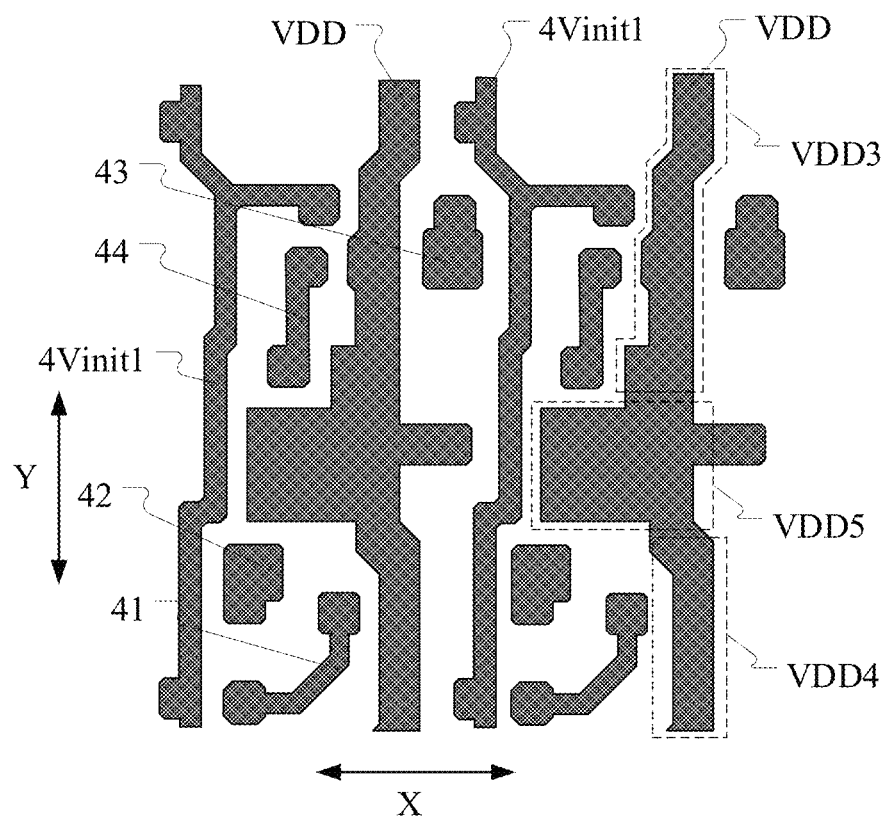
FIG. 7 is a structural layout of the fourth conductive layer in FIG. 3.
Figure 8:
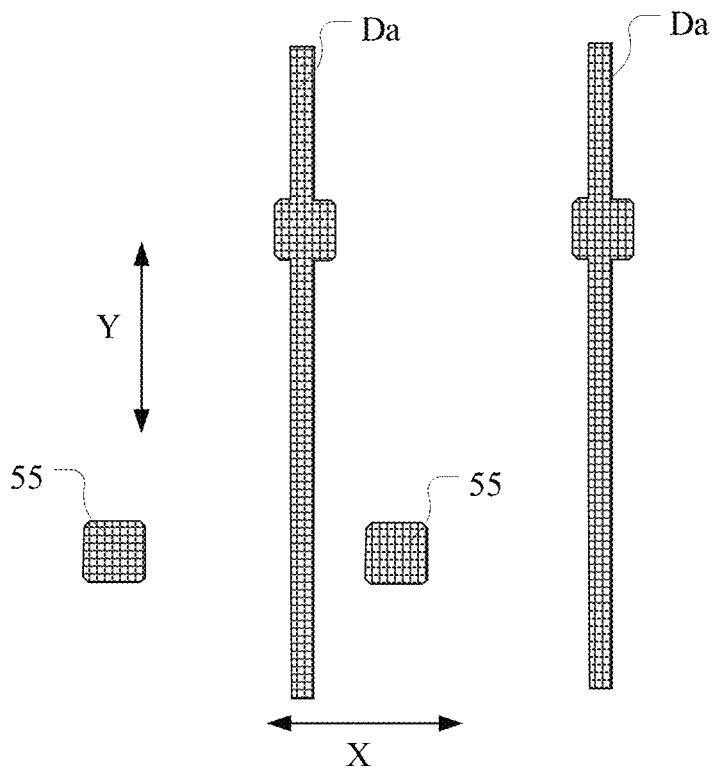
FIG. 8 is a structural layout of the fifth conductive layer in FIG. 3.
Figure 9:
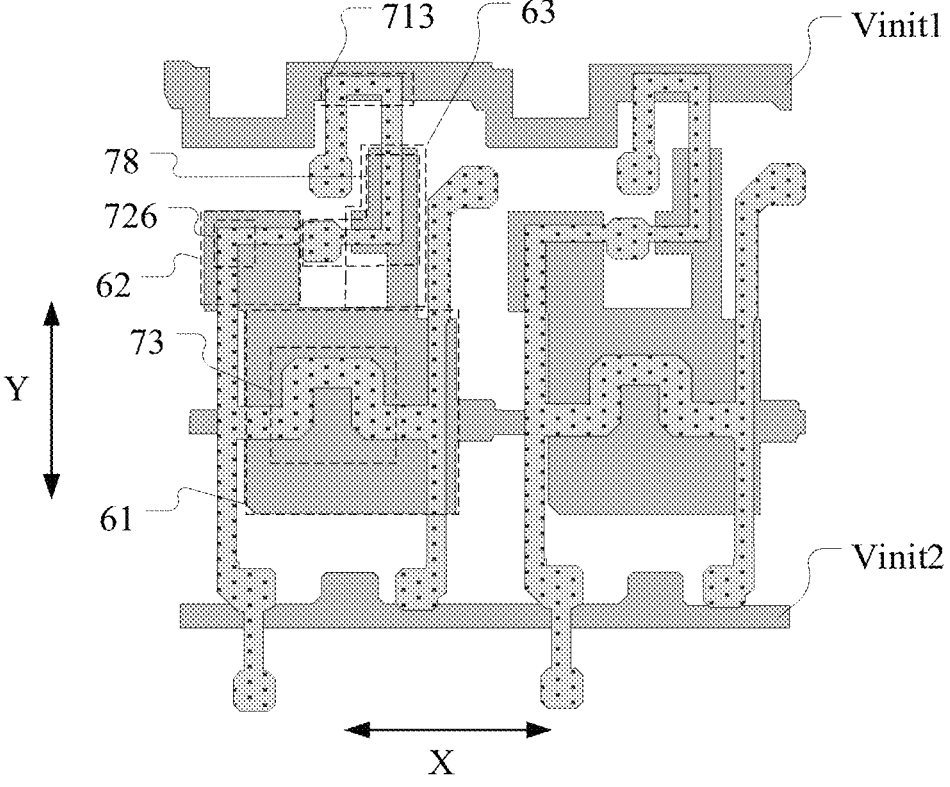
FIG. 9 is a structural layout of the shielding layer and the first active layer in FIG. 3.
Figure 10:
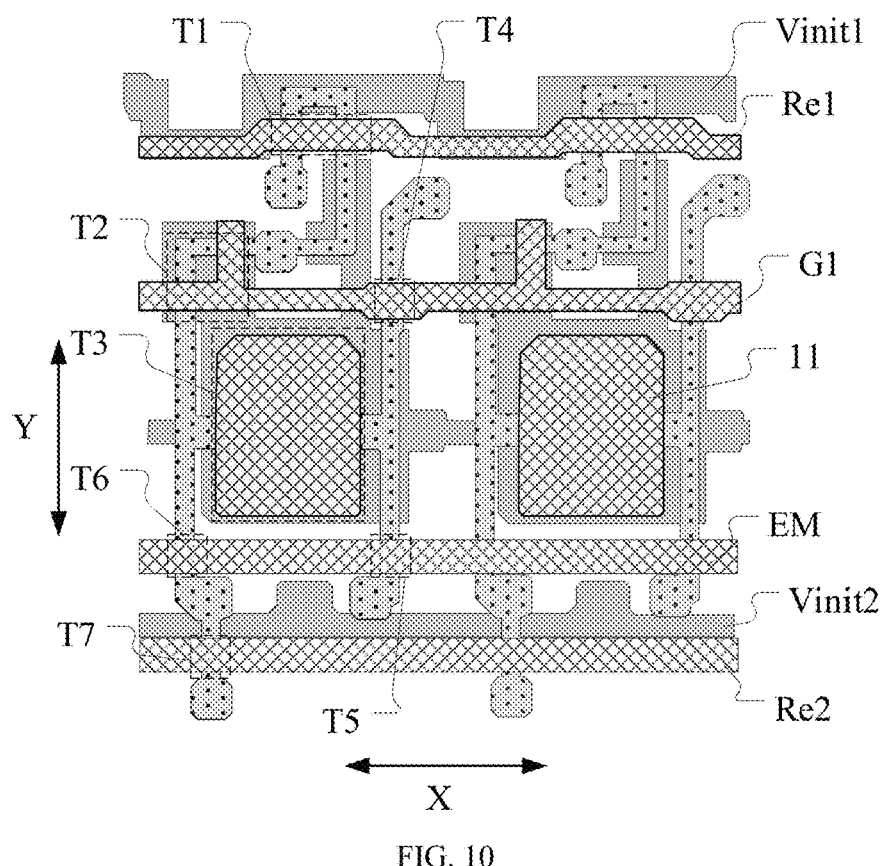
FIG. 10 is a structural layout of the shielding layer, the first active layer, and the first conductive layer in FIG. 3.
Figure 11:
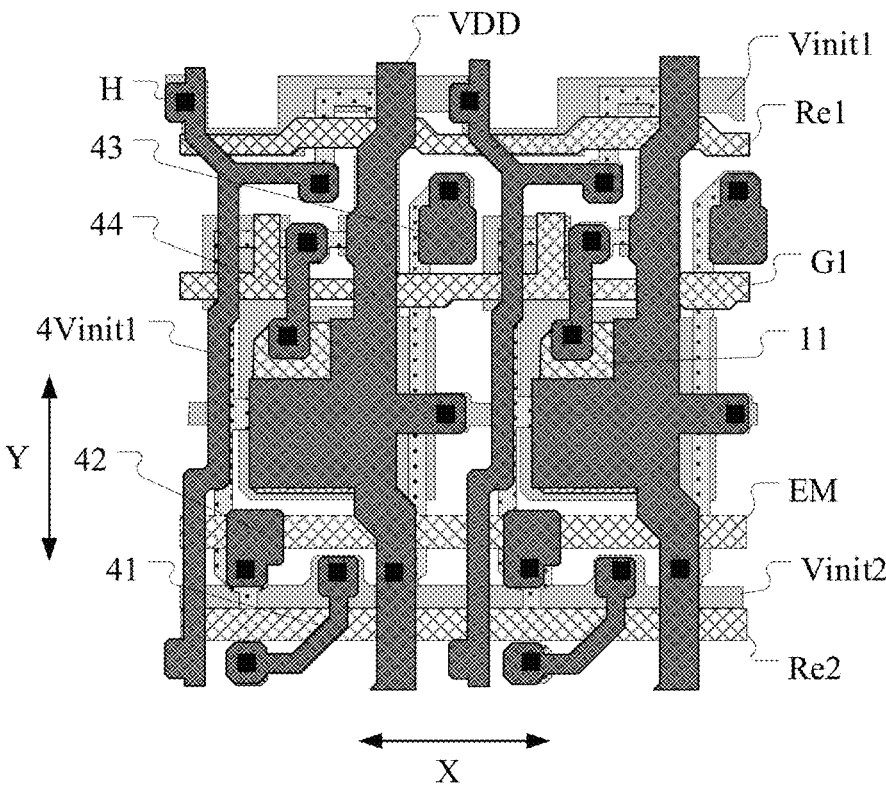
FIG. 11 is a structural layout of the shielding layer, the first active layer, the first conductive layer, and the fourth conductive layer in FIG. 3.

There is further provided a display panel according to some embodiments, which may include a base substrate, a shielding layer, a first active layer, a first conductive layer, a fourth conductive layer, and a fifth conductive layer that are sequentially stacked, where, an insulation layer may be provided between the above-mentioned adjacent layers. As shown in FIG. 3 to FIG. 11, FIG. 3 is a structural layout of a display panel according to some embodiments of the present disclosure, FIG. 4 is a structural layout of the shielding layer in FIG. 3, FIG. 5 is a structural layout of the first active layer in FIG. 3, FIG. 6 is a structural layout of the first conductive layer in FIG. 3, FIG. 7 is a structural layout of the fourth conductive layer in FIG. 3, FIG. 8 is a structural layout of the fifth conductive layer in FIG. 3, FIG. 9 is a structural layout of the shielding layer and the first active layer in FIG. 3, FIG. 10 is a structural layout of the shielding layer, the first active layer, and the first conductive layer in FIG. 3, and FIG. 11 is a structural layout of the shielding layer, the first active layer, the first conductive layer, and the fourth conductive layer in FIG. 3. The display panel may include more than one driving circuit shown in FIG. 1.

As shown in FIG. 3, FIG. 4, and FIG. 9, the shielding layer can be a conductive layer, and the shielding layer can include more than one first initial signal line Vinit1, a second initial signal line Vinit2, a first shielding part 61, a second shielding part 62, and a third shielding part 63. Among them, both the orthographic projection of the first initial signal line Vinit1 on the base substrate and the orthographic projection of the second initial signal line Vinit2 on the base substrate may extend along the first direction X. The first initial signal line Vinit1 can be used to provide the first initial signal end in FIG. 1, and the second initial signal line Vinit2 can be used to provide the second initial signal end in FIG. 1. The first shielding part 61 is connected to the second shielding part 62 and the third shielding part 63 respectively. Moreover, the first shielding parts 61 arranged at intervals in the first direction X may be connected in sequence. The first shielding part 61 may include a first edge 611, the second shielding part 62 may include a second edge 622, and the third shielding part 63 may include a third edge 633. The first edge 611 is connected to the second edge 622, and the angle between the orthographic projection of the first edge 611 on the base substrate and the orthographic projection of the second edge 622 on the base substrate may be less than 180°. For example, the angle between the orthographic projection of the first edge 611 on the base substrate and the orthographic projection of the second edge 622 on the base substrate may be 90°. The first edge 611 is connected to the third edge 633, and the angle between the orthographic projection of the first edge 611 on the base substrate and the orthographic projection of the third edge 633 on the base substrate may be less than 180°. For example, the angle between the orthographic projection of the first edge 611 on the base substrate and the orthographic projection of the third edge 633 on the base substrate may be 90°.

As shown in FIG. 3, FIG. 5, and FIG. 9, the first active layer may include a first active part 71, a second active part 72, a third active part 73, a fourth active part 74, and a fifth active part. 75, a sixth active part 76, and a seventh active part 77. Among them, the first active part 71 is used to form the channel region of the first transistor T1, the second active part 72 is used to form the channel region of the second transistor T2, the third active part 73 is used to form the channel region of the driving transistor T3, the fourth active part 74 is used to form the channel region of the fourth transistor T4, the fifth active part 75 is used to form the channel region of the fifth transistor T5, the sixth active part 76 is used to form the channel region of the sixth transistor T6, and the seventh active part 77 is used to form the channel region of the seventh transistor T7. Among them, the first active part 71 may include a first active sub-part 711 and a second active sub-part 712, and the first active layer further includes a third active sub-part 713 connected between the first active sub-part 711 and the second active sub-part 712. The second active part 72 may include a fourth active sub-part 724 and a fifth active sub-part 725, and the first active layer further includes a sixth active sub-part 726 connected between the fourth active sub-part 724 and the fifth active sub-part 725. The first active layer may further include an eighth active part 78, a ninth active part 79, a tenth active part 710, a fourteenth active part 714, a fifteenth active part 715, and a sixteenth active part 716. The eighth active part 78 is connected between the first active part 71 and the second active part 72, the ninth active part 79 is connected to an end of the fifth active part 75 and the third active part 73, the tenth active part 710 is connected between the sixth active part 76 and the seventh active part 77, the sixteenth active part 716 is connected to an end of the fourth active part 74 away from the third active part 73, the fourteenth active part 714 is connected to an end of the seventh active part 77 away from the sixth active part 76, and the fifteenth active part 715 is connected to an end of the first active part 71 away from the second active part 72. The first active layer may be formed of polysilicon material, and correspondingly, the first transistor T1, the second transistor T2, the driving transistor T3, the fourth transistor T4, the fifth transistor T5, the sixth transistor T6, and the seventh transistor T7 may be P-type low temperature polysilicon thin film transistors.

As shown in FIG. 3, FIG. 6, and FIG. 10, the first conductive layer may include a first reset signal line Re1, a first gate line G1, an enabling signal line EM, a second reset signal line Re2, and a first conductive part 11. Among them, the orthographic projection of the first reset signal line Re1 on the base substrate, the orthographic projection of the first gate line G1 on the base substrate, the orthographic projection of the enabling signal line EM on the base substrate, and the orthographic projection of the second reset signal line Re2 on the base substrate may all extend along the first direction X. In some embodiments, the orthographic projection of a certain structure on the base substrate extending along a certain direction may be understood as that the orthographic projection of the structure on the base substrate extends linearly or bends along the direction. The orthographic projection of the first reset signal line Re1 on the base substrate can cover the orthographic projection of the first active part 71 on the base substrate, a part of the structure of the first reset signal line Re1 can be used to form the gate of the first transistor T1, and the first reset signal line Re1 can be used to provide the first reset signal end in the pixel driving circuit shown in FIG. 1. The orthographic projection of the second reset signal line Re2 on the base substrate can cover the orthographic projection of the seventh active part 77 on the base substrate, a part of structure of the second reset signal line Re2 can be used to form the gate of the seventh transistor T7, and the second reset signal line Re2 can be used to provide the second reset signal end in the pixel driving circuit shown in FIG. 1. The orthographic projection of the first gate line G1 on the base substrate can cover the orthographic projection of the second active part 72 on the base substrate and the orthographic projection of the fourth active part 74 on the base substrate. A part of structure of first gate line G1 can be used to form the gate of the second transistor T2, another part of the structure of the first gate line G1 can be used to form the gate of the fourth transistor T4, and the first gate line G1 can be used to provide the first gate driving signal end in the pixel driving circuit shown in FIG. 1. The orthographic projection of the enabling signal line EM on the base substrate can cover the orthographic projection of the fifth active part 75 on the base substrate and the orthographic projection of the sixth active part 76 on the base substrate, a part of the structure of the enabling signal line EM can be used to form the gate of the fifth transistor T5, another part of the structure of the enabling signal line EM can be used to form the gate of the sixth transistor T6, and the enabling signal line EM can be used to provide the enabling signal end in the pixel driving circuit shown in FIG. 1. The orthographic projection of the first conductive part 11 on the base substrate can cover the orthographic projection of the third active part 73 on the base substrate, and the first conductive part 11 can be used to form the gate of the driving transistor T3 and the first electrode of the capacitor C. In addition, the display panel can use the first conductive layer as a mask to perform a conductorzation treatment on the first active layer, that is, the region covered by the first conductive layer in the first active layer can form the channel region of the transistor, and the region not covered by the first conductive layer in the first active layer forms a conductor structure.

In some embodiments, as shown in FIG. 3, FIG. 4, FIG. 6, FIG. 9, and FIG. 10, the orthographic projection of the first shielding part 61 on the base substrate may overlaps with the orthographic projection of the third active part 73 on the base substrate. For example, the orthographic projection of the first shielding part 61 on the base substrate can cover the orthographic projection of the third active part 73 on the base substrate. The first shielding part 61 can be connected to a stable voltage source, for example, the first shielding part 61 can be connected to the first power supply end VDD, the first initial signal end Vinit1, the second initial signal end Vinit2 and the like in FIG. 1. The first shielding part 61 can be used for shielding the influence of noise of other signals on the driving transistor T3. When the first shielding part 61 is connected to the first power supply end VDD, the first shielding part 61 can also be used to form the second electrode of the capacitor C. The orthographic projection of the second shielding part 62 on the base substrate at least partially overlaps with the orthographic projection of the sixth active sub-part 726 on the base substrate, and the second shielding part 62 can play voltage stabilizing effect on the sixth active sub-part 726, reducing the leakage current from the sixth active sub-part 726 to the drain of the second transistor due to the voltage fluctuation of the sixth active sub-part 726. The orthographic projection of the third shielding part 63 on the base substrate may at least partially overlap with the orthographic projection of the eighth active part 78 on the base substrate, and the third shielding part 63 may can play voltage stabilizing effect on the eighth active part 78, so that the voltage fluctuation of the gate of the driving transistor T3 can be reduced. As shown in FIG. 4, the first initial signal line Vinit1 includes a first extension part Vinit11 and a second extension part Vinit12, and the orthographic projection of the first extension part Vinit11 on the base substrate may at least partially overlap with the ortho- graphic projection of the third active sub-part 713 on the base substrate, and the first extension part Vinit11 c can play voltage stabilizing effect on the third active sub-part 713, thus reducing the leakage current from the third active sub-part 713 to the drain of the first transistor caused by the voltage fluctuation of the third active sub-part 713. The orthographic projection of the second extension part Vinit12 on the base substrate may at least partially overlap with the orthographic projection of the first reset signal line Re1 on the base substrate, thus improving the transmittance of the display panel.

As shown in FIG. 3, FIG. 7, and FIG. 11, the fourth conductive layer may include a first initial connection line 4Vinit1, a power line VDD, a first bridging part 41, a second bridging part 42, a third bridging part 43 and a fourth bridging part 44. Among them, the orthographic projection of the first initial connection line 4Vinit1 on the base substrate and the orthographic projection of the power line VDD on the base substrate can both extend along the second direction Y, and the second direction Y can intersect with the first direction X. For example, the second direction Y may be a column direction, and the first direction X may be a row direction. The first initial connection line 4Vinit1 can be respectively connected to the first initial signal line Vinit1 and the fifteenth active part 715 through the via hole H, so as to connect the first initial signal end and the first electrode of the first transistor. Among them, the black block in the drawing indicates the position of the via hole. In some embodiments, the first initial connection line 4Vinit1 and the first initial signal line Vinit1 can form a grid structure, and the grid structure can reduce the voltage difference between the first initial signal ends at different positions of the display panel. The power line VDD can provide the first power end, and the power line VDD can be respectively connected to the first shielding part 61 and the ninth active part 79 through the via hole, so as to connect the second electrode of the capacitor, the first power end and the first electrode of the fifth transistor. As shown in FIG. 3, FIG. 7, and FIG. 11, the power line VDD may include a third extension part VDD3, a fourth extension part VDD4, and a fifth extension part VDD5, and the fifth extension part VDD5 is connected between the third extension part VDD3 and the fourth extension part VDD4, the size of the orthographic projection of the fifth extension part VDD5 on the base substrate in the first direction X is greater than the size of the orthographic projection of the third extension part VDD3 on the base substrate in the first direction X, and the size of the ortho- graphic projection of the fifth extension part VDD5 on the base substrate in the first direction X is greater than the size of the orthographic projection of the fourth extension part VDD4 on the base substrate in the first direction X. The orthographic projection of the fifth extension part VDD5 on the base substrate may also at least partially overlap with the orthographic projection of the first conductive part 11 on the base substrate, and the fifth extension part VDD5 may also be used to form the second electrode of the capacitor C. The area of the orthographic projection of the first conductive part 11 on the base substrate is S1, and the overlapping area of the orthographic projection of the first conductive part 11 on the base substrate and the orthographic projection of the fifth extension part VDD5 on the base substrate is S2. S2/S1 can be greater than or equal to 60%, for example, S2/S1 can be equal to 60%, 70%, 80%, 90%, or 100% and so on. The power line VDD and the first shielding part 61 can also form a grid structure, which can reduce the voltage difference between the first power ends at different positions of the display panel.

As shown in FIG. 3, FIG. 7, and FIG. 11, the first bridging part 41 can be respectively connected to the second initial signal line Vinit2 and the fourteenth active part 714 through the via hole, so as to connect the first electrode of the seventh transistor and the second initial signal end. The second bridging part 42 may be connected to the tenth active part 710 through a via hole, so as to connect the second electrode of the sixth transistor and the second electrode of the seventh transistor. The third bridging part 43 may be connected to the sixteenth active part 716 through a via hole, so as to be connected to the first electrode of the fourth transistor. The fourth bridging part 44 can be respectively connected to the eighth active part 78 and the first conductive part 11 through via holes, so as to connect the first electrode of the second transistor T2, the second electrode of the first transistor T1 and the gate of the driving transistor T3.

As shown in FIG. 3 and FIG. 8, the fifth conductive layer may include a fifth bridging part 55 and a data line Da. The data line Da may be used to provide the data signal end in FIG. 1. The fifth bridging part 55 can be connected to the second bridging part 42 through a via hole, so as to be connected to the second electrode of the sixth transistor. The fifth bridging part 55 can also be connected to the first electrode of the light emitting unit. The orthographic pro- jection of the data line Da on the base substrate may extend along the second direction Y, and the data line Da may be connected to the third bridging part 43 through a via hole, so as to connect the first electrode of the fourth transistor and the data signal end.

It should be noted that, as shown in FIG. 3 and FIG. 11, the black blocks drawn on the side of the fourth conductive layer away from the base substrate indicate the via holes through which the fourth conductive layer is connected other layers facing the side of the base substrate. The black blocks drawn on the side of the fifth conductive layer away from the base substrate indicate the via holes through which the fifth conductive layer is connected to other layers facing the side of the base substrate. The black blocks drawn on the side of the electrode layer away from the base substrate indicate the via holes through which the electrode layer is connected to other layers facing the side of the base substrate. The black block indicates the position of the via hole, and different via holes represented by black blocks at different positions may penetrate through different insulation layers.

Figure 12:
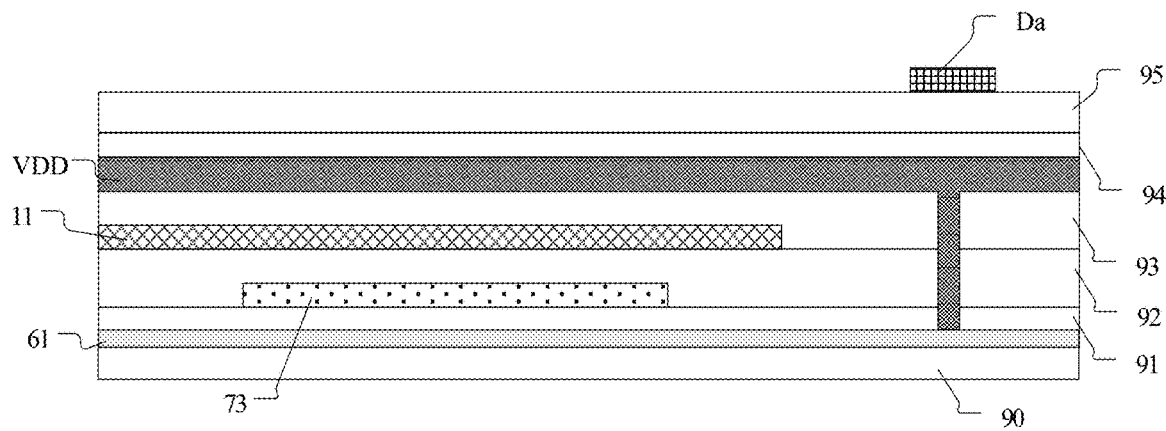
FIG. 12 is a partial cross-sectional view of the display panel along the dotted line AA shown in FIG. 3.

As shown in FIG. 12, it is a partial cross-sectional view of the display panel along the dotted line AA shown in FIG. 3. The display panel may further include a buffer layer 91, an insulation layer 92, a dielectric layer 93, a passivation layer 94, and a first flat layer 95. Among them, the base substrate, the shielding layer, the buffer layer 91, the first active layer, the insulation layer 92, the first conductive layer, the dielectric layer 93, the fourth conductive layer, the passivation layer 94, the first planar layer 95, the fifth conductive layers are stacked in sequence. The buffer layer 91 may include a silicon oxide layer and a silicon nitride layer. The insulation layer 92 can be a single-layer structure or a multi-layer structure, and the material of the insulation layer 92 can be at least one of silicon nitride, silicon oxide, and silicon oxynitride. The dielectric layer 93 can be a silicon nitride layer. The passivation layer 94 can be a silicon oxide layer. The material of the first flat layer 95 can be an organic material, such as polyimide (PI), polyethylene terephthalate (PET), polyethylene naphthalate (PEN), silicon-glass bonding structure (SOG) and other materials. The base substrate 90 may include a glass substrate, a barrier layer, and a polyimide layer stacked in sequence, and the barrier layer may be an inorganic material. The material of the first conductive layer may be one or an alloy of molybdenum, aluminum, copper, titanium, niobium, or a molybdenum/titanium alloy or laminate. The material of the fourth conductive layer and the fifth conductive layer may include metal materials, such as one or an alloy of molybdenum, aluminum, copper, titanium, niobium, or a molybdenum/titanium alloy or laminate, etc., or may be titanium/aluminum/titanium laminate. The display panel may further include a second flat layer, an electrode layer, and a pixel definition layer, the second flat layer is located on the side of the fifth conductive layer away from the base substrate, the electrode layer is located on the side of the second flat layer away from the base substrate, and the pixel definition layer is located on the side of the electrode layer away from the base substrate.

It should be noted that the scale of the drawings in the present disclosure can be used as a reference in the actual process, but is not limited to this. For example, the width-to-length ratio of the channel, the thickness and spacing of each film layer, and the width and spacing of each signal line, can be adjusted according to actual needs. The number of pixels in the display substrate and the number of sub-pixels in each pixel are not limited to the numbers shown in the drawings, and the drawings described in the present disclosure are structural schematic diagrams. In addition, the first, second and other qualifiers are used to define different structural names, and they have no meaning of a specific order.

Figure 13:
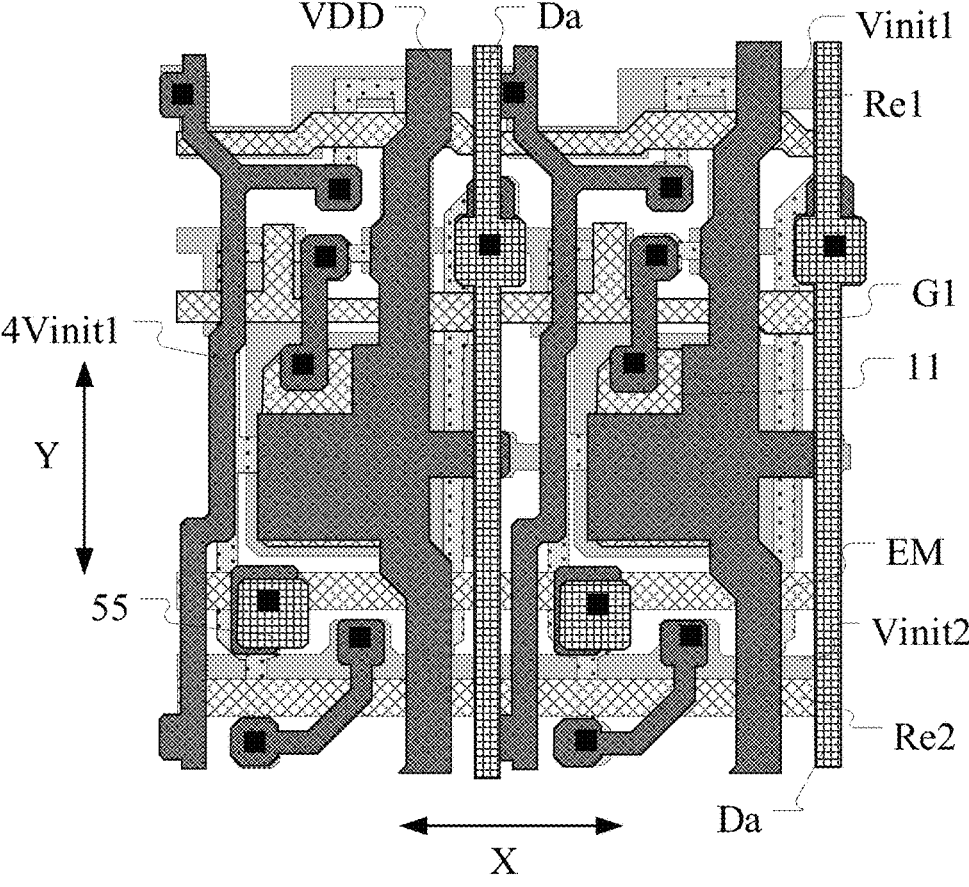
FIG. 13 is a structural layout of a display panel according to another exemplary embodiment of the present disclosure.
Figures 14, 15:
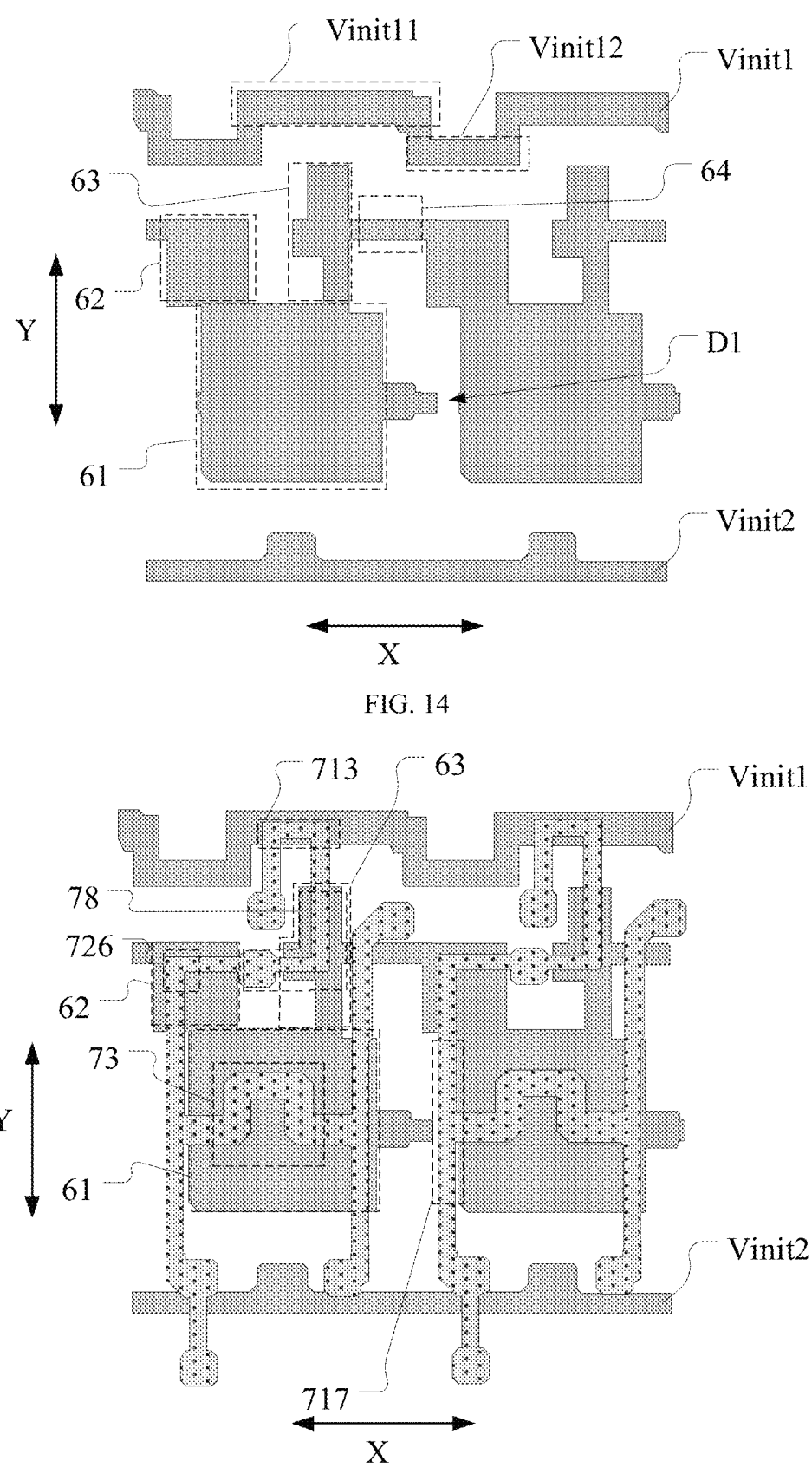
FIG. 14 is a structural layout of the shielding layer in FIG. 13.
FIG. 15 is a structural layout of the barrier layer and the first active layer in FIG. 13.

As shown in FIG. 13 to FIG. 15, FIG. 13 is a structural layout of a display panel according to another exemplary embodiment of the present disclosure, FIG. 14 is a structural layout of the shielding layer in FIG. 13, and FIG. 15 is a structural layout of the barrier layer and the first active layer in FIG. 13.

As shown in FIG. 14 and FIG. 15, the first active layer may further include a seventeenth active part 717. The seventeenth active part 717 is connected between the second active part 72 and the sixth active part 76, and the orthographic projection of the seventeenth active part 717 on the base substrate extends along the second direction Y, where the seventeenth active part 717 is an equipotential point of the second electrode of the driving transistor. The difference between the display panel shown in FIG. 13 and the display panel shown in FIG. 3 is that, in the display panel shown in FIG. 13, there is a fracture D1 between the adjacent first shielding parts 61 in the first direction X, that is adjacent first shielding parts 61 in the first direction X are not directly connected. The orthographic projection of the fracture D1 on the base substrate intersects with the orthographic projection of the seventeenth active part 717 on the base substrate. This arrangement can reduce the parasitic capacitance between the seventeenth active part 717 and the shielding layer, thus improving the problem of image sticking on the display panel. As shown in FIG. 14, the shielding layer includes a first connection part 64, and the first connection part 64 is connected between the third shielding part 63 and the second shielding part 62 in adjacent pixel driving circuits in a same row. The orthographic projection of the first connection part 64 on the base substrate may be located on a side of the orthographic projection of the first gate line G1 on the base substrate away from the orthographic projection of the first conductive part 11 on the base substrate. That is, the orthographic projection of the first connection part 64 on the base substrate does not overlap with the orthographic projection of the seventeenth active part 717 on the base substrate. In some embodiments, two first shielding parts 61 adjacent in the first direction X can be connected through the first connection part 64. In addition, other structures of the display panel shown in FIG. 14 may be the same as those of the display panel shown in FIG. 3.

Figure 16:
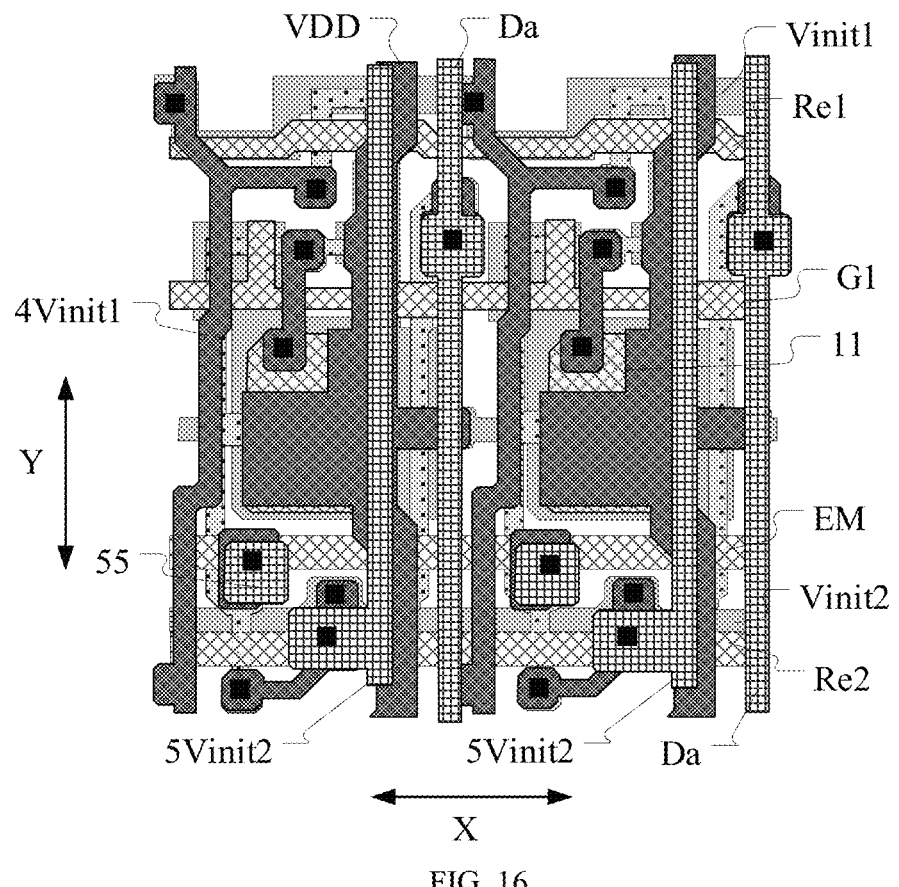
FIG. 16 is a structural layout of a display panel according to another exemplary embodiment of the present disclosure.
Figure 17:
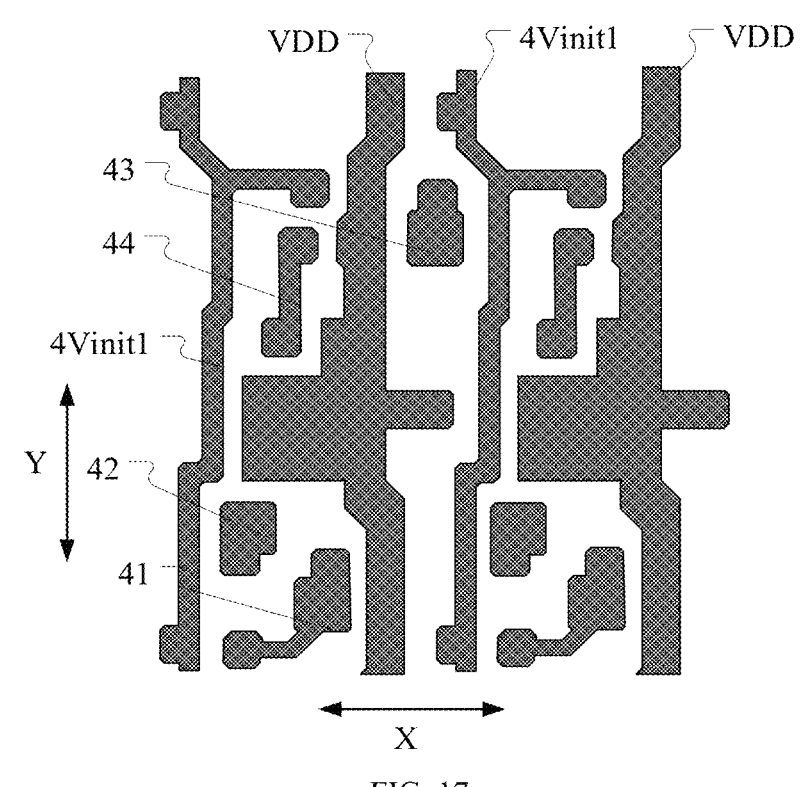
FIG. 17 is a structural layout of the fourth conductive layer in FIG. 16.
Figure 18:
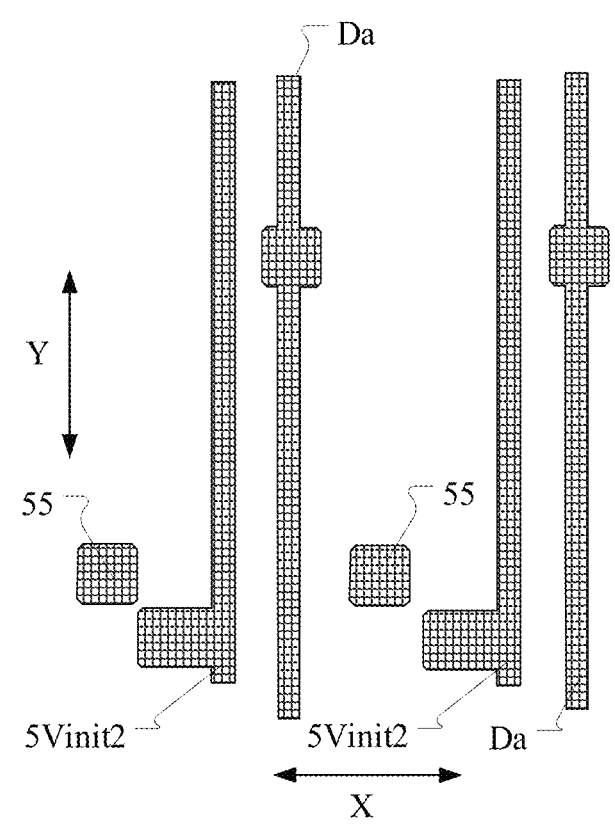
FIG. 18 is a structural layout of the fifth conductive layer in FIG. 16.
Figure 19:
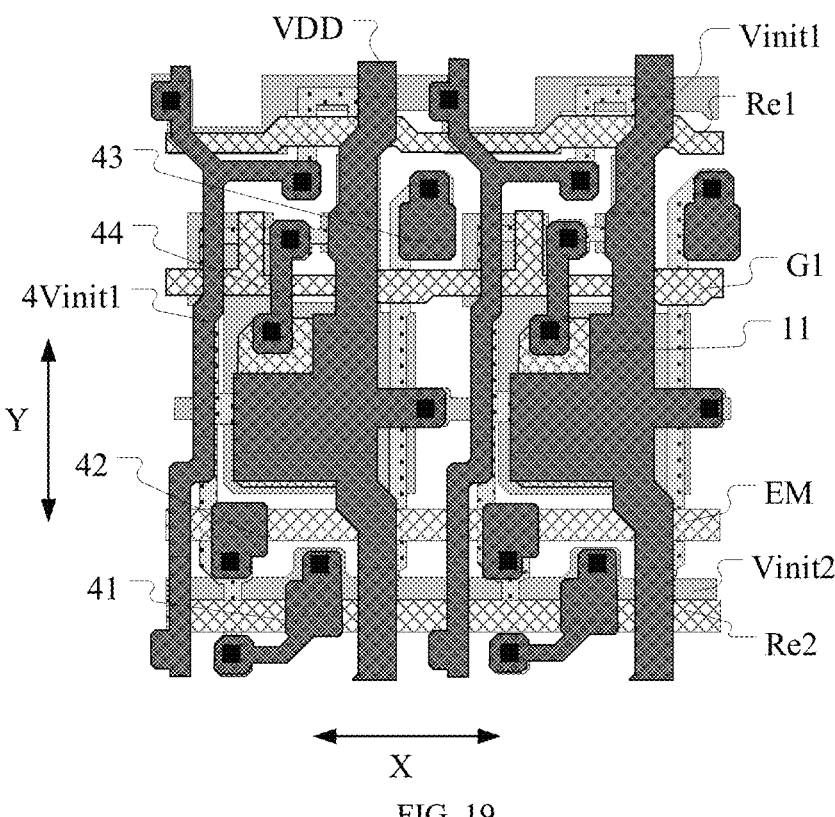
FIG. 19 is a structural layout of the shielding layer, the first active layer, the first conductive layer, and the fourth conductive layer in FIG. 16.

As shown in FIG. 16 to FIG. 19, FIG. 16 is a structural layout of a display panel according to another exemplary embodiment of the present disclosure, FIG. 17 is a structural layout of the fourth conductive layer in FIG. 16, and FIG. 18 is a structural layout of the fifth conductive layer in FIG. 16, FIG. 19 is a structural layout of the shielding layer, the first active layer, the first conductive layer, and the fourth conductive layer in FIG. 16.

The difference between the display panel shown in FIG. 16 and the display panel shown in FIG. 3 is that, in the display panel shown in FIG. 16, the fifth conductive layer may further include a second initial connection line 5Vinit2. The orthographic projection of the second initial connection line 5Vinit2 on the base substrate may extend along the second direction Y. The second initial connection line 5Vinit2 can be connected to the first bridging part 41 through a via hole, so as to connect the second initial signal line Vinit2. The second initial connection line 5Vinit2 and the second initial signal line Vinit2 can form a grid structure, and the grid structure can reduce the voltage difference between the second initial signal ends at different positions of the display panel. Other structures of the display panel shown in FIG. 16 may be the same as those of the display panel shown in FIG. 3.

Figures 20, 21:
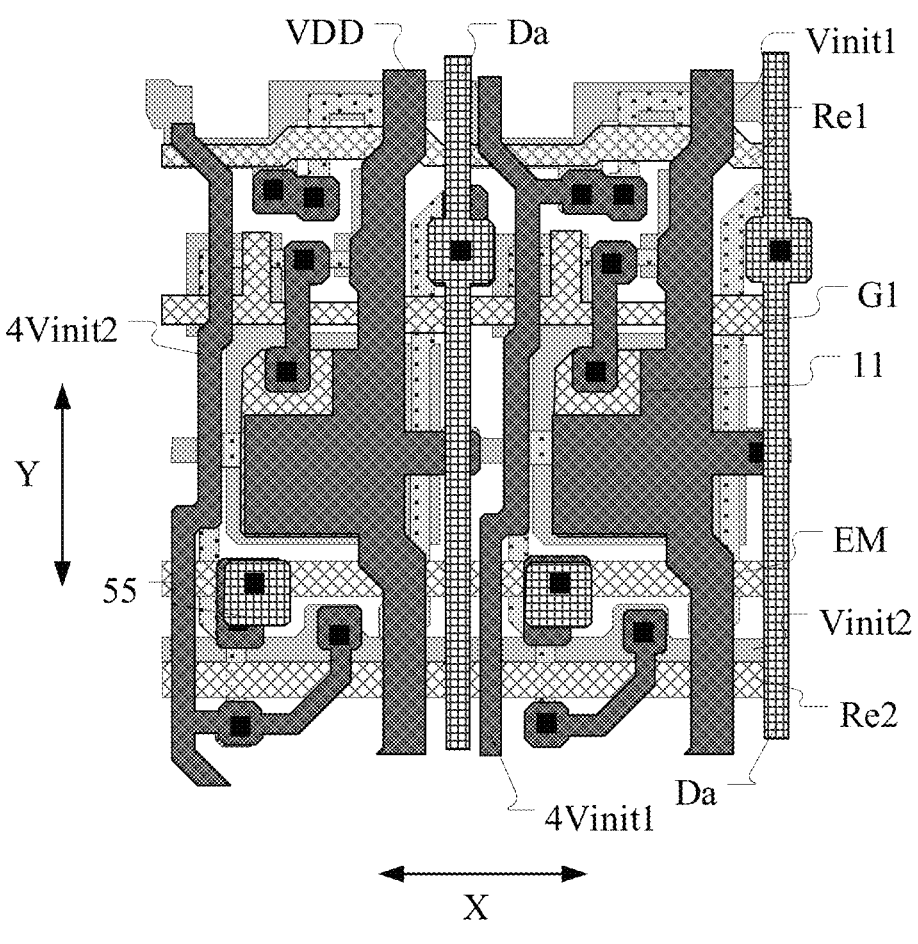
FIG. 20 is a structural layout of a display panel according to another exemplary embodiment of the present disclosure.
FIG. 21 is a structural layout of the shielding layer in FIG. 20.
Figure 22:
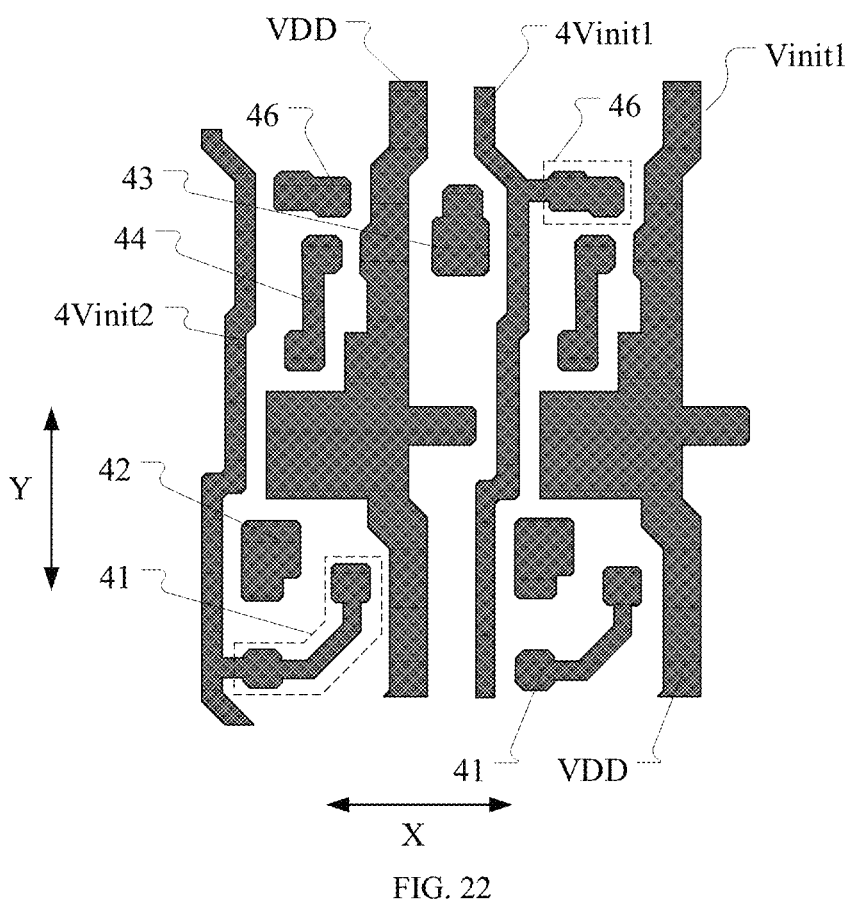
FIG. 22 is a structural layout of the fourth conductive layer in FIG. 20.
Figure 23:
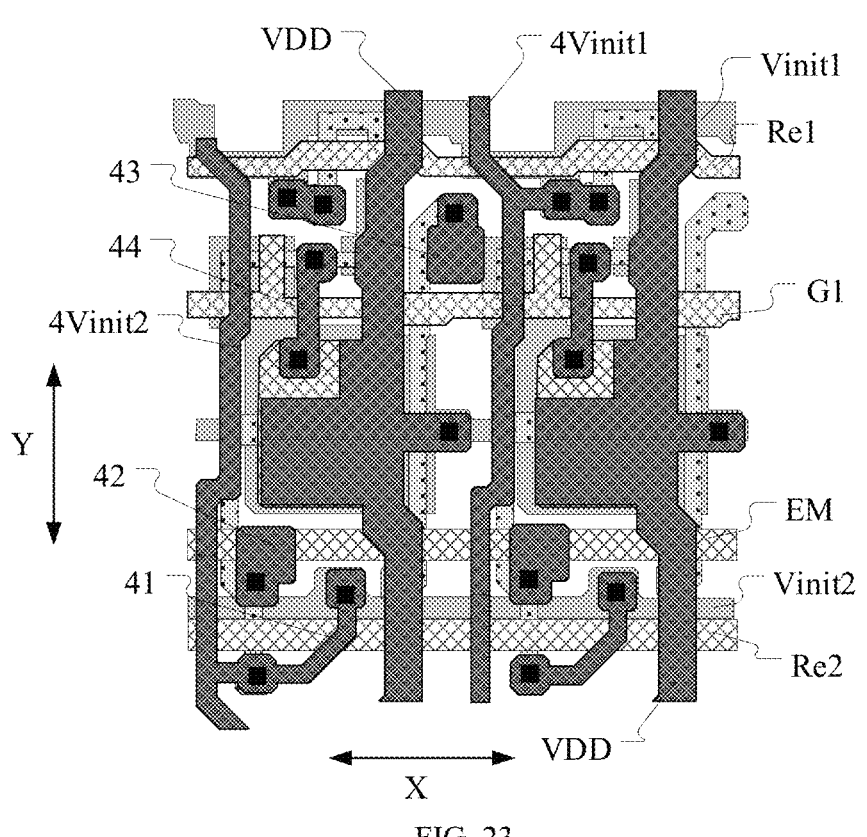
FIG. 23 is a structural layout of the shielding layer, the first active layer, the first conductive layer, and the fourth conductive layer in FIG. 20.

As shown in FIG. 20 to FIG. 23, FIG. 20 is a structural layout of a display panel according to another exemplary embodiment of the present disclosure, FIG. 21 is a structural layout of a shielding layer in FIG. 20, FIG. 22 is a structure layout of a fourth conductive layer in FIG. 20, and FIG. 23 is a structural layout of the shielding layer, the first active layer, the first conductive layer, and the fourth conductive layer in FIG. 20.

The difference between the display panel shown in FIG. 20 and the display panel shown in FIG. 3 is that, in the display panel shown in FIG. 20, the fourth conductive layer further includes a second initial connection line 4Vinit2. Among them, a first initial connection line 4Vinit1 and a second initial connection line 4Vinit2 may be provided corresponding to two adjacent columns of pixel driving circuits. The fourth conductive layer may further include a sixth bridging part 46. The first initial connection line 4Vinit1 may be connected to the via of the first initial signal line Vinit1 through the sixth bridging part 46, and the second initial connection line 4Vinit2 may be connected to the via of the second initial signal line Vinit2 through the first bridging part 41. Other structures of the display panel shown in FIG. 20 may be the same as those of the display panel shown in FIG. 3.

Figure 24:
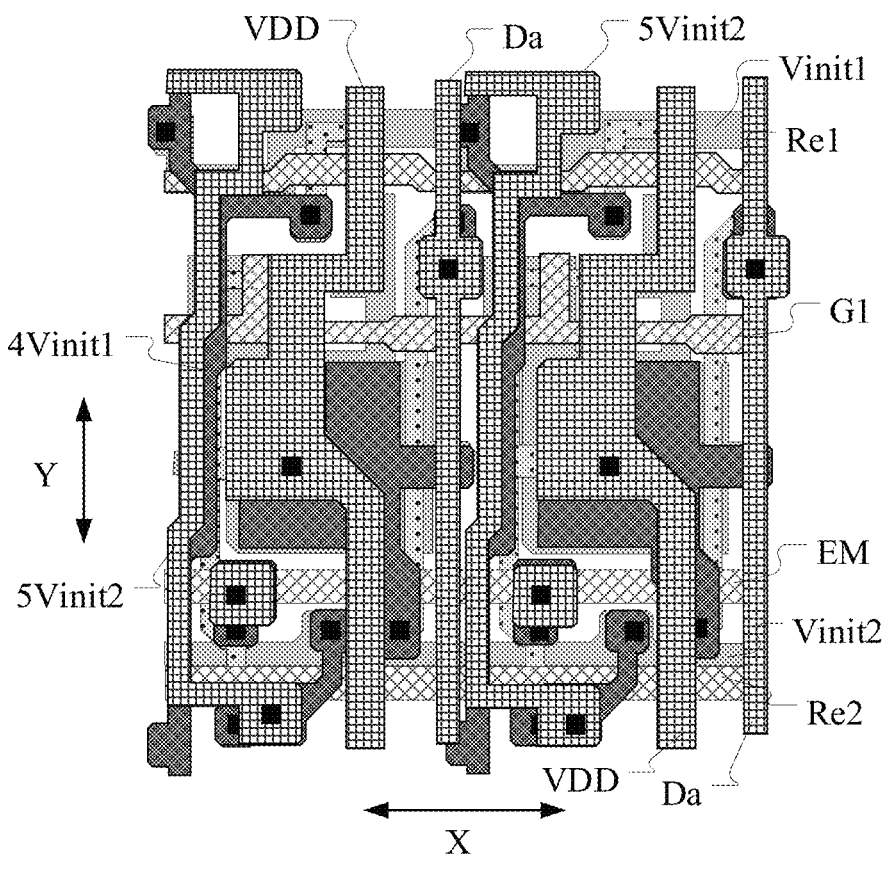
FIG. 24 is a structural layout of a display panel according to another exemplary embodiment of the present disclosure.
Figure 25:
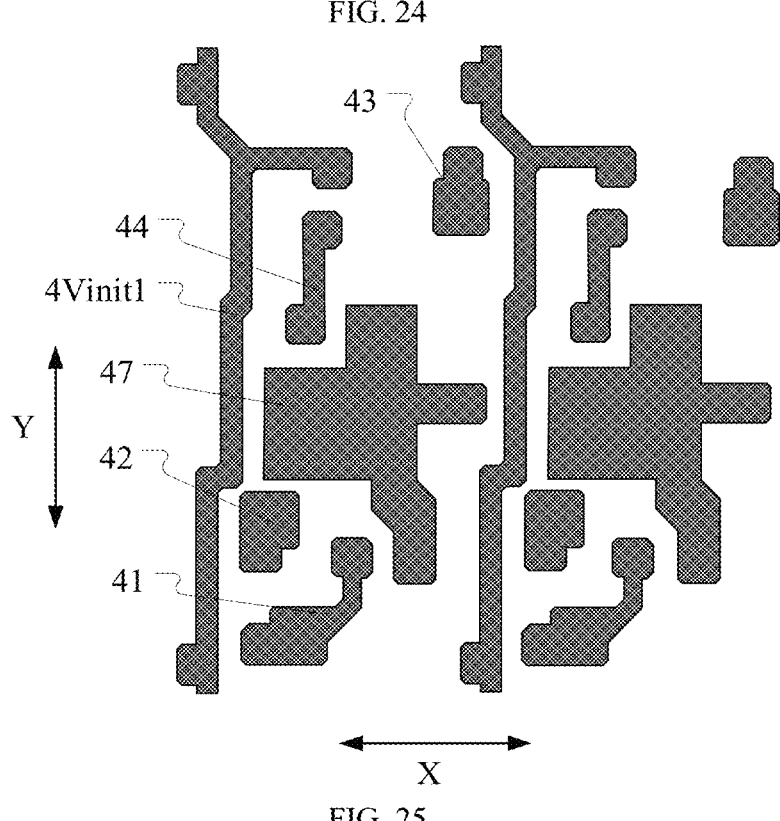
FIG. 25 is a structural layout of the fourth conductive layer in FIG. 24.
Figure 26:
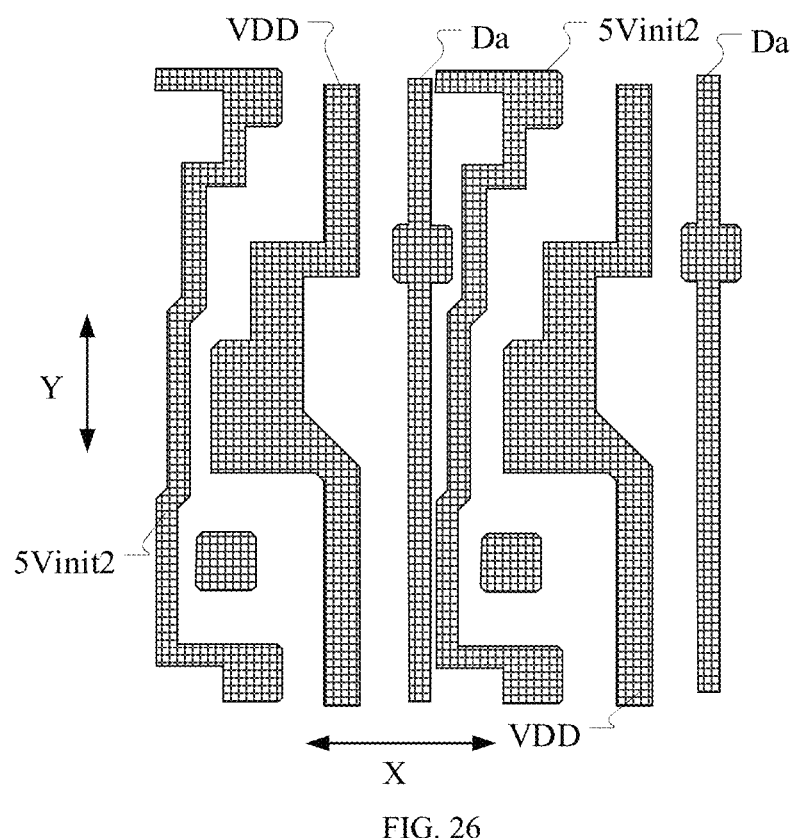
FIG. 26 is a structural layout of the fifth conductive layer in FIG. 24.
Figure 27:
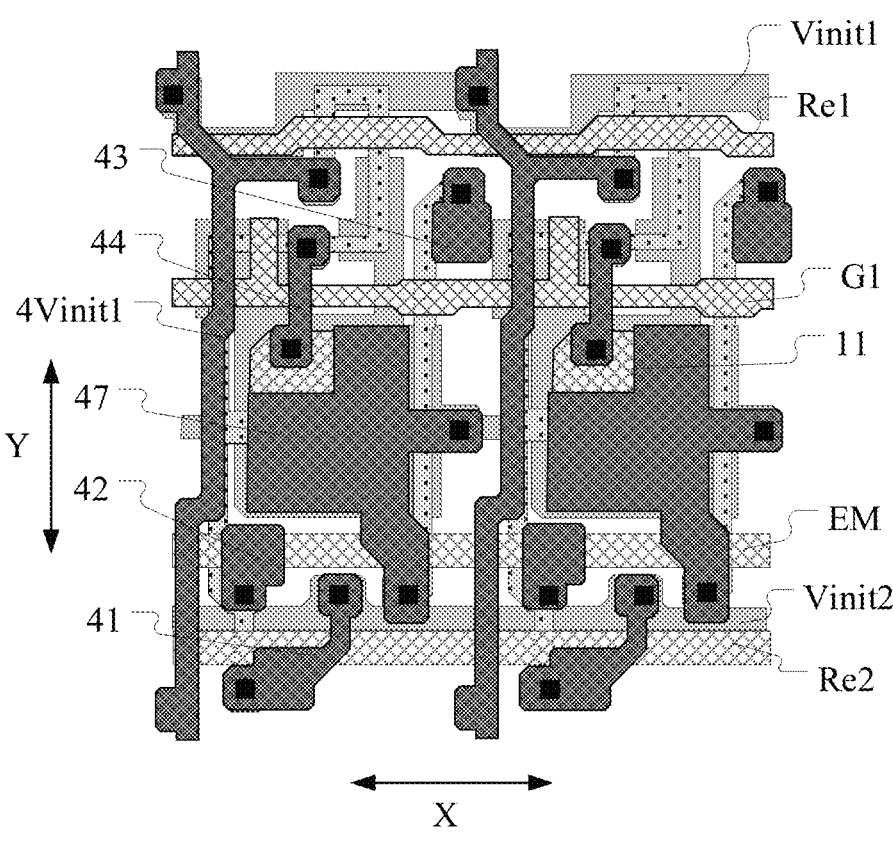
FIG. 27 is a structural layout of the shielding layer, the first active layer, the first conductive layer, and the fourth conductive layer in FIG. 24.

As shown in FIG. 24 to FIG. 27, FIG. 24 is a structural layout of a display panel according to another exemplary embodiment of the present disclosure, FIG. 25 is a structural layout of the fourth conductive layer in FIG. 24, FIG. 26 is a fifth conductive layer in FIG. 25, and FIG. 27 is a structural layout of the shielding layer, the first active layer, the first conductive layer, and the fourth conductive layer in FIG. 24.

The difference between the display panel shown in FIG. 24 and the display panel shown in FIG. 3 is that, in the display panel shown in FIG. 24, the fourth conductive layer is not provided with a power line VDD, the fourth conductive layer is added with a seventh bridging part 47 connecting the first shielding part 61 through a via hole. In the display panel shown in FIG. 24, a power line VDD and a second initial connection line 5Vinit2 are added to the fifth conductive layer. The power line VDD is connected to the seventh bridging part 47 through the via hole, so as to connect to the second electrode of the capacitor. The orthographic projection of the power line VDD on the base substrate can further cover the orthographic projection of the fourth bridging part 44 on the base substrate, and the power line VDD can shield the noise interference of other signals on the fourth bridging part 44, thus reducing the voltage fluctuation of the grid of the driving transistor T3. The second initial connection line 5Vinit2 is connected to the first bridging part 41 through a via hole, so that the second initial connection line 5Vinit2 and the second initial signal line Vinit2 can form a grid structure. The grid structure can reduce the voltage difference between the second initial signal ends at different positions of the display panel. Other structures of the display panel shown in FIG. 24 may be the same as those of the display panel shown in FIG. 3.

In some embodiments, the shielding layer is used to form part of the signal lines and device structures in the display panel, thus improving the integration of the display panel. In addition, compared with the display panel in the related art, by means of forming the second electrode of the capacitor through the first shielding part 61 and the fifth extension part VDD5, the display panel does not need to be provided with a second gate layer. In the display panel, the second shielding part 62 and the third shielding part 63 are directly connected to the first shielding part 61, and the second shielding part 62 and the third shielding part 63 are connected to the power lines without needing through via holes, thus reducing the number of via holes. It should be understood that the shielding layer may also include other independently disposed shielding parts, and the shielding parts may also be used to form other signal lines and device structures.

In related art, the PI layer (polyimide) in the base substrate is prone to generate a negative electrostatic field, and the negative electrostatic field will make the threshold of the transistor positively shifted. For example, the negative electrostatic field can easily lead to a positive shift of the threshold of the driving transistor, and the positive shift of the threshold of the driving transistor will lead to undesirable phenomena such as the test of the copper rod of the display panel turning green. The above-mentioned first shielding part 61 can shield the influence of the above-mentioned negative electrostatic field on the threshold value of the driving transistor T3. In addition, the shielding layer can be a light-shielding structure, and the shielding layer can avoid the influence of light on the characteristics of the transistor.

In the related art, the positive shift of the threshold of the driving transistor T3 will increase the driving current at the same gray scale, thus easily causing the display panel to turn green. In some embodiments, the above-mentioned first shielding part 61 can receive a positive power supply voltage, and the positive electric field generated by the first shielding part 61 will cause the threshold of the driving transistor to negatively shift, thus reducing the risk of the display panel turning green.

It should be understood that, in other exemplary embodiments, the threshold voltages of other transistors in the pixel driving circuit also have threshold shifts, thus causing problems such as transistor leakage current. For example, in FIG. 1, the leakage current of the first transistor T1 and the second transistor T2 may cause defects such as flickering of the display panel, and the leakage current of the sixth transistor T6 may cause defects such as the display panel being divided into four screens. In some embodiments, the shielding layer may further include other shielding parts, and the orthographic projections of the other shielding parts on the base substrate may respectively cover at least part of the structures of the orthographic projections of the channel regions of other transistors on the base substrate. Other shielding parts can be arranged independently or at least partially connected. Among them, the shielding part is provided independently, and it can be understood that the shielding part is not connected with other shielding parts.

More than one independently provided shielding parts can receive different power supply voltages, and the magnitude of the power supply voltage received by the shielding parts can be affected by the type of transistor. For example, the shielding part below the P-type transistor can receive a positive power supply voltage, and the positive electric field formed by the shielding part can negatively shift the threshold of the P-type transistor, thus reducing the off-leakage current of the P-type transistor. The shielding part below the N-type transistor can be connected to a negative power supply voltage, and the negative electric field formed by the shielding part can positively shift the threshold of the N-type transistor, thus reducing the off-leakage current of the N-type transistor. For example, the first transistor and the second transistor in FIG. 1 may be N-type transistors, a shielding part may be provided below the first transistor and the second transistor, and the shielding part below the first transistor and the second transistor may receive a negative power supply voltage.

In addition, the magnitude of the power supply voltage received by the shielding part can be determined by the working state of the transistor. For example, in some embodiments, since the fourth transistor T4 and the seventh transistor T7 are in the positive-shift state for a long time, the fifth transistor T5 and the sixth transistor T6 are in the negative-shift state for a long time, and the positive voltage received by the shielding part located below the fourth transistor T4 and the seventh transistor T7 may be greater than the positive voltage received by the shielding part located below the fifth transistor T5 and the sixth transistor T6. For example, the voltage received by the shielding part located below the fourth transistor T4 and the seventh transistor T7 may be 6.6V, and the voltage received by the shielding part located below the fifth transistor T5 and the sixth transistor T6 may be 2.6V.

In addition, the magnitude of the power supply voltage received by the shielding part may be affected by the size of the transistor. For example, the length-width ratio of the channel region of the driving transistor is greater than the length-width ratio of the channel region of the fifth transistor T5, and the voltage received by the shielding part below the driving transistor may be greater than the voltage received by the shielding part below the fifth transistor T5. For example, the voltage received by the shielding part below the driving transistor may be 4.6V.

Figures 28, 29:
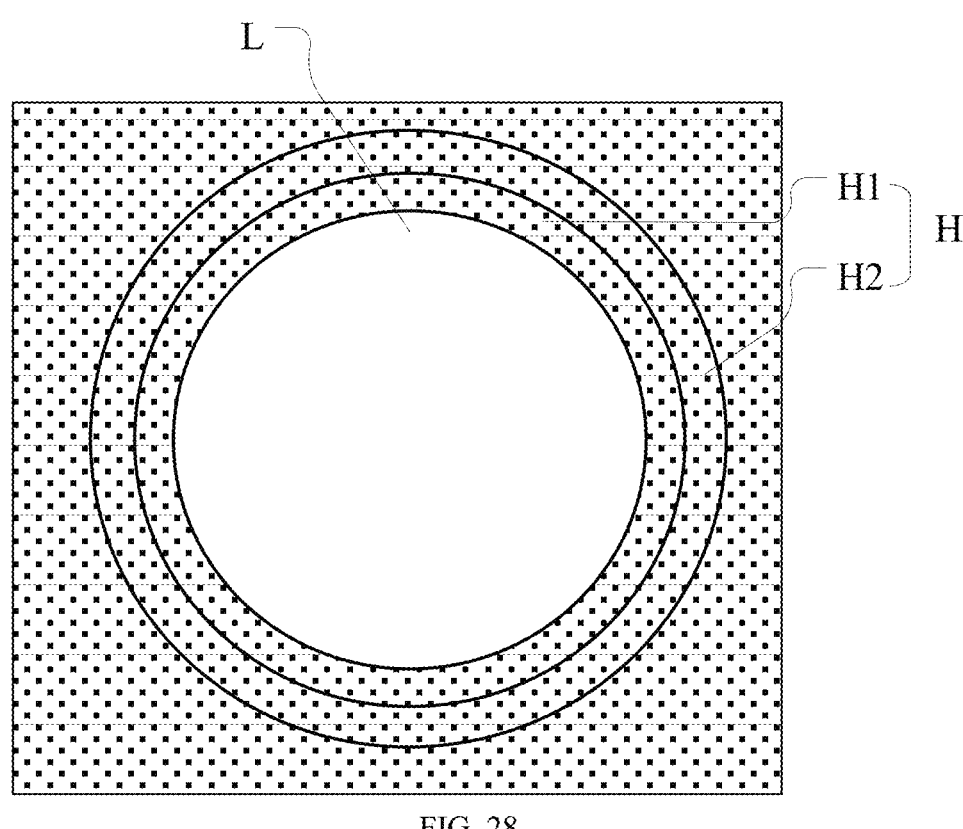
FIG. 28 is a schematic structural diagram of a display panel according to another exemplary embodiment of the present disclosure.
FIG. 29 is a schematic diagram of a circuit structure of a pixel driving circuit in a display panel according to another exemplary embodiment of the present disclosure.

In addition, the magnitude of the power supply voltage received by the shielding part may be affected by the location of the transistor. There are differences in the density of transistors in different regions of the display panel, and the threshold values of transistors close to low density transistor regions tend to shift. FIG. 28 shows a schematic structural diagram of a display panel according to another exemplary embodiment of the present disclosure. The display panel may include a high density integration region H and a low density integration region L, in which the density of transistors in the high density integration region H is greater than the density of transistors in the low density integration region L. The high density integration region includes a first high density integration region H1 and a second high density integration region H2. The second high density integration region H2 is located on a side of the first high density integration region H1 away from the low density integration region L. In the shielding part corresponding to the same transistor in the pixel driving circuit, the absolute value of the voltage to be received by the shielding part located in the first high density integration region H1 is greater than the absolute value of the voltage to be received by the shielding part located in the second high density integration region H2. For example, in the shielding part corresponding to the driving transistor in the pixel driving circuit, the positive power supply voltage to be received by the shielding part corresponding to the driving transistor in the first high density integration region H1 is greater than the positive power supply voltage to be received by the shielding part corresponding to the driving transistor in the second high density integration region H2. For another example, when the first transistor in FIG. 1 is an N-type transistor, in the shielding part corresponding to the first transistor in the pixel driving circuit, the negative power supply voltage to be received by the shielding part corresponding to the first transistor in the first high density integration region H1 is lower than the positive power supply voltage to be received by the shielding part corresponding to the first transistor in the second high density integration region H2.

In some embodiments, the low density integration region L may be a frame region of the display panel, an under-screen camera integration region, a light transmitting region in the display region, and the like. The density of transistors in the low density integration region L may be zero.

In some embodiments, the pixel driving circuit in the display panel may also have other structures. FIG. 29 shows is a schematic diagram of a circuit structure of a pixel driving circuit in a display panel according to another exemplary embodiment of the present disclosure. The pixel driving circuit may include: a driving transistor T3, a first transistor T1, a second transistor T2, a fourth transistor T4, a fifth transistor T5, a sixth transistor T6, a seventh transistor T7, and a capacitor C. The difference from the pixel driving circuit shown in FIG. 1 is that the first transistor and the second transistor in the pixel driving circuit shown in FIG. 29 are N-type transistors.

Figure 30:
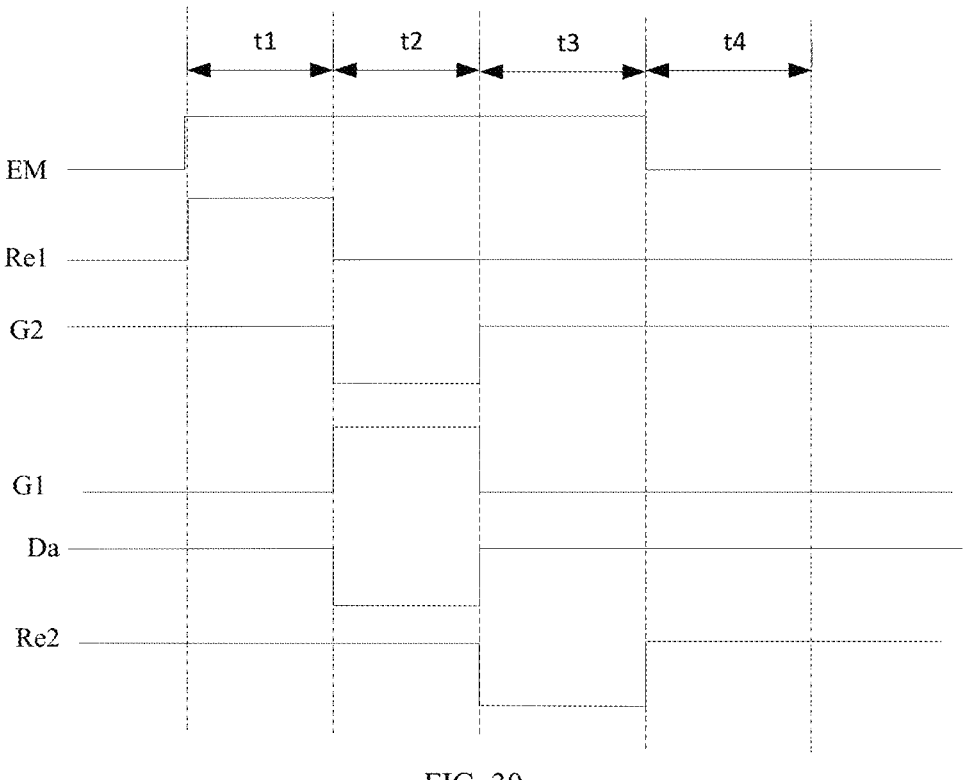
FIG. 30 is a timing diagram of each node in a driving method of the pixel driving circuit in FIG. 29.

As shown in FIG. 30, it is a timing diagram of each node in a driving method for the pixel driving circuit in FIG. 29. Among them, G1 represents the timing of the first gate driving signal end G1, G2 represents the timing of the second gate driving signal end G2, Re1 represents the timing of the first reset signal end Re1, Re2 represents the timing of the second reset signal end Re2, EM represents the timing of the enabling signal end EM, and Da represents the timing of the data signal end Da. The driving method for the pixel driving circuit may include a first reset phase t1, a compensation phase t2, a second reset phase t3, and a light emitting phase t4. In the first reset phase t1, the first reset signal end Re1 outputs a high-level signal, the first transistor T1 is turned on, and the first initial signal end Vinit1 inputs an initial signal to the node N. In the compensation stage t2, the first gate driving signal end G1 outputs a high-level signal, the second gate driving signal end G2 outputs a low-level signal, the fourth transistor T4 and the second transistor T2 are turned on, and the data signal end Da outputs a driving signal to write the voltage Vdata+Vth (that is, the sum of the voltage Vdata and Vth) to the node N, where Vdata is the voltage of the data signal, and Vth is the threshold voltage of the driving transistor T3. In the second reset stage t3, the second reset signal end Re2 outputs a low level signal, the seventh transistor T7 is turned on, and the second initial signal end Vinit2 inputs an initial signal to the second electrode of the sixth transistor T6. In the light emitting stage t4, the enabling signal end EM outputs a low-level signal, the sixth transistor T6 and the fifth transistor T5 are turned on, and the driving transistor T3 drives the light emitting unit to emit light under the action of the voltage Vdata+Vth stored in the capacitor C.

The driving transistor output current formula is as follows:

$$I = (\mu\ WCox/2L)(Vgs - Vth). \qquad 2$$

Among them, I is the output current of the driving transistor; $\mu$ is the carrier mobility; Cox is the gate capacitance per unit area, W is the width of the driving transistor channel, L is the length of the driving transistor channel, and Vgs is the gate-source voltage difference of the driving transistor, and Vth is the threshold voltage of the driving transistor.

According to the above driving transistor output current formula, the gate voltage Vdata+Vth and the source voltage Vdd of the driving transistor in the pixel driving circuit of the present disclosure are brought into the above formula to obtain the output current of the driving transistor in the pixel driving circuit of the present disclosure, I=(μWCox/2L)(Vdata+Vth−Vdd−Vth)2. The pixel driving circuit can avoid the influence of the threshold value of the driving transistor on its output current.

Figure 33:
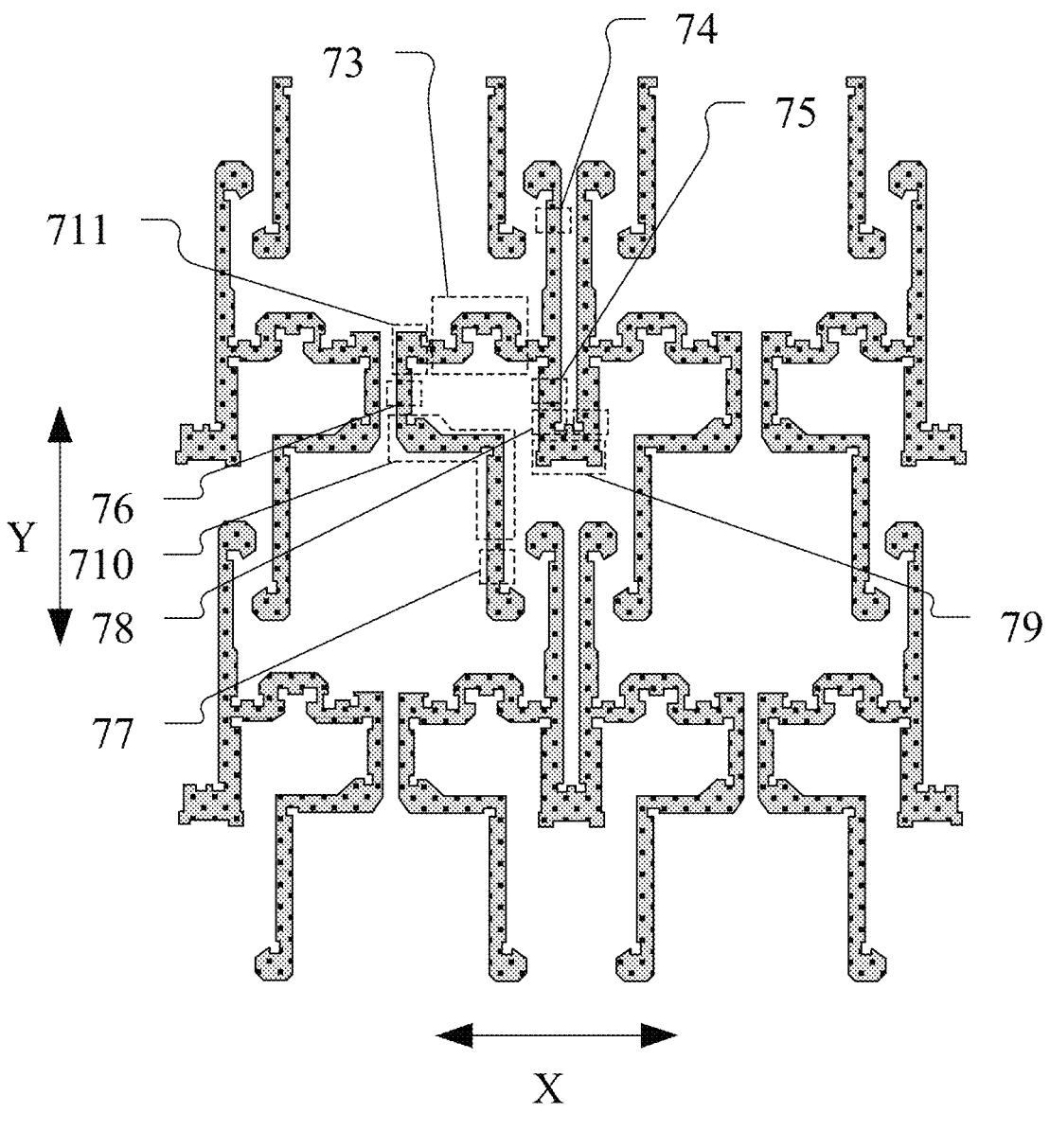
FIG. 33 is a structural layout of the first active layer in FIG. 31.
Figure 34:
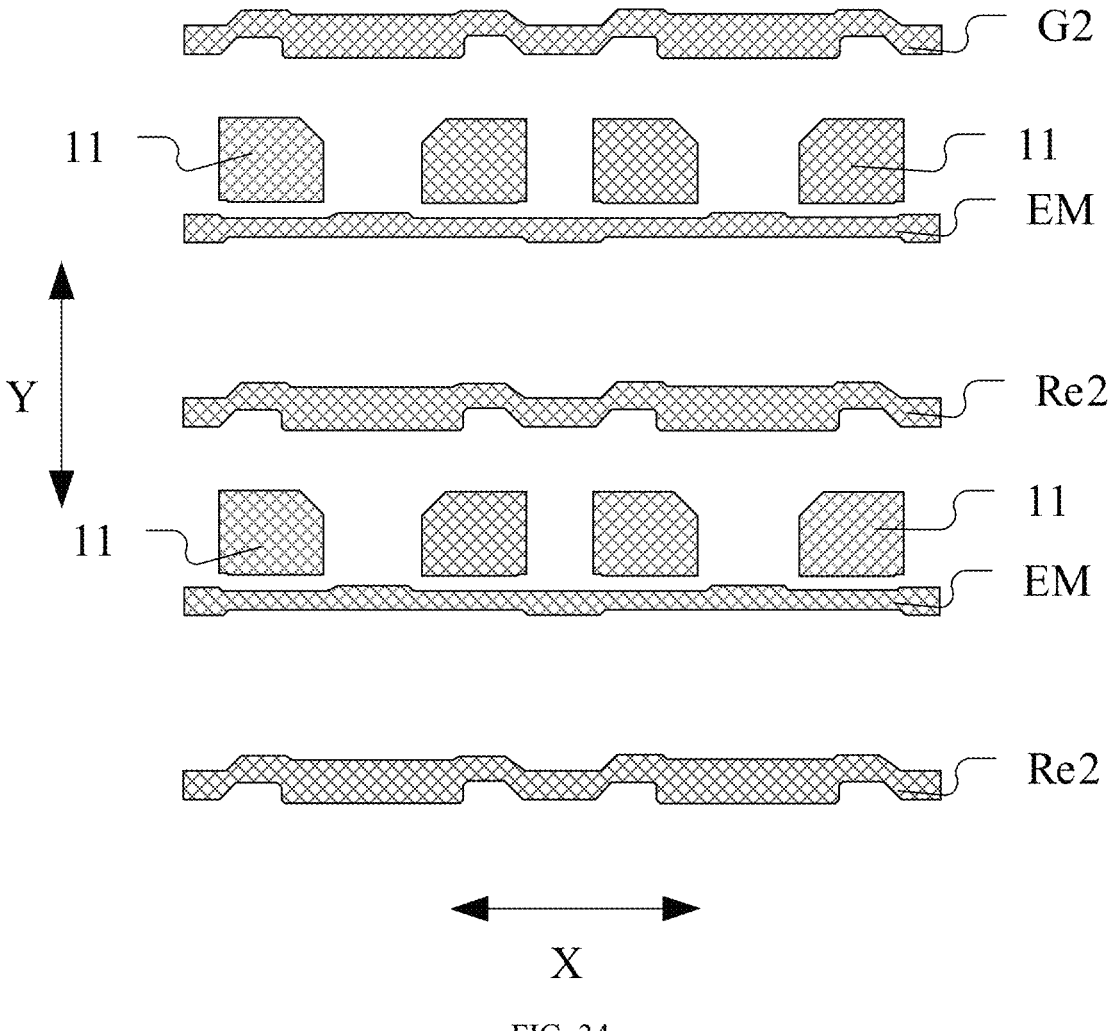
FIG. 34 is a structural layout of the first conductive layer in FIG. 31.
Figure 35:
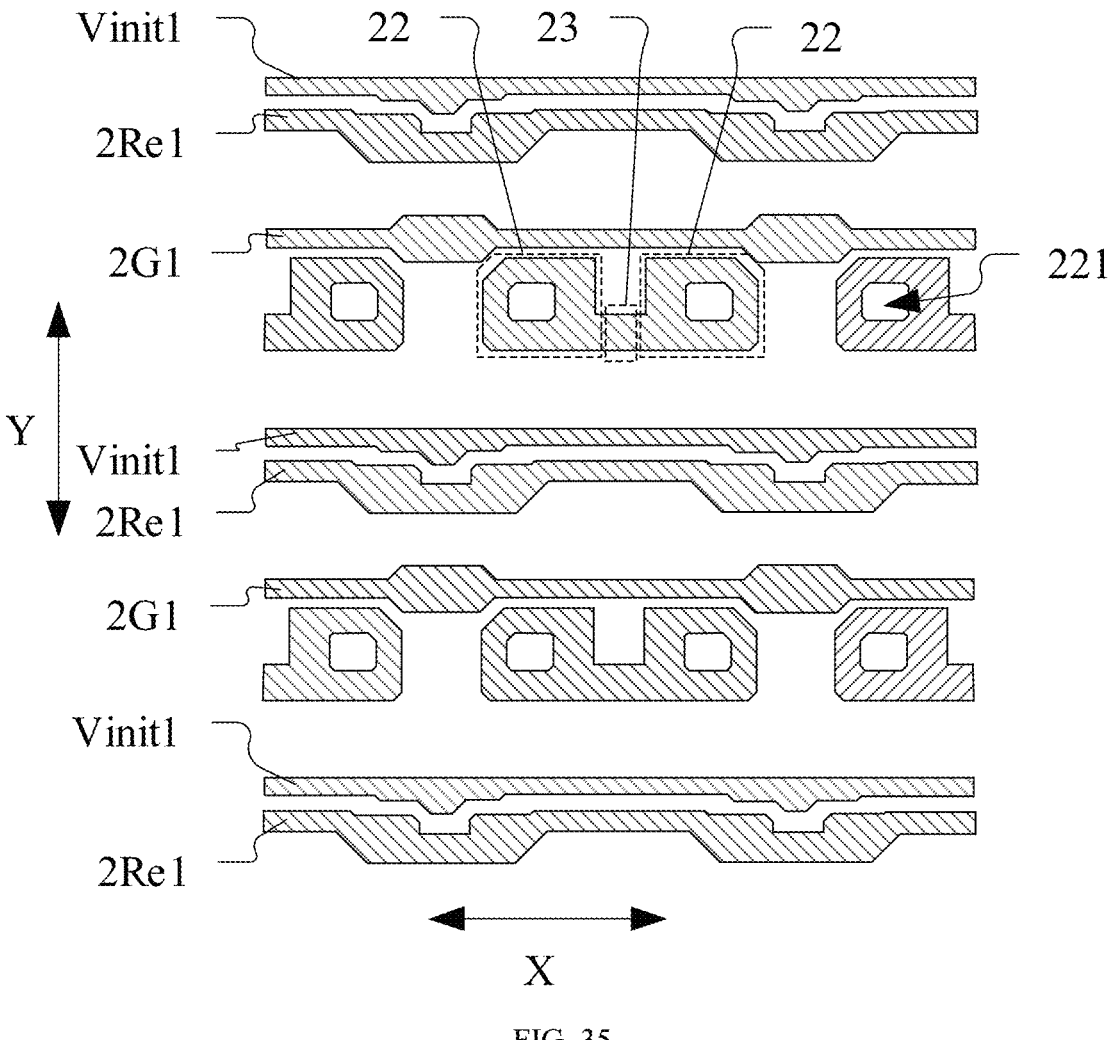
FIG. 35 is a structural layout of the second conductive layer in FIG. 31.
Figure 36:
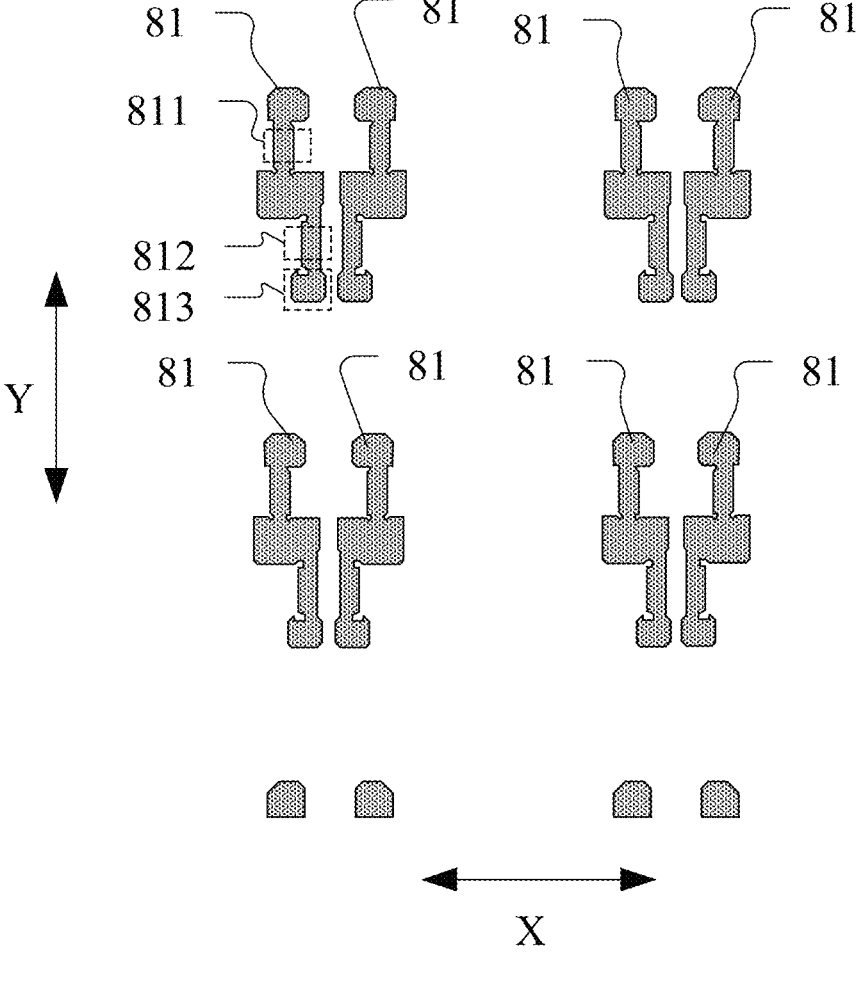
FIG. 36 is a structural layout of the second active layer in FIG. 31.
Figure 37:
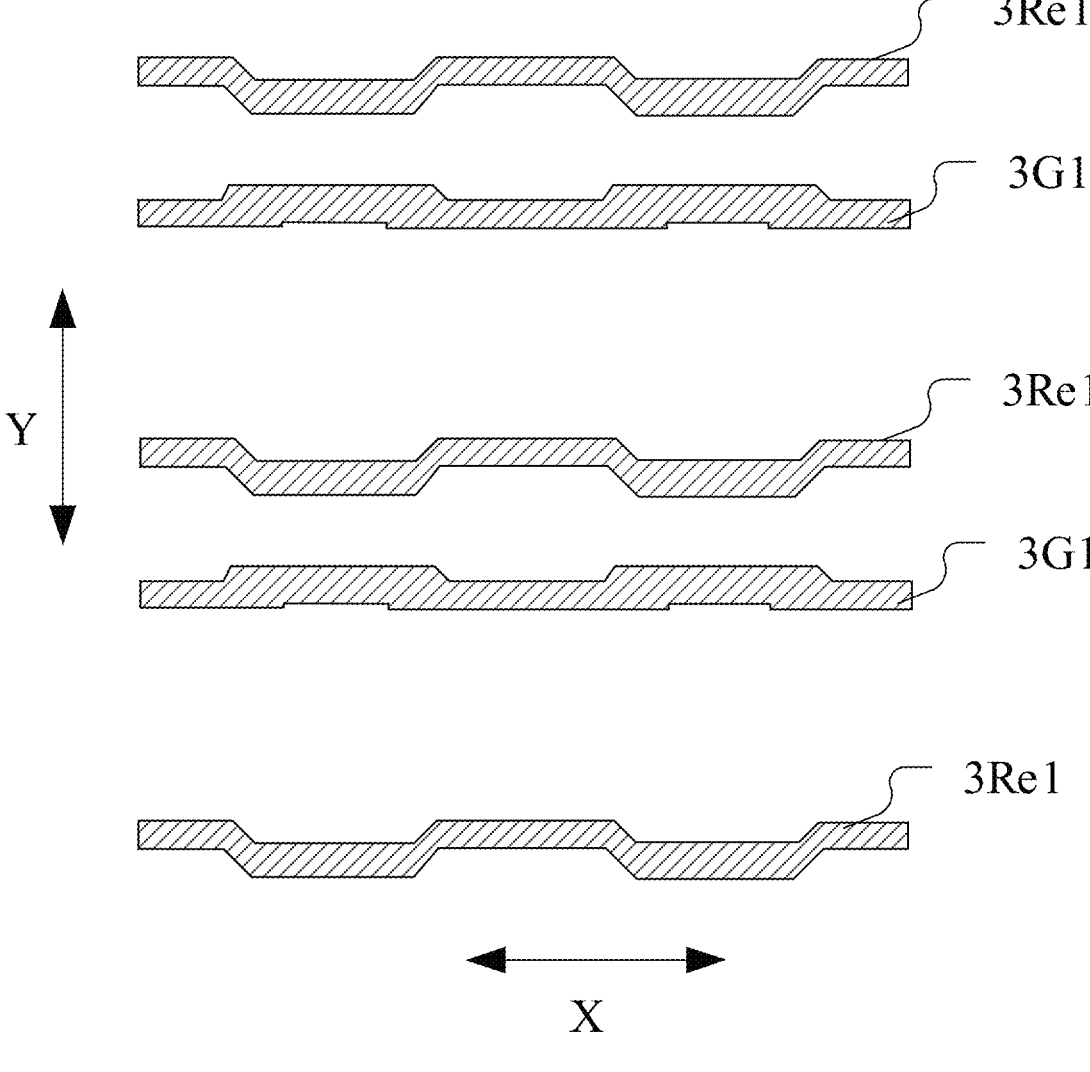
FIG. 37 is a structural layout of the third conductive layer in FIG. 31.
Figure 38:
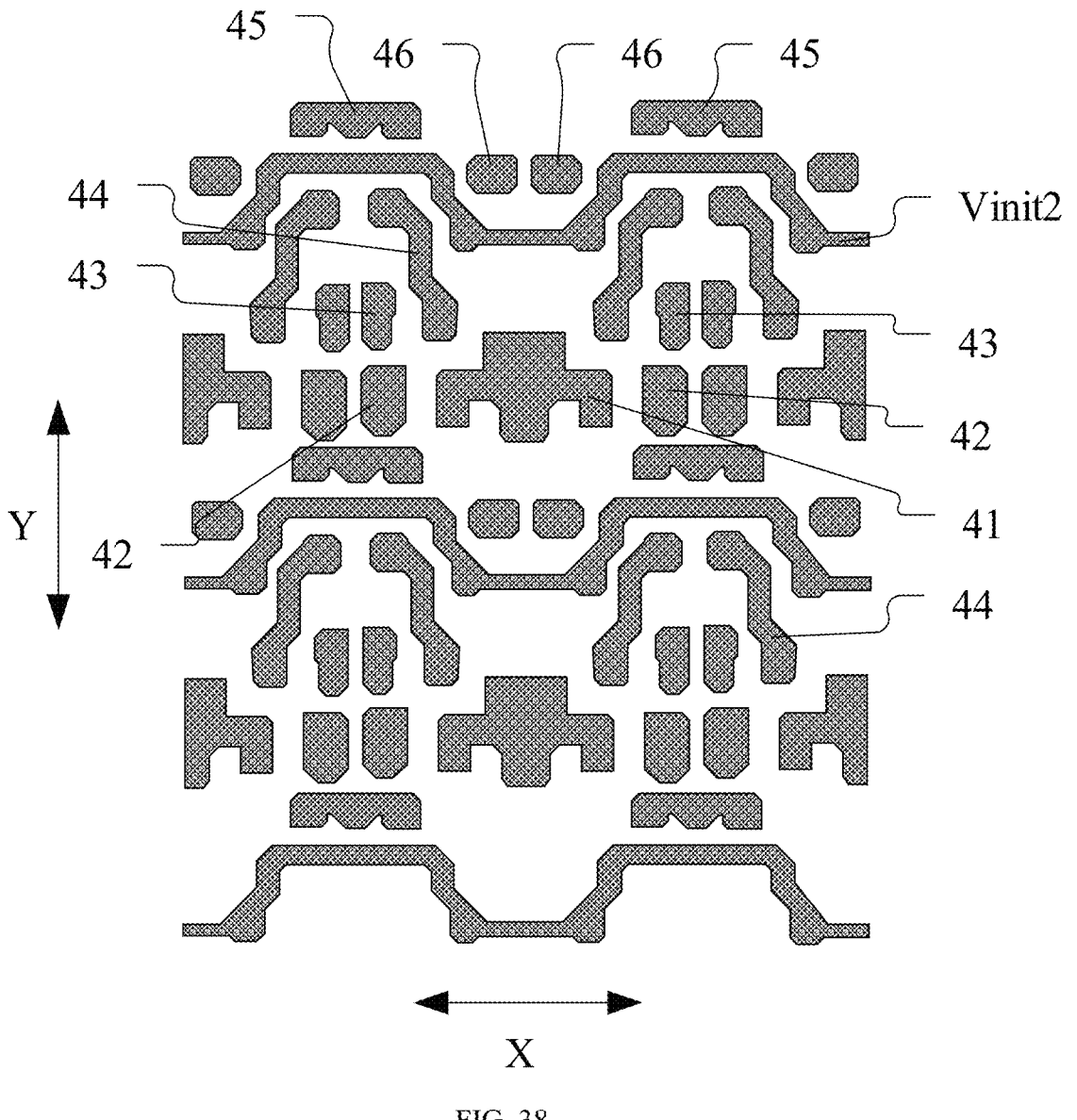
FIG. 38 is a structural layout of the fourth conductive layer in FIG. 31.
Figure 39:
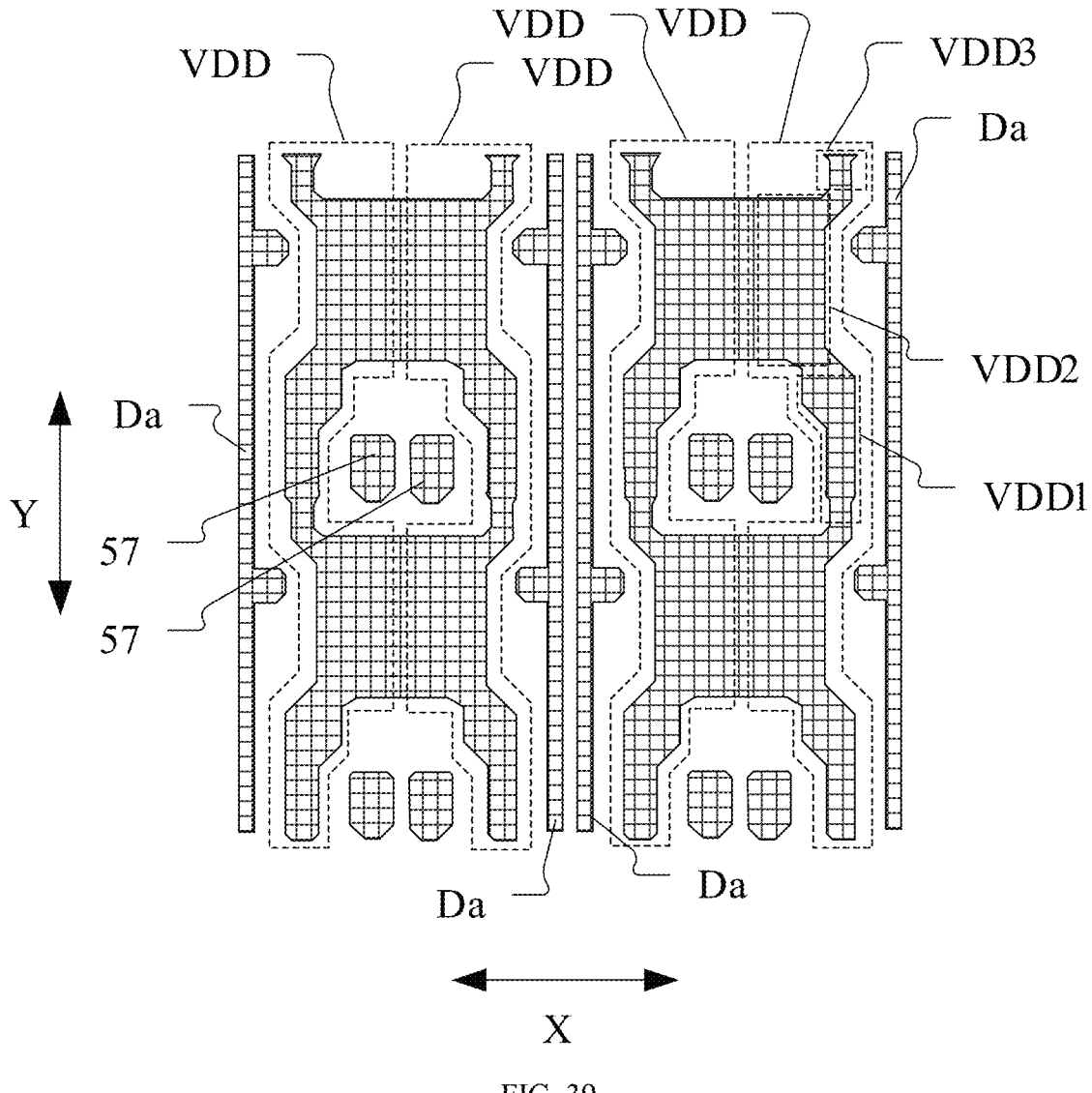
FIG. 39 is a structural layout of the fifth conductive layer in 27.
Figure 40:
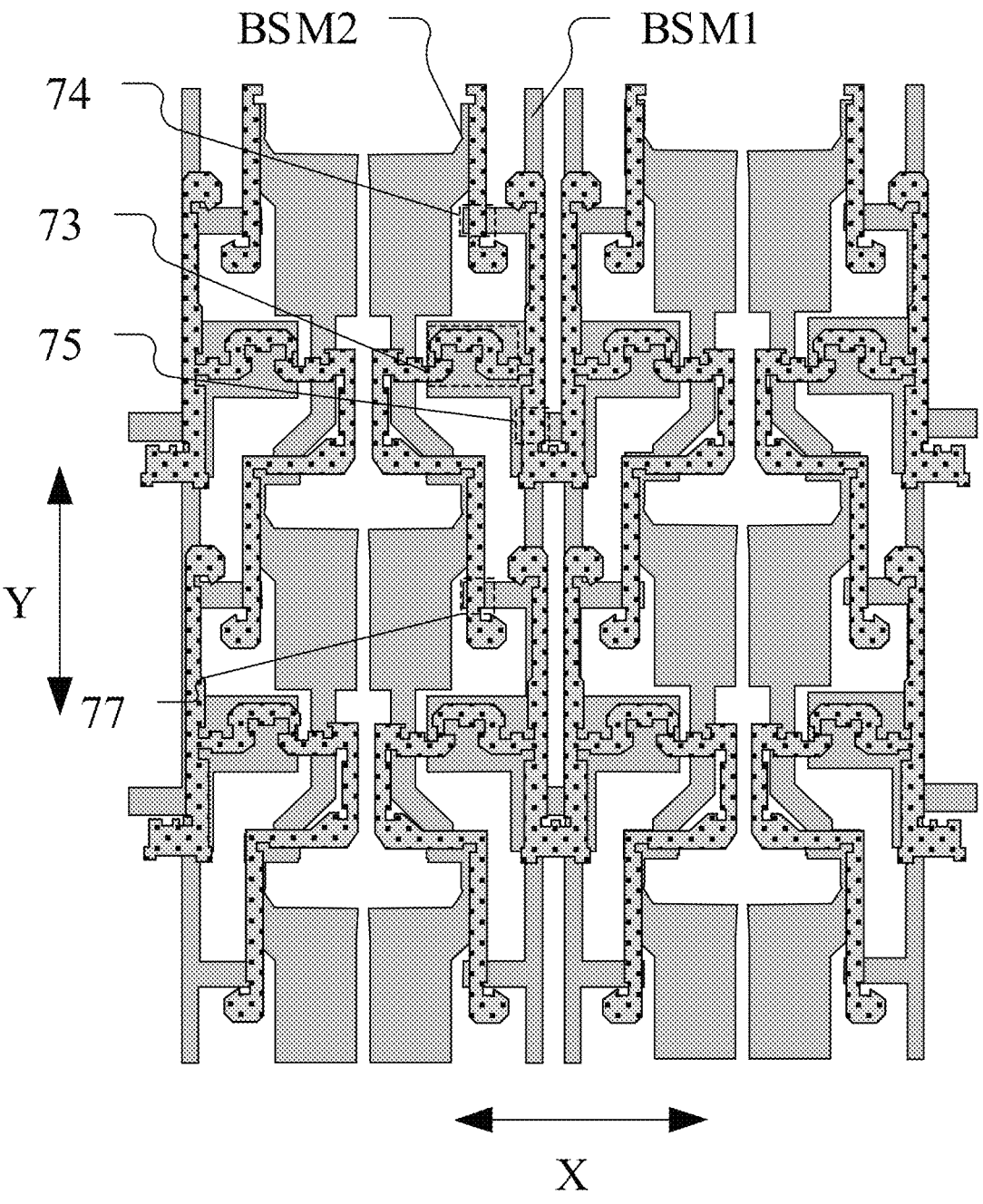
FIG. 40 is a structural layout of the shielding layer and the first active layer in FIG. 31.
Figure 41:
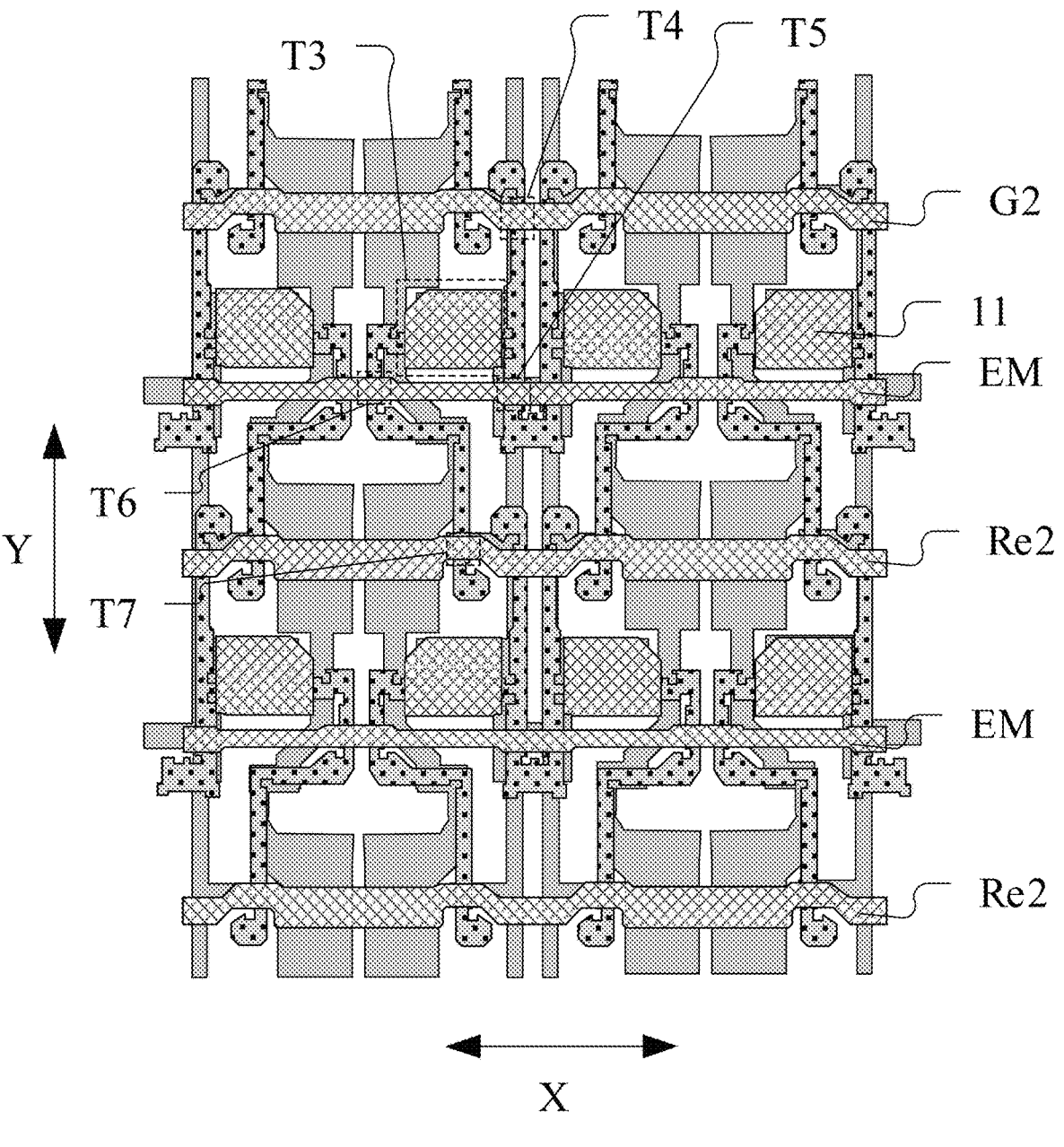
FIG. 41 is a structural layout of the shielding layer, the first active layer, and the first conductive layer in FIG. 31.
Figure 42:
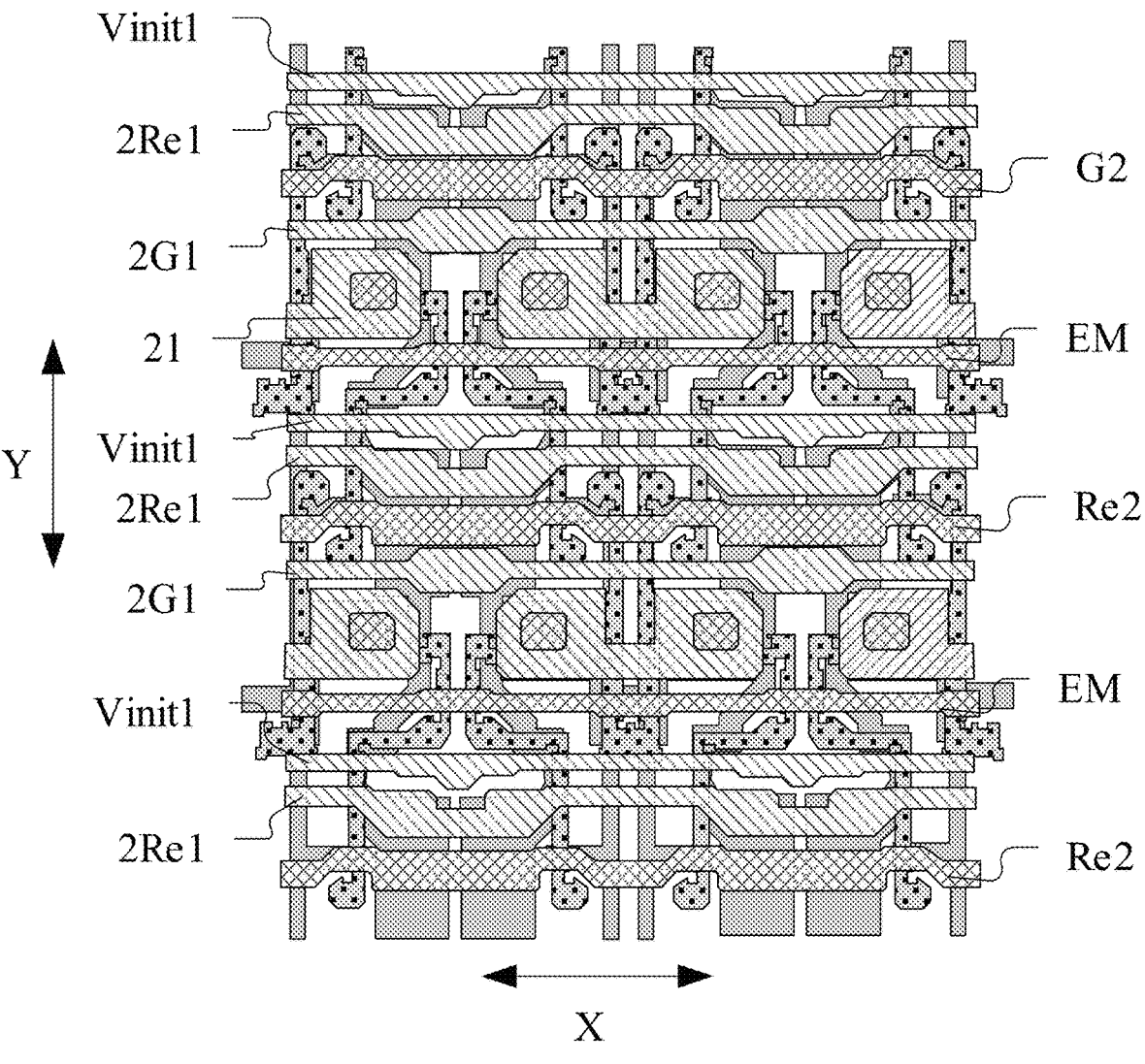
FIG. 42 is a structural layout of the shielding layer, the first active layer, the first conductive layer, and the second conductive layer in FIG. 31.
Figure 43:
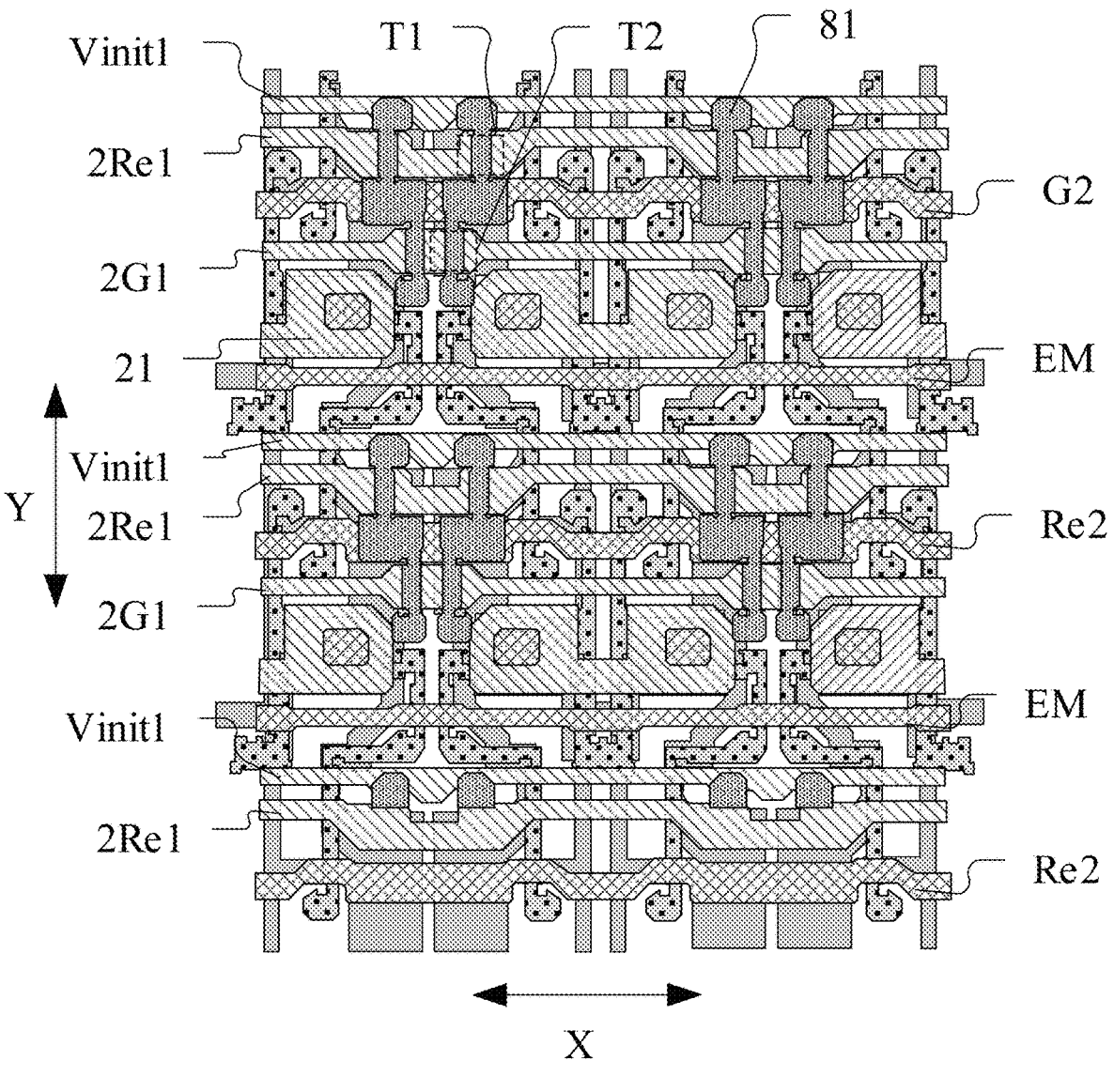
FIG. 43 is a structural layout of the shielding layer, the first active layer, the first conductive layer, the second conductive layer, and the second active layer in FIG. 31.
Figure 44:
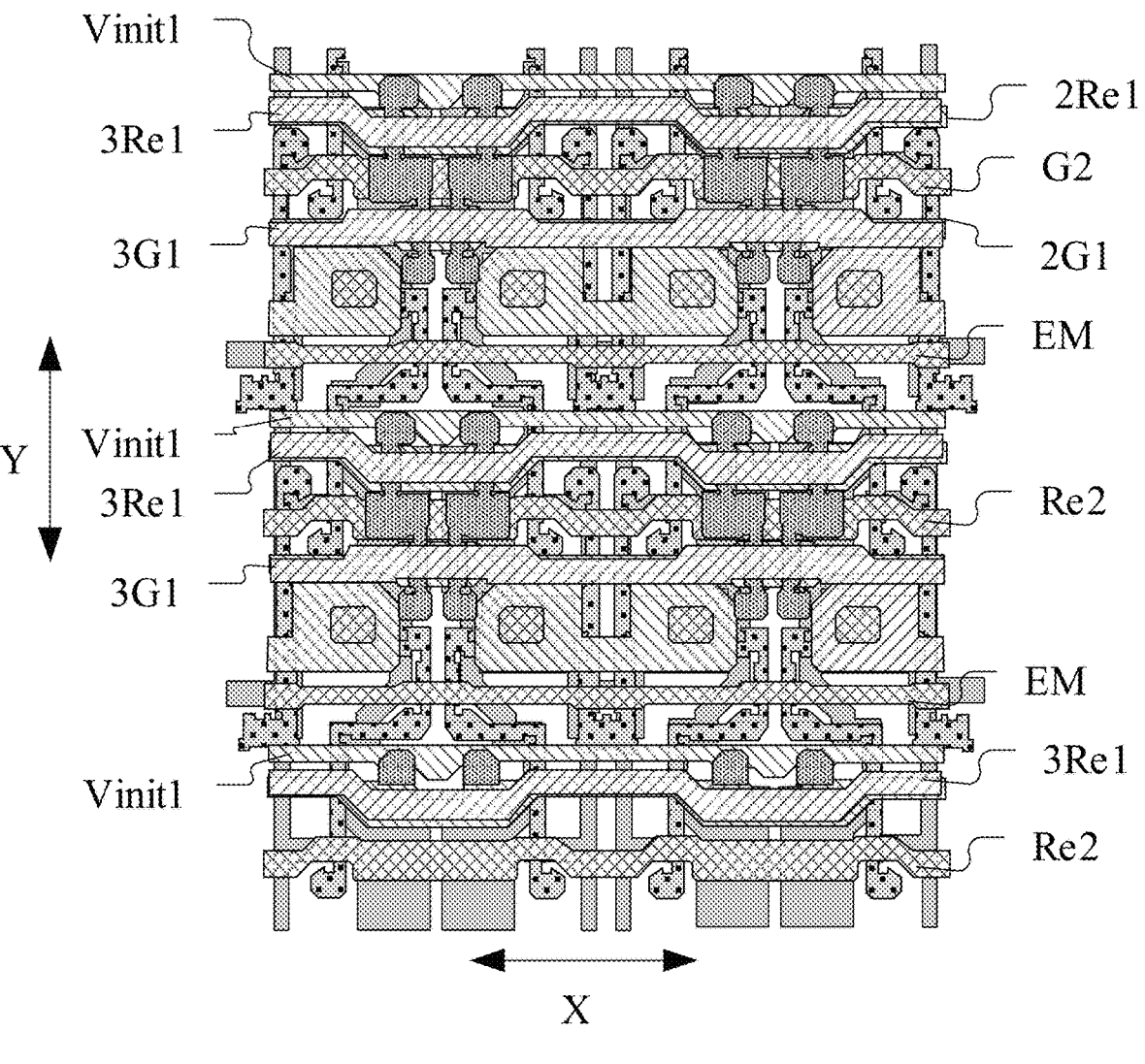
FIG. 44 is a structural layout of the shielding layer, the first active layer, the first conductive layer, the second conductive layer, the second active layer, and the third conductive layer in FIG. 31.
Figure 45:
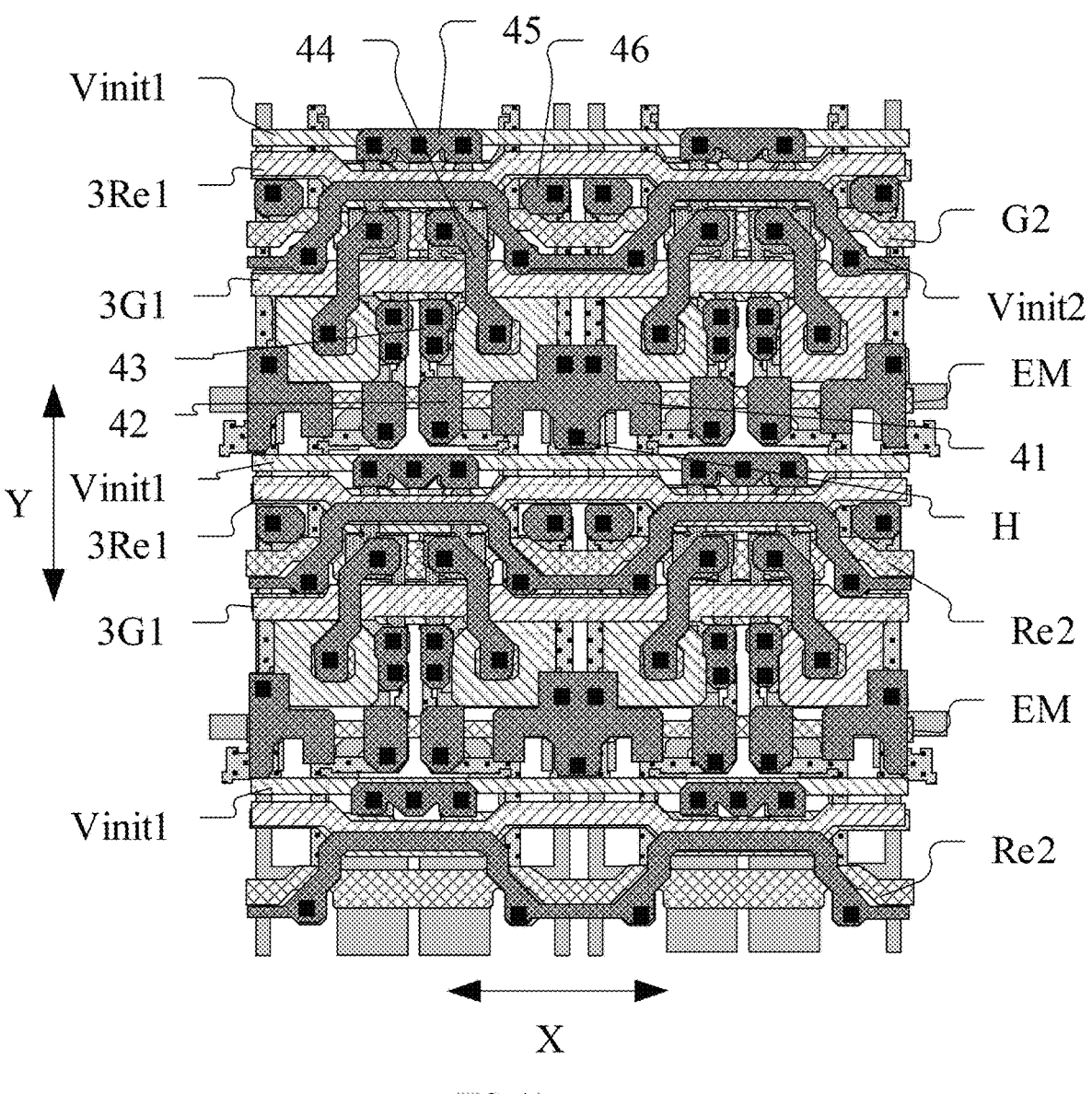
FIG. 45 is a structural layout of the shielding layer, the first active layer, the first conductive layer, the second conductive layer, the second active layer, the third conductive layer, and the fourth conductive layer in FIG. 31.
Figure 46:
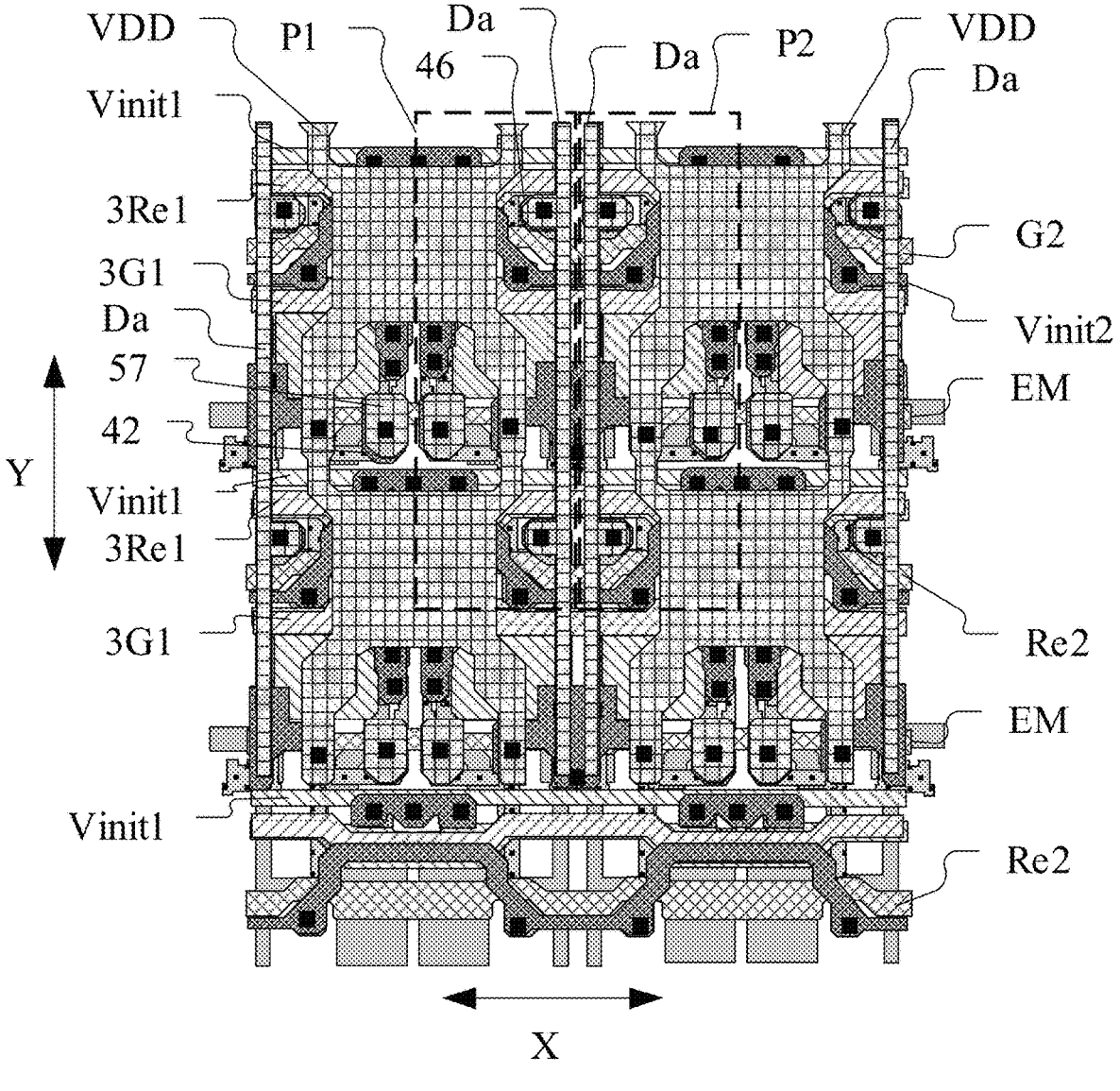
FIG. 46 is a structural layout of the shielding layer, the first active layer, the first conductive layer, the second conductive layer, the second active layer, the third conductive layer, the fourth conductive layer, and the fifth conductive layer in FIG. 31.

There is further provided another display panel according to exemplary embodiments, which may include a base substrate, a shielding layer, a first active layer, a first conductive layer, a second conductive layer, a second active layer, a third conductive layer, a fourth conductive layer, a fifth conductive layer, and an electrode layer, which are sequentially stacked. Among them, an insulation layer may be arranged between the above layers. As shown in FIG. 31 to FIG. 46, FIG. 31 is a structural layout of a display panel according to another exemplary embodiment of the present disclosure. FIG. 32 is a structural layout of the shielding layer in FIG. 31. FIG. 33 is a structural layout of the first active layer in FIG. 31. FIG. 34 is a structural layout of the first conductive layer in FIG. 31. FIG. 35 is a structural layout of the second conductive layer in FIG. 31. FIG. 36 is a structural layout of the second active layer in FIG. 31. FIG. 37 is a structural layout of the third conductive layer in FIG. 31. FIG. 38 is a structural layout of the fourth conductive layer in FIG. 31. FIG. 39 is a structural layout of the fifth conductive layer in FIG. 27. FIG. 40 is a structural layout of t the shielding layer and the first active layer in FIG. 31. FIG. 41 is a structural layout of the shielding layer, the first active layer, and the first conductive layer in FIG. 31. FIG. 42 is a structural layout of the shielding layer, the first active layer, the first conductive layer, and the second conductive layer in FIG. 31. FIG. 43 is a structural layout of the shielding layer, the first active layer, the first conductive layer, the second conductive layer, and the second active layer in FIG. 31. FIG. 44 is a structural layout of the shielding layer, the first active layer, the first conductive layer, the second conductive layer, the second active layer, and the third conductive layer in FIG. 31. FIG. 45 is a structural layout of the shielding layer, the first active layer, the first conductive layer, the second conductive layer, the second active layer, the third conductive layer, and the fourth conductive layer in FIG. 31. FIG. 46 is a structural layout of the shielding layer, the first active layer, the first conductive layer, the second conductive layer, the second active layer, the third conductive layer, the fourth conductive layer, and the fifth conductive layer in FIG. 31. The display panel may include more than one pixel driving circuit shown in FIG. 29. As shown in FIG. 46, the more than one pixel driving circuit may include a first pixel driving circuit P1 and a second pixel driving circuit P2 adjacently distributed in the row direction X, and the first pixel driving circuit P1 and the second pixel driving circuit P2 may be provided in mirror symmetry. Among them, the first pixel driving circuit P1 and the second pixel driving circuit P2 may form a repeating unit, and the display panel may include more than one repeating unit arranged in an array in the row direction X and the column direction Y.

Figure 31:
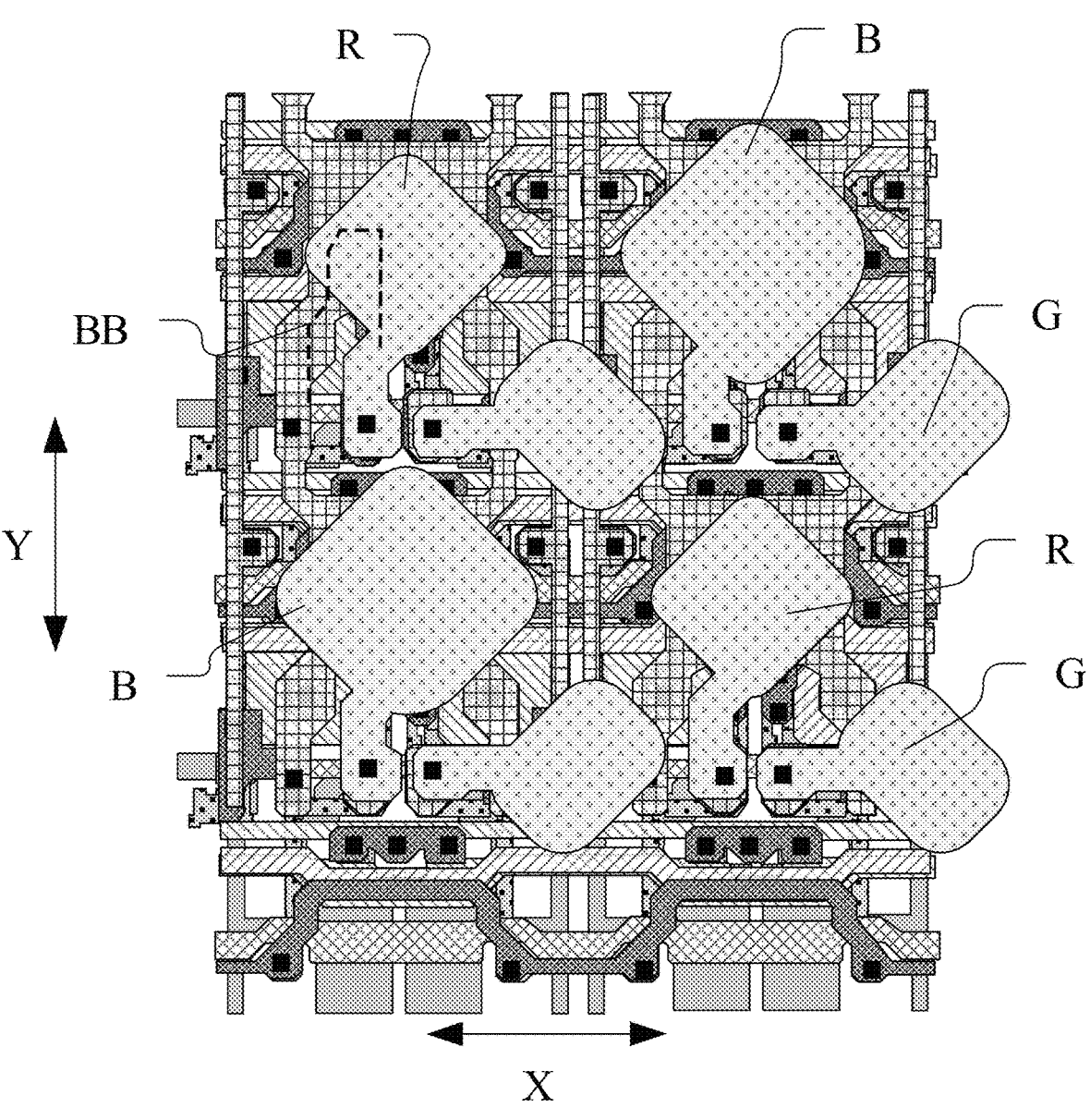
FIG. 31 is a structural layout of a display panel according to another exemplary embodiment of the present disclosure.
Figure 32:
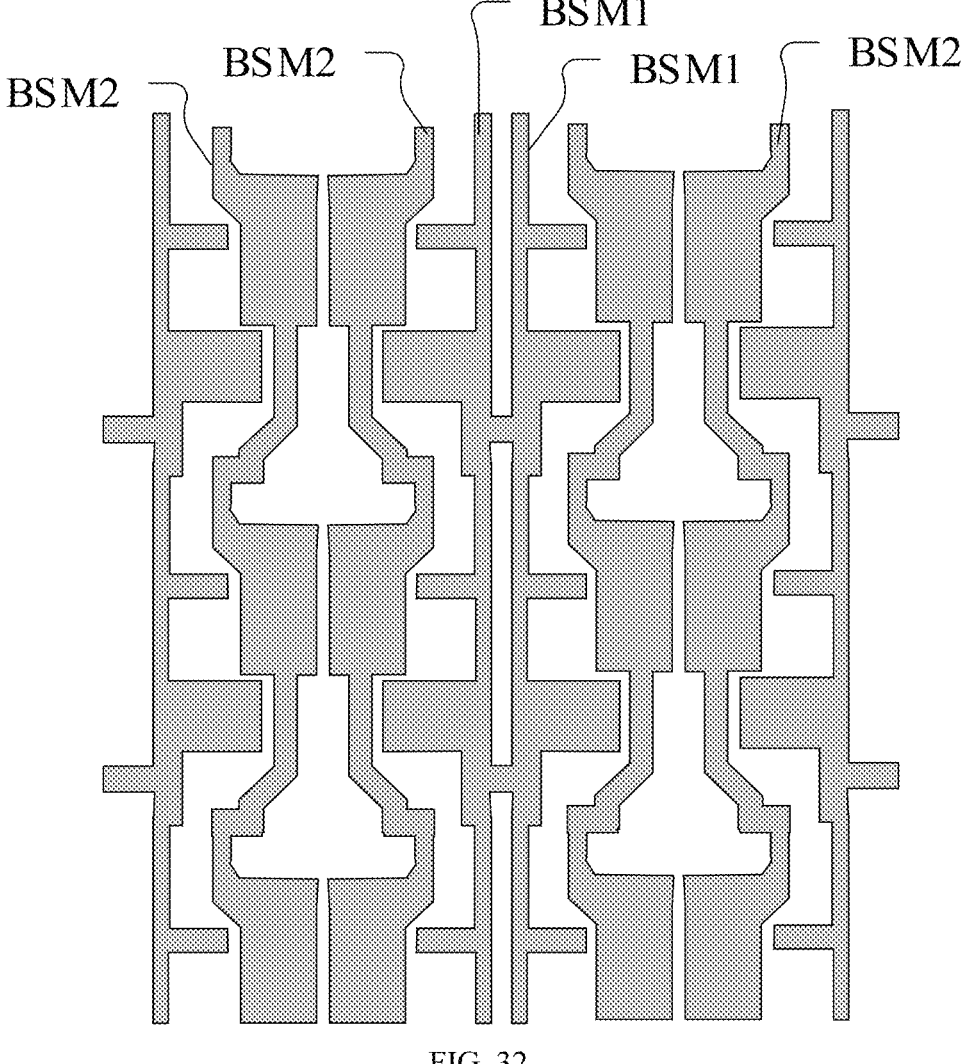
FIG. 32 is a structural layout of the shielding layer in FIG. 31.

As shown in FIG. 31, FIG. 32 and FIG. 40, the shielding layer may include a positive voltage shielding part BSM1 and a negative voltage shielding part BSM2. The positive voltage shielding part BSM1 is used to receive a positive power supply voltage, and the negative voltage shielding part BSM2 is used to receive a negative power supply voltage. The orthographic projection of the positive voltage shielding part BSM1 on the base substrate and the orthographic projection of the negative voltage shielding part BSM2 on the base substrate can both extend along the column direction Y. Among them, the adjacent negative voltage shielding parts BSM2 in the row direction X can be connected to each other, or can be arranged independently of each other. The adjacent positive voltage shielding parts BSM1 in the row direction X may be connected to each other, or may be arranged independently of each other. The shielding layer may be a conductive structure, for example, the shielding layer may be a molybdenum layer.

As shown in FIG. 31, FIG. 33, FIG. 40, and FIG. 41, the first active layer may include a third active part 73, a fourth active part 74, a fifth active part 75, a sixth active part 76, a seventh active part 77, the eighth active part 78, the ninth active part 79, the tenth active part 710, and the eleventh active part 711. Among them, the third active part 73 can be used to form the channel region of the driving transistor T3; the fourth active part 74 can be used to form the channel region of the fourth transistor T4; the fifth active part 75 can be used to form the channel region of the fifth transistor T5; the sixth active part 76 can be used to form the channel region of the sixth transistor T6; the seventh active part 77 can be used to form the channel region of the seventh transistor T7; the eighth active part is connected to the side of the fifth active part 75 away from the third active part 73, and the ninth active part 79 is connected between the eighth active part 78 in the first pixel driving circuit P1 and the eighth active part 78 in the second pixel driving circuit P2. The tenth active part 710 is connected between the sixth active part 76 and the seventh active part 77, and the eleventh active part 711 is connected between the sixth active part 76 and the third active part 73. Among them, the eighth active part 78 can be used to form the first electrode of the fifth transistor. In some embodiments, the eighth active parts in two adjacent pixel driving circuits are connected through the ninth active part 79, so that the voltage difference of the first power supply ends in the adjacent pixel driving circuits can be reduced. As shown in FIG. 40, the orthographic projection of the positive voltage shielding part BSM1 on the base substrate can at least partially overlap with the orthographic projection of the third active part 73 on the base substrate, the orthographic projection of the fourth active part 74 on the base substrate, the orthographic projection of the fifth active part 75 on the base substrate, and the orthographic projection of the seventh active part 77 on the base substrate. For example, the orthographic projection of the positive voltage shielding part BSM1 on the base substrate can cover the orthographic projection of the third active part 73 on the base substrate, the orthographic projection of the fourth active part 74 on the base substrate, the orthographic projection of the fifth active part 75 on the base substrate, and the orthographic projection of the seventh active part 77 on the base substrate. The first active layer may be formed of polysilicon material. Correspondingly, the driving transistor T3, the fourth transistor T4, the fifth transistor T5, the sixth transistor T6 and the seventh transistor T7 may be P-type low temperature polysilicon thin film transistors.

As shown in FIG. 31, FIG. 34, and FIG. 41, the first conductive layer may include: a first conductive part 11, a second gate line G2, an enabling signal line EM, and a second reset signal line Re2. The second gate line G2 can be used to provide the second gate driving signal end in FIG. 29; the enabling signal line EM can be used to provide the enabling signal end in FIG. 29; the second reset signal line Re2 can be used to provide the signal end in FIG. 29. The orthographic projection of the second gate line G2 on the base substrate, the orthographic projection of the enabling signal line EM on the base substrate, and the orthographic projection of the second reset signal line Re2 on the base substrate can all extend along the row direction X. The orthographic projection of the second gate line G2 on the base substrate covers the orthographic projection of the fourth active part 74 on the base substrate, and part of the structure of the second gate line G2 is used to form the gate of the fourth transistor. The orthographic projection of the enabling signal line EM on the base substrate covers the orthographic projection of the fifth active part 75 on the base substrate and the orthographic projection of the sixth active part 76 on the base substrate, and part of the structure of the enabling signal line EM can be used to form the gates of the fifth transistor T5 and the sixth transistor T6 respectively. The orthographic projection of the second reset signal line Re2 on the base substrate can cover the orthographic projection of the seventh active part 77 on the base substrate, and part of the structure of the second reset signal line Re2 can be used to form the gate of the seventh transistor T7. The orthographic projection of the first conductive part 11 on the base substrate covers the orthographic projection of the third active part 73 on the base substrate, and the first conductive part 11 can be used to form the gate of the driving transistor T3 and the first electrode of the capacitor. As shown in FIG. 41, the second gate line G2 in the current row of pixel driving circuits can be multiplexed as the second reset signal line Re2 in the previous row of pixel driving circuits. This arrangement can increase the integration degree of the pixel driving circuit and reduce the layout area of the pixel driving circuit. In addition, the display panel can use the first conductive layer as a mask to perform a conductorization treatment on the first active layer, that is, the region covered by the first conductive layer in the first active layer can form the channel region of the transistor, and the region not covered by the first conductive layer in the first active layer forms a conductor structure.

As shown in FIG. 31, FIG. 35, and FIG. 42, the second conductive layer may include: a first initial signal line Vinit1, a third reset signal line 2Re1, a third gate line 2G1, and more than one second conductive part 22. Among them, the first initial signal line Vinit1 is used to provide the first initial signal end in FIG. 29, the third reset signal line 2Re1 can be used to provide the first reset signal end in FIG. 29, and the third gate line 2G1 can be used to provide the first gate driving signal end in FIG. 29. The orthographic projection of the first initial signal line Vinit1 on the base substrate, the orthographic projection of the third reset signal line 2Re1 on the base substrate, and the orthographic projection of the third gate line 2G1 on the base substrate can all extend along the row direction X. As shown in FIG. 35, the second conductive layer may further include more than one third connection part 23, and in a same repeating unit, the third connection part 23 is connected between two adjacent second conductive parts 22 in the row direction. In addition, in other exemplary embodiments, in adjacent repeating units in the row direction, adjacent second conductive parts 22 may also be connected to each other.

As shown in FIG. 31, FIG. 36, and FIG. 43, the second active layer may include an active part 81, and the active part 81 may include a first active part 811, a second active part 812 and a twelfth active part 813 connected to each other. The first active part 811 can be used to form the channel region of the first transistor. The second active part 812 can be used to form the channel region of the second transistor T2. The twelfth active part 813 is connected to an end of the second active part 812 away from the first active part 811. Among them, the second active layer may be formed of InGaZnO, and correspondingly, the first transistor T1 and the second transistor T2 may be N-type metal oxide thin film transistors. The orthographic projection of the third gate line 2G1 on the base substrate may cover the orthographic projection of the second active part 812 on the base substrate, and part of the structure of the third gate line 2G1 may be used to form the bottom gate of the second transistor. The orthographic projection of the third reset signal line 2Re1 on the base substrate can cover the orthographic projection of the first active part 811 on the base substrate, and part of the structure of the third reset signal line 2Re1 can be used to form the bottom gate of the first transistor T1. The orthographic projection of the negative voltage shielding part BSM2 on the base substrate may overlap with the orthographic projection of the first active part 811 on the base substrate and the orthographic projection of the second active part 812 on the base substrate, for example, the orthographic projection of the negative voltage shielding part BSM2 on the base substrate may cover the orthographic projection of the first active part 811 on the base substrate and the orthographic projection of the second active part 812 on the base substrate.

As shown in FIG. 31, FIG. 37 and FIG. 44, the third conductive layer may include a first reset signal line 3Re1 and a first gate line 3G1. Both the orthographic projection of the first reset signal line 3Re1 on the base substrate and the orthographic projection of the first gate line 3G1 on the base substrate can extend along the row direction X. The first reset signal line 3Re1 can be used to provide the first reset signal end in FIG. 29, and the orthographic projection of the first reset signal line 3Re1 on the base substrate can cover the orthographic projection of the first active part 811 on the base substrate. Part of the structure of the first reset signal line 3Re1 can be used to form the top gate of the first transistor T1, and at the same time, the first reset signal line 3Re1 can be connected to the third reset signal line 2Re1 through a via hole located in the wiring region at the edge of the display panel. The first gate line 3G1 can be used to provide the first gate driving signal end in FIG. 29, and the orthographic projection of the first gate line 3G1 on the base substrate can cover the orthographic projection of the second active part 812 on the base substrate. Part of the structure of the first gate line 3G1 can be used to form the top gate of the second transistor T2, and at the same time, the first gate line 3G1 can be connected to the third gate line 2G1 through a via hole located in the wiring area at the edge of the display panel. As shown in FIG. 31 and FIG. 44, in the same pixel driving circuit, the orthographic projection of the first conductive part 11 on the base substrate can be located between the orthographic projection of the first gate line 3G1 on the base substrate and the orthographic projection of the enabling signal line EM on the base substrate; the orthographic projection of the first reset signal line 3Re1 on the base substrate may be located on a side of the orthographic projection of the first gate line 3G1 on the base substrate away from the s orthographic projection of the first conductive part 11 on the base substrate. The orthographic projection of the second gate line G2 on the base substrate may be located between the orthographic projection of the first gate line 3G1 on the base substrate and the orthographic projection of the first reset signal line 3Re1 on the base substrate. The orthographic projection of the second reset signal line Re2 on the base substrate may be located on a side of the orthographic projection of the enabling signal line EM on the base substrate away from the first conductive part 11 on the base substrate. In addition, the display panel can use the third conductive layer as a mask to perform a conductorization treatment on the second active layer, that is, the region covered by the third conductive layer in the second active layer can form the channel region of the transistor, and the region not covered by the third conductive layer in the second active layer forms a conductor structure.

As shown in FIG. 31, FIG. 38, and FIG. 45, the fourth conductive layer may include a first bridging part 41, a second bridging part 42, a third bridging part 43, a fourth bridging part 44, a fifth bridging part 45, a sixth bridging part 46 and a second initial signal line Vinit2. Among them, the first bridging part 41 can be connected to the third connection part 23 through two via holes H, and connected to the ninth active part 79 through the via holes, so as to connect the first electrode of the fifth transistor and the second electrode of the capacitor C. It should be noted that the black blocks in some embodiments indicate the positions of the via holes, and some of the via holes are marked in some embodiments. The first bridging part 41 may be mirror-symmetrical to the mirror-symmetric plane of the first pixel driving circuit P1 and the second pixel driving circuit P2. The second bridging part 42 may be connected to the tenth active part 710 through a via hole, so as to connect the second electrode of the sixth transistor T6 and the first electrode of the seventh transistor T7. The third bridging part 43 can be respectively connected to the eleventh active part 711 and the twelfth active part 813 through via holes, so as to connect the second electrode of the second transistor T2, the first electrode of the sixth transistor T6, and the second electrode of the driving transistor T3. The fourth bridging part 44 can be respectively connected to the second active layer between the first active part 811 and the second active part 812 and the first conductive part 11 through via holes, so as to connect the first electrode of the second transistor T2 and the gate of the driving transistor. As shown in FIG. 35, an opening 221 is formed on the second conductive part 22, and the orthographic projection of the via hole connected between the first conductive part 11 and the fourth bridging part 44 on the base substrate is located within the orthographic projection of the opening 221 on the base substrate, so that the conductive structure in the via hole and the second conductive part 22 are insulated from each other. The fifth bridging part 45 can be respectively connected to the second active layer on the side of the first active part 811 away from the second active part 812 and the first initial signal line Vinit1 through a via hole, so as to connect the second electrode of the first transistor and the first initial signal line Vinit1. Among them, in two adjacent repeating units in the row direction, two adjacent pixel driving circuits may share the same fifth bridging part 45. The sixth bridging part 46 may be connected to the first active layer on a side of the fourth active part 74 away from the third active part 73 through a via hole, so as to be connected to the first electrode of the fourth transistor. The second initial signal line Vinit2 can be used to provide the second initial signal end in FIG. 29. The second initial signal line Vinit2 can be connected to the first active layer on the side of the seventh active part 77 away from the sixth active part 76 through a via hole, so as to connect the second electrode of the seventh transistor and the second initial signal terminal.

As shown in FIG. 31, FIG. 39, and FIG. 46, the fifth conductive layer may include more than one power line VDD, more than one data line Da, and a seventh bridging part 57. Among them, the orthographic projection of the power line VDD on the base substrate and the orthographic projection of the data line Da on the base substrate can both extend along the column direction Y. The power line VDD can be used to provide the first power end in FIG. 29, and the data line Da can be used to provide the data signal end in FIG. 29. As shown in FIG. 31, each column of pixel driving circuits can be provided with a power line correspondingly, the power line VDD in the first pixel driving circuit P1 can be connected to the first bridging part 41 through a via hole, and the power line VDD in the second pixel driving circuit P2 can be connected to the same first bridging part 41 through a via hole, thus connecting the first electrode of the fifth transistor and the first power supply end. The data line Da can be connected to the sixth bridging part 46 through a via hole, so as to connect the first electrode of the fourth transistor and the data signal end. The seventh bridging part 57 can be connected to the second bridging part 42 through a via hole, so as to be connected to the first electrode of the seventh transistor. As shown in FIG. 39, the power line VDD may include a first extension part VDD1, a second extension part VDD2, and a third extension part VDD3. The second extension part VDD2 is connected between the first extension part VDD1 and the third extension part VDD3. The size of the orthographic projection of the second extension part VDD2 on the base substrate in the row direction X may be greater than the size of the orthographic projection of the first extension part VDD1 on the base substrate in the row direction X, and the size of the orthographic projection of the second extension part VDD2 on the base substrate in the row direction X may be greater than the size of the orthographic projection of the third extension part VDD3 on the base substrate in the row direction X. The orthographic projection of the second extension part VDD2 on the base substrate can cover the orthographic projection of the first active part 811 on the base substrate and the orthographic projection of the second active part 812 on the base substrate. The second extension part VDD2 can reduce the influence of light on the characteristics of the first transistor T1 and the second transistor. In two adjacent repeating units in the row direction, the second extension parts VDD2 in two adjacent pixel driving circuits can be connected to each other, so that the power line VDD and the second conductive part 22 can form a grid structure, and the power line of the grid structure can reduce the voltage drop of the power signal on it.

As shown in FIG. 31, the electrode layer may include more than one electrode part, and the more than one electrode part includes: more than one R electrode part R, more than one G electrode part G, and more than one B electrode part B.

Figure 47:
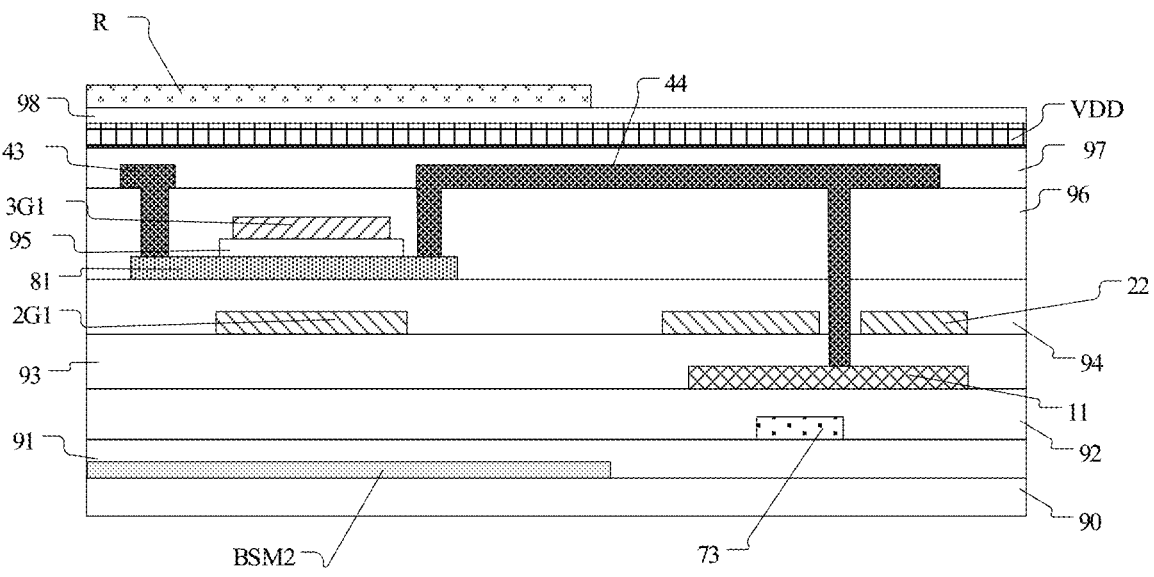
FIG. 47 is a partial cross-sectional view along the dotted line BB in FIG. 31.

As shown in FIG. 47, it is a partial cross-sectional view along the dotted line BB in FIG. 31. The display panel may include a first insulation layer 91, a second insulation layer 92, a third insulation layer 93, a fourth insulation layer 94, a fifth insulation layer 95, a first dielectric layer 96, a first flat layer 97, and a second Flat layer 98. Among them, the base substrate 90, the light shielding layer, the first insulation layer 91, the first active layer, the second insulation layer 92, the first conductive layer, the third insulation layer 93, the second conductive layer, the fourth insulation layer 94, the second active layer, the fifth insulation layer 95, the third conductive layer, the first dielectric layer 96, the fourth conductive layer, the first flat layer 97, the fifth conductive layer, the second flat layer 98, and the electrode layer are stacked and provided in sequence. The first insulation layer 91, the second insulation layer 92, the third insulation layer 93, the fourth insulation layer 94, and the fifth insulation layer 95 can be a single-layer structure or a multi-layer structure, and the material of the first insulation layer 91, the second insulation layer 92. The third insulation layer 93, the fourth insulation layer 94, and the fifth insulation layer 95 can be at least one of silicon nitride, silicon oxide, and silicon oxynitride. The first dielectric layer 96 can be silicon nitride layer. The material of the first flat layer 97 and the second flat layer 98 can be an organic material, such as polyimide (PI), polyethylene terephthalate (PET), polyethylene naphthalate (PEN), silicon-glass bonding structure (SOG) and other materials. The base substrate 90 may include a glass substrate, a barrier layer, and a polyimide layer stacked in sequence, and the barrier layer may be an inorganic material. The material of the first conductive layer, the second conductive layer, and the third conductive layer may be one or an alloy of molybdenum, aluminum, copper, titanium, niobium, or a molybdenum/titanium alloy or lamination. The material of the fourth conductive layer and the fifth conductive layer may include a metal material, for example, it may be one or an alloy of molybdenum, aluminum, copper, titanium, niobium, or a molybdenum/titanium alloy or lamination, etc., or it may be titanium/aluminum/titanium lamination.

Figure 48:
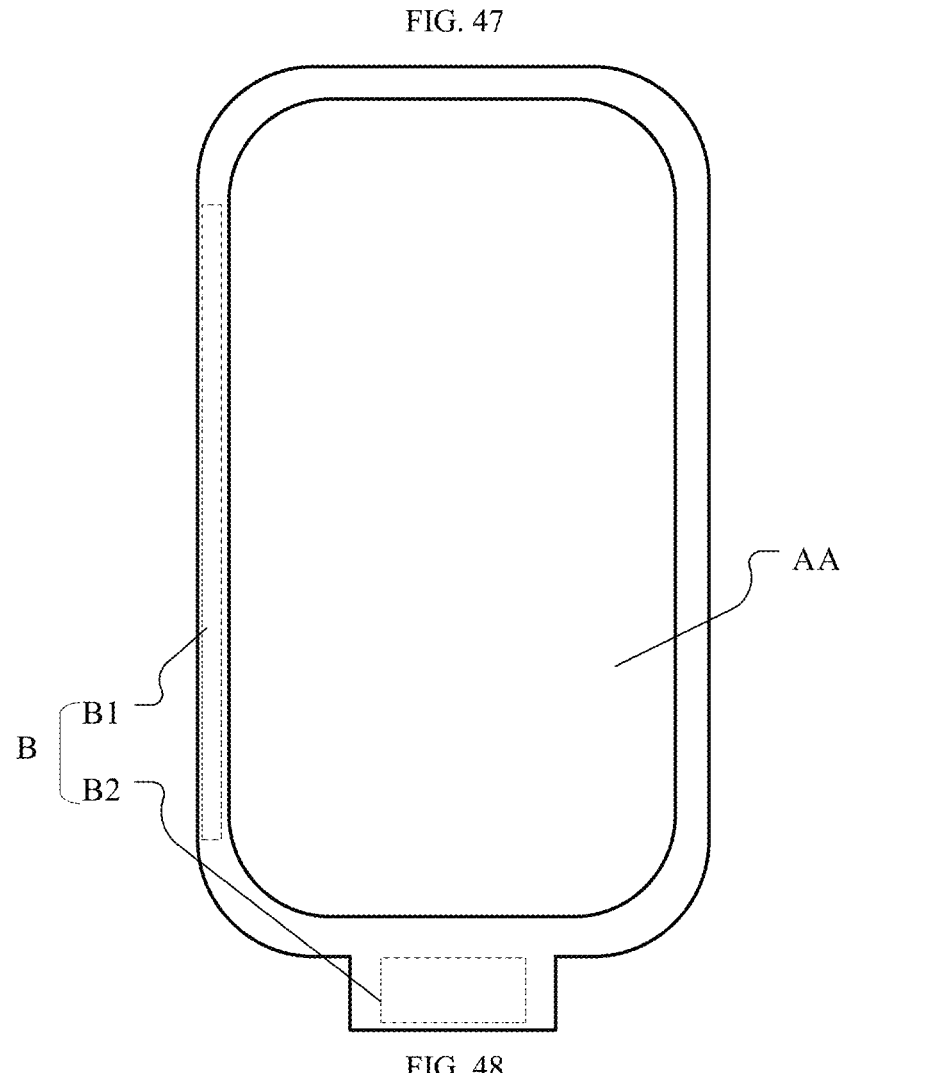
FIG. 48 is a schematic structural diagram of a display panel according to another exemplary of the present disclosure.

As shown in FIG. 48, it is a schematic structural diagram of a display panel according to another exemplary of the present disclosure. The display panel may include a display region AA and a frame region B around the display region. The frame region B may be provided with the above-mentioned shielding part. For example, the frame region B may include a first frame region B1 for integrating gate driving circuits, and a fan-out region B2 for fan-out data lines. The shielding part located in the first frame region B1 can form signal lines or device structures in the gate driving circuit, and the shielding part located in the fan-out region B2 can be used to form fan-out lines of data lines. In addition, the shielding part located in the frame region B can be used to form signal lines or device structures in the detection circuit. This arrangement can evenly distribute the shielding layer on the base substrate, so that problems such as uneven etching and poor control of process parameters will not be caused during the process.

There is further provided a display device according to some embodiments, which includes the above-mentioned display panel. The display device may be a display device such as a mobile phone, a tablet computer, or a television.

Other embodiments of the disclosure will be readily apparent to those skilled in the art from consideration of the description and practice of the disclosure here. The present disclosure is intended to cover any modification, use or adaptation of the present disclosure, which follow the general principles of the present disclosure and include common knowledge or conventional technical means in the technical field not disclosed in the present disclosure. The description and embodiments are to be considered examples, with the true scope and spirit of the disclosure indicated by the appended claims.

It should be understood that the present disclosure is not limited to the precise constructions which have been described above and shown in the drawings, and various modifications and changes may be made without departing from the scope of it. The scope of the present disclosure is limited by the appended claims.

What is claimed is:

1. A display panel, wherein the display panel comprises a pixel driving circuit, the pixel driving circuit comprises a transistor, and the display panel further comprises:

a base substrate;

a first active layer, located on a side of the base substrate, wherein at least part of structure of the first active layer is configured to form a channel region of the transistor; and a shielding layer, located between the base substrate and the first active layer, wherein the shielding layer is a conductive layer, the shielding layer comprises more than one shielding part independently arranged, at least partially different shielding parts are configured to receive different signals;

wherein the pixel driving circuit comprises a driving transistor, the first active layer comprises a third active part, and the third active part is configured to form a channel region of the driving transistor; and a first shielding part is comprised in the more than one shielding part, the first shielding part is connected to a stable voltage source, and an orthographic projection of the first shielding part on the base substrate covers an orthographic projection of the third active part on the base substrate.

2. The display panel according to claim 1, wherein the pixel driving circuit further comprises a first transistor, a first electrode of the first transistor is connected to a first initial signal line, and a second electrode of the first transistor is connected to a gate of the driving transistor; and the first initial signal line is comprised in the more than one shielding part.

3. The display panel according to claim 2, wherein the first active layer comprises a first active part and a third active sub-part; the first active part is configured to form a channel region of the first transistor, the first active part comprises a first active sub-part and a second active sub-part, and the third active sub-part is connected between the first active sub-part and the second active sub-part; and the first initial signal line comprises a first extension part, and an orthographic projection of the first extension part on the base substrate at least partially overlaps with an orthographic projection of the third active sub-part on the base substrate.

4. The display panel according to claim 2, wherein the display panel further comprises:

a first conductive layer, located on a side of the first active layer away from the base substrate, wherein the first conductive layer comprises a first reset signal line, an orthographic projection of the first reset signal line on the base substrate extends along a first direction and covers an orthographic projection of the first active part on the base substrate, and a part of structure of the first reset signal line is configured to form a gate of the first transistor;

the first initial signal line comprises a second extension part, and an orthographic projection of the second extension part on the base substrate at least partially overlaps with an orthographic projection of the first reset signal line on the base substrate.

5. The display panel according to claim 2, wherein the display panel further comprises:

a fourth conductive layer, located on a side of the first active layer away from the base substrate, the fourth conductive layer comprising a first initial connection line;

wherein, an orthographic projection of the first initial signal line on the base substrate extends along a first direction, and an orthographic projection of the first initial connection line on the base substrate extends along a second direction, the first direction intersects with the second direction, and the first initial connection line is connected to the first initial signal line through a via hole.

6. The display panel according to claim 1, wherein the display panel further comprises a light emitting unit, the pixel driving circuit comprises a seventh transistor, a first electrode of the seventh transistor is connected to a second initial signal line, and a second electrode is connected to a first electrode of the light emitting unit; and the second initial signal line is comprised in the more than one shielding part.

7. The display panel according to claim 6, wherein the pixel driving circuit further comprises a sixth transistor, a first electrode of the sixth transistor is connected to a second electrode of the driving transistor, and a second electrode of the sixth transistor is connected to a first electrode of the light emitting unit;

the first active layer comprises a sixth active part and a seventh active part, the sixth active part is configured to form a channel region of the sixth transistor, and the seventh active part is configured to form a channel region of the seventh transistor; and the display panel further comprises a first conductive layer, the first conductive layer is located on a side of the first active layer away from the base substrate, and the first conductive layer comprises:

an enabling signal line, wherein an orthographic projection of the enabling signal line on the base substrate extends along a first direction and covers an orthographic projection of the sixth active part on the base substrate, and a part of structure of the enabling signal line is configured to form a gate of the sixth transistor; and a second reset signal line, wherein an orthographic projection of the second reset signal line on the base substrate extends along the first direction and covers an orthographic projection of the seventh active part on the base substrate, and a part of structure of the second reset signal line is configured to form a gate of the seventh transistor;

wherein, an orthographic projection of the second initial signal line on the base substrate is located between the orthographic projection of the enabling signal line on the base substrate and the orthographic projection of the second reset signal line on the base substrate.

8. The display panel according to claim 6, wherein the display panel further comprises:

a fourth conductive layer, located on a side of the first active layer away from the base substrate, the fourth conductive layer comprising a second initial connection line;

wherein, an orthographic projection of the second initial signal line on the base substrate extends along a first direction, and an orthographic projection of the second initial connection line on the base substrate extends along a second direction, the first direction intersects with the second direction, and the second initial connection line is connected to the second initial signal line through a via hole.

9. The display panel according to claim 1, wherein the pixel driving circuit further comprises a capacitor, a first electrode of the capacitor is connected to a gate of the driving transistor, and a second electrode of the capacitor is connected to a power line; and the display panel further comprises:

a first conductive layer, located on a side of the first active layer away from the base substrate, wherein the first conductive layer comprises a first conductive part, an orthographic projection of the first conductive part on the base substrate covers the orthographic projection of the third active part on the base substrate, and the first conductive part is configured to form the gate of the driving transistor and the first electrode of the capacitor;

the power line forms the stable voltage source, and the first shielding part is configured to form the second electrode of the capacitor.

10. The display panel according to claim 9, wherein the display panel further comprises:

a fourth conductive layer, located on a side of the first conductive layer away from the base substrate; wherein the fourth conductive layer comprises the power line, and an orthographic projection of the power line on the base substrate extends along a second direction;

the display panel comprises more than one pixel driving circuit distributed in an array in a first direction and the second direction, the first direction intersects with the second direction, and the more than one first shielding part distributed in the first direction is connected to each other, and the power line is connected to the first shielding part through a via hole.

11. The display panel according to claim 10, wherein the power line comprises a third extension part, a fourth extension part, a fifth extension part connected between the third extension part and the fourth extension part; a size of an orthographic projection of the fifth extension part on the base substrate in the first direction is larger than a size of an orthographic projection of the third extension part on the base substrate in the first direction, the size of the orthographic projection of the fifth extension part on the base substrate in the first direction is larger than a size of an orthographic projection of the fourth extension part on the base substrate in the first direction, and the first direction intersects with the second direction; and the orthographic projection of the fifth extension part on the base substrate at least partially overlaps with an orthographic projection of the first conductive part on the base substrate, and at least part of structure of the fifth extension part is configured to form a second electrode of the capacitor.

12. The display panel according to claim 1, wherein the pixel driving circuit further comprises a second transistor, a first electrode of the second transistor is connected to a gate of the driving transistor, and a second electrode of the second transistor is a connected to a second electrode of the driving transistor;

the first active layer further comprises a second active part and a sixth active sub-part, the second active part is configured to form a channel region of the second transistor, the second active part comprises a fourth active sub-part and a fifth active sub-part, and the sixth active sub-part is connected between the fourth active sub-part and the fifth active sub-part;

the shielding layer further comprises a second shielding part connected to the first shielding part, the first shielding part comprises a first edge, the second shielding part comprises a second edge, the first edge is connected to the second edge, an angle between an orthographic projection of the first edge on the base substrate and an orthographic projection of the second edge on the base substrate is less than 180°, and an orthographic projection of the second shielding part on the base substrate at least partially overlaps with an orthographic projection of the sixth active sub-part on the base substrate.

13. The display panel according to claim 1, wherein the pixel driving circuit further comprises a first transistor and a second transistor, a first electrode of the first transistor is connected to a first initial signal line, and a second electrode of the first transistor is connected to a gate of the driving transistor, a first electrode of the second transistor is connected to the gate of the driving transistor, and a second electrode of the second transistor is connected to a second electrode of the driving transistor;

the first active layer further comprises a first active part, a second active part and an eighth active part, the first active part is configured to form a channel region of the first transistor, the second active part is configured to form a channel region of the second transistor, and the eighth active part is connected between the first active part and the second active part; and the shielding layer further comprises a third shielding part, the third shielding part is connected to the first shielding part, the first shielding part comprises a first edge, the third shielding part comprises a third edge, the first edge is connected to the third edge, an angle between an orthographic projection of the first edge on the base substrate and an orthographic projection of the third edge on the base substrate is less than 180°, and an orthographic projection of the third shielding part on the base substrate at least partially overlaps with an orthographic projection of the eighth active part on the base substrate.

14. The display panel according to claim 1, wherein the pixel driving circuit further comprises a first transistor and a second transistor, a first electrode of the first transistor is connected to a first initial signal line, and a second electrode of the first transistor is connected to a gate of the driving transistor, a first electrode of the second transistor is connected to the gate of the driving transistor, and a second electrode of the second transistor is connected to a second electrode of the driving transistor;

the first active layer further comprises a first active part, a second active part, a sixth active sub-part and an eighth active part, the first active part is configured to form a channel region of the first transistor, the second active part is configured to form a channel region of the second transistor, the second active part comprises a fourth active sub-part and a fifth active sub-part, the sixth active sub-part is connected between the fourth active sub-part and the fifth active sub-part, and the eighth active part is connected between the first active part and the second active part;

the display panel further comprises a first conductive layer, the first conductive layer is located on a side of the first active layer away from the base substrate, the first conductive layer comprises a first conductive part and a first gate line, an orthographic projection of the first conductive part on the base substrate covers the orthographic projection of the third active part on the base substrate, and an orthographic projection of the first gate line on the base substrate extends along a first direction and covers an orthographic projection of the second active part on the base substrate;

the shielding layer further comprises a second shielding part, a third shielding part and a first connection part, the second shielding part is connected to the first shielding part, and an orthographic projection of the second shielding part on the base substrate at least partially overlaps with an orthographic projection of the sixth active sub-part on the base substrate;

the third shielding part is connected to the first shielding part, and an orthographic projection of the third shielding part on the base substrate at least partially overlaps with an orthographic projection of the eighth active part on the base substrate; and the first connection part is connected between the second shielding part and the third shielding part in adjacent pixel driving circuits in the first direction, and an orthographic projection of the first connection part on the base substrate on is located on a side of an orthographic projection of the first gate line on the base substrate away from an orthographic projection of the first conductive part on the base substrate.

15. The display panel according to claim 1, wherein the display panel further comprises a display region and a frame region around the display region, a part of the shielding part is located in the display region, and a part of the shielding part is located in the frame region;

the pixel driving circuit comprises more than one transistor, and a constant voltage shielding part corresponding to the transistor is comprised in the more than one shielding part, and an orthographic projection the constant voltage shielding part on the base substrate at least partially overlaps with an orthographic projection of a channel region of the transistor corresponding to the constant voltage shielding part on the base substrate; and at least partially different constant voltage shielding parts are configured to receive different power supply voltages.

16. The display panel according to claim 15, wherein the pixel driving circuit comprises an N-type transistor and a P-type transistor;

a positive voltage shielding part and a negative voltage shielding part are comprised in the more than one constant voltage shielding part, the positive voltage shielding part is configured to receive a positive power supply voltage, and the negative voltage shielding part is configured to receive a negative power supply voltage; and an orthographic projection of the positive voltage shielding part on the base substrate at least partially overlaps with an orthographic projection of a channel region of the P-type transistor on the base substrate, and an orthographic projection of the negative voltage shielding part on the base substrate at least partially overlaps with an orthographic projection of a channel region of the N-type transistor on the base substrate.

17. The display panel according to claim 15, wherein the display panel further comprises a light emitting unit, the pixel driving circuit comprises a fourth transistor, a fifth transistor, a sixth transistor and a seventh transistor; the driving transistor, the fourth transistor, the fifth transistor, the sixth transistor and the seventh transistor are P-type transistors;

a first electrode of the fourth transistor is connected to a data line, and a second electrode of the fourth transistor is connected to a first electrode of the driving transistor;

a first electrode of the fifth transistor is connected to a first power supply end, and a second electrode of the fifth transistor is connected to the first electrode of the driving transistor;

a first electrode of the sixth transistor is connected to a second electrode of the driving transistor, and a second electrode of the sixth transistor is connected to a first electrode of the light emitting unit;

a first electrode of the seventh transistor is connected to a second initial signal line, and a second electrode of the seventh transistor is connected to the first electrode of the light emitting unit;

more than one positive voltage shielding part is comprised in the more than one constant voltage shielding part, and the more than one positive voltage shielding part comprises:

a first positive voltage shielding part, wherein an orthographic projection of the first positive voltage shielding part on the base substrate covers an orthographic projection of a channel region of the driving transistor on the base substrate;

a second positive voltage shielding part, wherein an orthographic projection of the second positive voltage shielding part on the base substrate covers an orthographic projection of a channel region of the fifth transistor on the base substrate and an orthographic projection of a channel region of the sixth transistor on the base substrate; and a third positive voltage shielding part, wherein an orthographic projection of the third positive voltage shielding part on the base substrate covers an orthographic projection of a channel region of the fourth transistor on the base substrate and an orthographic projection of a channel region of the seventh transistor on the base substrate;

wherein, a positive voltage received by the first positive voltage shielding part is greater than a positive voltage received by the second positive voltage shielding part, and a positive voltage received by the third positive voltage shielding part is greater than a positive voltage received by the first positive voltage shielding part.

18. The display panel according to claim 15, wherein the display panel comprises a high density integration region and a low density integration region, and a density of transistors in the high density integration region is greater than a density of transistors in the low density integration region;

the high density integration region comprises a first high density integration region and a second high density integration region, and the second high density integration region is located on a side of the first high density integration region away from the low density integration region; and in constant voltage shielding parts corresponding to a same transistor in the pixel driving circuit, an absolute value of voltage received by a constant voltage shielding part located in the first high density integration region is larger than an absolute value of voltage received by a constant voltage shielding part located in the second high density integration region.

19. A display device, comprising a display panel, wherein the display panel comprises a pixel driving circuit, the pixel driving circuit comprises a transistor, and the display panel further comprises:

a base substrate;

a first active layer, located on a side of the base substrate, wherein at least part of structure of the first active layer is configured to form a channel region of the transistor; and a shielding layer, located between the base substrate and the first active layer, wherein the shielding layer is a conductive layer, the shielding layer comprises more than one shielding part independently arranged, at least partially different shielding parts are configured to receive different signals;

wherein the pixel driving circuit comprises a driving transistor, the first active layer comprises a third active part, and the third active part is configured to form a channel region of the driving transistor; and a first shielding part is comprised in the more than one shielding part, the first shielding part is connected to a stable voltage source, and an orthographic projection of the first shielding part on the base substrate covers an orthographic projection of the third active part on the base substrate.

\* \* \* \* \*